United States Patent
Abraham et al.

(10) Patent No.: US 11,359,274 B2
(45) Date of Patent: Jun. 14, 2022

(54) ELECTRICALLY AND MAGNETICALLY ENHANCED IONIZED PHYSICAL VAPOR DEPOSITION UNBALANCED SPUTTERING SOURCE

(71) Applicant: IonQuest Corp., Mansfield, MA (US)

(72) Inventors: Bassam Hanna Abraham, Millis, MA (US); Roman Chistyakov, North Andover, MA (US)

(73) Assignee: IonQuestCorp., Milford, PA (US)

( * ) Notice: Subject to any disclaimer, the term of this patent is extended or adjusted under 35 U.S.C. 154(b) by 615 days.

(21) Appl. No.: 16/284,327

(22) Filed: Feb. 25, 2019

(65) Prior Publication Data

US 2019/0316249 A1    Oct. 17, 2019

Related U.S. Application Data

(63) Continuation-in-part of application No. 16/025,928, filed on Jul. 2, 2018, now abandoned, which is a
(Continued)

(51) Int. Cl.
    *C23C 14/35*    (2006.01)
    *C23C 14/34*    (2006.01)
    (Continued)

(52) U.S. Cl.
    CPC .......... *C23C 14/35* (2013.01); *C23C 14/3407* (2013.01); *C23C 14/3485* (2013.01);
    (Continued)

(58) Field of Classification Search
    CPC ................................................ C23C 14/3485
    See application file for complete search history.

(56) References Cited

U.S. PATENT DOCUMENTS 3,767,551 A    10/1973    Lang, Jr. et al.
4,588,490 A    5/1986    Cuomo et al.
(Continued)

FOREIGN PATENT DOCUMENTS

WO    2014053209 A1    4/2014
WO    2016028640 A1    2/2016
(Continued)

OTHER PUBLICATIONS

Final Office Action received for U.S. Appl. No. 16/063,283 dated Mar. 18, 2021, 32 pages.
(Continued)

*Primary Examiner* — John J Brayton
(74) *Attorney, Agent, or Firm* — FisherBroyles, LLP

(57) ABSTRACT

A method of depositing a layer on a substrate includes applying a first magnetic field to a cathode target, electrically coupling the cathode target to a first high power pulse resonance alternating current (AC) power supply, positioning an additional cylindrical cathode target electrode around the cathode, applying a second magnetic field to the additional cylindrical cathode target electrode, electrically coupling the additional cylindrical cathode target electrode to a second high power pulse resonance AC power supply, generating magnetic coupling between the cathode target and an anode, providing a feed gas, and selecting a time shift between negative voltage peaks associated with AC voltage waveforms generated by the first high power pulse resonance AC power supply and the second high power pulse resonance AC power supply. An apparatus includes a vacuum chamber, cathode target magnet assembly, first high power pulse resonance AC power supply, additional electrode, additional electrode magnet assembly, second high power pulse resonance AC power supply, and feed gas.

24 Claims, 35 Drawing Sheets

Related U.S. Application Data continuation-in-part of application No. PCT/US2017/048438, filed on Aug. 24, 2017, application No. 16/284,327, which is a continuation-in-part of application No. 15/260,857, filed on Sep. 9, 2016, now abandoned.

(60) Provisional application No. 62/482,993, filed on Apr. 7, 2017, provisional application No. 62/270,356, filed on Dec. 21, 2015.

(51) Int. Cl.
  *H01J 37/34* (2006.01)
  *H01L 21/285* (2006.01)

(52) U.S. Cl.
  CPC ...... *H01J 37/3405* (2013.01); *H01J 37/3423* (2013.01); *H01J 37/3458* (2013.01); *H01L 21/2855* (2013.01)

(56) References Cited

U.S. PATENT DOCUMENTS

| | | | |
|---|---|---|---|
| 5,178,739 | A | 1/1993 | Barnes et al. |
| 5,227,211 | A | 7/1993 | Eltoukhy et al. |
| 5,482,611 | A | 1/1996 | Helmer et al. |
| 5,651,865 | A | 7/1997 | Sellers |
| 6,024,843 | A | 2/2000 | Anderson et al. |
| 6,077,403 | A * | 6/2000 | Kobayashi ........ H01L 21/76877 204/192.12 |
| 6,216,632 | B1 | 4/2001 | Wickramanayaka |
| 6,903,511 | B2 | 6/2005 | Chistyakov |
| 7,095,179 | B2 | 8/2006 | Chistyakov |
| 7,327,089 | B2 | 2/2008 | Madocks |
| 7,898,183 | B2 | 3/2011 | Chistyakov et al. |
| 8,696,875 | B2 | 4/2014 | Ding et al. |
| 9,267,200 | B2 * | 2/2016 | Krassnitzer ......... H01J 37/3467 |
| 9,624,571 | B2 | 4/2017 | Arndt et al. |
| 9,771,647 | B1 * | 9/2017 | Scobey ................ C23C 14/352 |
| 9,951,414 | B2 | 4/2018 | Chistyakov et al. |
| 10,227,691 | B2 | 3/2019 | Abraham et al. |
| 10,227,692 | B2 | 3/2019 | Chistyakov et al. |
| 10,480,063 | B2 | 11/2019 | Chistyakov et al. |
| 10,913,998 | B2 | 2/2021 | Chistyakov et al. |
| 10,957,519 | B2 | 3/2021 | Chistyakov et al. |
| 2001/0050220 | A1 | 12/2001 | Chiang et al. |
| 2004/0089541 | A1 * | 5/2004 | Matsumoto ......... C23C 14/3464 204/298.08 |
| 2004/0095497 | A1 | 5/2004 | Compton et al. |
| 2004/0227470 | A1 | 11/2004 | Benveniste et al. |
| 2006/0066248 | A1 | 3/2006 | Chistyakov |
| 2006/0278521 | A1 * | 12/2006 | Stowell ............... H01J 37/3405 204/192.1 |
| 2006/0290399 | A1 | 12/2006 | Macdouggal et al. |
| 2008/0190760 | A1 | 8/2008 | Tang et al. |
| 2009/0321249 | A1 | 12/2009 | Chistyakov et al. |
| 2011/0011737 | A1 | 1/2011 | Wu et al. |
| 2014/0041800 | A1 | 2/2014 | Okuyama et al. |
| 2014/0305795 | A1 | 10/2014 | Bardos et al. |
| 2015/0348773 | A1 | 12/2015 | Zhu et al. |
| 2017/0178878 | A1 | 6/2017 | Abraham et al. |
| 2017/0178912 | A1 | 6/2017 | Chistyakov et al. |
| 2018/0374688 | A1 | 12/2018 | Chistyakov et al. |
| 2018/0374689 | A1 | 12/2018 | Abraham et al. |
| 2019/0249293 | A1 | 8/2019 | Abraham et al. |
| 2019/0256969 | A1 | 8/2019 | Chistyakov et al. |
| 2019/0271070 | A1 | 9/2019 | Abraham et al. |
| 2020/0176234 | A1 | 6/2020 | Abraham et al. |
| 2021/0102284 | A1 | 4/2021 | Abraham et al. |
| 2021/0115552 | A1 | 4/2021 | Abraham et al. |
| 2021/0115553 | A1 | 4/2021 | Abraham |
| 2021/0317569 | A1 | 10/2021 | Abraham |

FOREIGN PATENT DOCUMENTS

| | | |
|---|---|---|
| WO | 2017/112696 A1 | 6/2017 |
| WO | 2017/112700 A1 | 6/2017 |
| WO | 2018/186901 A1 | 10/2018 |

OTHER PUBLICATIONS

Non-Final Office Action received for U.S. Appl. No. 15/260,857 dated Mar. 9, 2018, 38 pages.
Final Office Action received for U.S. Appl. No. 15/260,857 dated Nov. 19, 2018, 16 pages.
Non-Final Office Action received for U.S. Appl. No. 15/260,841 dated Jan. 9, 2019, 8 pages.
Notice of Allowance received for U.S. Appl. No. 15/260,841 dated May 28, 2019, 24 pages.
Helmersson et al., "Ionized physical vapor deposition (IPVD): A review of technology and applications", URL: http://run.kb.se/resolve?urn=urn:nbn:se:liu:diva-10434, Postprint available: Linkoping University E-Press, Article in Thin Solid Films, Aug. 14, 2006, 61 pages.
Non-Final Office Action received for U.S. Appl. No. 15/261,119 dated Jun. 26, 2017, 14 pages.
Final Office Action received for U.S. Appl. No. 15/261,119 dated Oct. 30, 2017, 11 pages.
Notice of Allowance received for U.S. Appl. No. 15/261,119 dated Jan. 26, 2018, 14 pages.
Non-Final Office Action received for U.S. Appl. No. 15/917,046 dated Jun. 22, 2018, 17 pages.
Notice of Allowance received for U.S. Appl. No. 15/917,046 dated Oct. 29, 2018, 19 pages.
Non-Final Office Action received for U.S. Appl. No. 15/261,197 dated Jun. 18, 2018, 14 pages.
Notice of Allowance received for U.S. Appl. No. 15/261,197 dated Oct. 31, 2018, 18 pages.
International Search Report and Written Opinion received for PCT Application Serial No. PCT/US2016/067850 dated Mar. 9, 2017, 7 pages.
International Preliminary Report on Patentability received for PCT Application Serial No. PCT/US2016/067850 dated Jul. 5, 2018, 7 pages.
Wang et al., "Hollow cathode magnetron", Journal of Vacuum Science & Technology A, vol. 17, No. 1, 1999, pp. 77-82.
International Search Report and Written Opinion received for PCT Application Serial No. PCT/US2016/067838 dated Mar. 16, 2017, 7 pages.
International Preliminary Report on Patentability received for PCT Application Serial No. PCT/US2016/067838 dated Jul. 5, 2018, 6 pages.
Abraham et al., "Electrically and Magnetically Enhanced Ionized Physical Vapor Deposition Unbalanced Sputtering Source", U.S. Appl. No. 16/400,539 dated May 1, 2019, 64 pages.
Chistyakov et al., "Magnetically Enhanced High Density Plasma-Chemical Vapor Deposition Plasma Source for Depositing Diamond and Diamond-Like Films", U.S. Appl. No. 16/261,514 dated Jan. 29, 2019, 32 pages.
Abraham et al., "Magnetically Enhanced Low Temperature-High Density Plasma-Chemical Vapor Deposition Plasma Source for Depositing Diamond and Diamond Like Films", U.S. Appl. No. 16/261,516 dated Jan. 29, 2019, 60 pages.
Abraham et al., "High-Power Resonance Pulse Ac Hedp Sputtering Source And Method For Material Processing", U.S. Appl. No. 16/025,928 dated Jul. 2, 2018, 76 pages.
International Search Report and Written Opinion for corresponding PCT/US17/048438, pp. 1-10, dated Nov. 3, 2017.
Non-Final Office Action received for U.S. Appl. No. 16/063,283 dated Aug. 19, 2021, 21 pages.
Non-Final Office Action received for U.S. Appl. No. 16/261,514 dated Jun. 29, 2020, 26 pages.
Notice of Allowance received for U.S. Appl. No. 16/261,514 dated Oct. 9, 2020, 81 pages.

(56) References Cited

OTHER PUBLICATIONS

Non-Final Rejection received for U.S. Appl. No. 16/063,284 dated Jan. 30, 2020, 26 pages.
Non-Final Rejection received for U.S. Appl. No. 16/063,284 dated May 20, 2020, 12 pages.
Notice of Allowance received for U.S. Appl. No. 16/063,284 dated Dec. 17, 2020, 36 pages.
Non-Final Rejection received for U.S. Appl. No. 16/261,516 dated Jun. 29, 2020, 28 pages.
Notice of Allowance received for U.S. Appl. No. 16/261,516 dated Oct. 19, 2020, 24 pages.
International Preliminary Report on Patentability received for PCT Application Serial No. PCT/US2017/048438 dated Oct. 17, 2019, 8 pages.
Abraham et al., "Magnetically Enhanced High Density Plasma-Chemical Vapor Deposition Plasma Source For Depositing Diamond and Diamond-Like Films", U.S. Appl. No. 17/124,749, filed Dec. 17, 2020, 62 pages.
Abraham et al., "Magnetically Enhanced High Density Plasma-Chemical Vapor Deposition Plasma Source For Depositing Diamond and Diamond-Like Films", U.S. Appl. No. 17/124,691, filed Dec. 17, 2020, 63 pages.
Abraham, Bassam Hanna, "Magnetically Enhanced High Density Plasma-Chemical Vapor Deposition Plasma Source For Depositing Diamond and Diamond-Like Films", U.S. Appl. No. 17/127,527, filed Dec. 18, 2020, 172 pages.
Abraham, Bassam Hanna, "Magnetically Enhanced High Density Plasma-Chemical Vapor Deposition Plasma Source For Depositing Diamond and Diamond-Like Films", U.S. Appl. No. 17/352,168, filed Jun. 18, 2021, 172 pages.
Non-Final Office Action received for U.S. Appl. No. 16/063,283 dated Sep. 22, 2020, 23 pages.
Non-Final Office Action received for U.S. Appl. No. 16/025,928 dated Sep. 25, 2020, 24 pages.
Non-Final Office Action received for U.S. Appl. No. 16/400,539 dated Sep. 23, 2021, 38 pages.
Non-Final Office Action received for U.S. Appl. No. 17/124,691 dated Nov. 1, 2021, 42 pages.
Notice of Allowance received for U.S. Appl. No. 16/400,539 dated Oct. 8, 2021, 13 pages.
Non-Final Office Action received for U.S. Appl. No. 17/124,749 dated Nov. 5, 2021, 44 pages.

* cited by examiner

V2>V1

$\tau 2 > \tau 1$

ELECTRICALLY AND MAGNETICALLY ENHANCED IONIZED PHYSICAL VAPOR DEPOSITION UNBALANCED SPUTTERING SOURCE

CROSS-REFERENCE TO RELATED APPLICATIONS

This application is a continuation-in-part application of U.S. application Ser. No. 16/025,928, filed Jul. 2, 2018, which is a continuation-in-part application of International Application No. PCT/US17/48438, filed Aug. 24, 2017, which claims the benefit of U.S. Provisional Application No. 62/482,993, filed Apr. 7, 2017, the disclosures of which are incorporated by reference herein in their entireties.

U.S. application Ser. No. 15/260,841, filed Sep. 9, 2016 entitled "Capacitive Coupled Plasma Source for Sputtering and Resputtering", U.S. application Ser. No. 15/261,119, filed Sep. 9, 2016 entitled "Magnetically Enhanced High Density Plasma-Chemical Vapor Deposition Plasma Source for Depositing Diamond and Diamond-Like Films", and U.S. application Ser. No. 15/261,197, filed Sep. 9, 2016 entitled "Magnetically Enhanced Low Temperature-High Density Plasma-Chemical Vapor Deposition Plasma Source for Depositing Diamond and Diamond Like Films" are incorporated herein by reference in their entireties.

This application is a continuation-in-part application of U.S. application Ser. No. 15/260,857, filed Sep. 9, 2016, which claims the benefit of U.S. Provisional Application No. 62/270,356, filed Dec. 21, 2015, the disclosures of which are incorporated herein by reference in their entireties.

BACKGROUND

Field

The disclosed embodiments generally relate to an ionized physical vapor deposition (I-PVD) apparatus and method for sputtering target material on a surface of a substrate. In particular, the disclosed embodiments relate to an apparatus and method of generating high density capacitive coupled plasma (CCP) for sputtering applications in addition to a cathode sputtering target discharge. The disclosed embodiments also relate to electrically and magnetically enhanced unbalanced magnetron and non-magnetron sputtering apparatuses and methods.

Related Art

An ionized physical vapor deposition (I-PVD) sputtering and resputtering process can be performed in the same process module in the presence of an additional inductively coupled plasma (ICP) source. An example of such an apparatus and process is described in U.S. Publication No. 2008/0190760A1, which is incorporated herein by reference in its entirety. The I-PVD sputtering source is a magnetron sputtering source, in which magnetic field lines terminate on a target surface. The resputtering process, which is sputter etching, can be performed with argon gas ions or sputtered copper ions. In order to increase ionization of the gas and sputtered material ions, an ICP coil is positioned in a vacuum chamber between a magnetron sputtering source and a substrate.

SUMMARY

The disclosed embodiments relate to an electrically and magnetically enhanced I-PVD unbalanced magnetron and non-magnetron apparatus and method for sputtering. Magnetic field geometry of the electrically and magnetically enhanced unbalanced magnetron sputtering source has an unbalanced magnetron configuration on a cathode target surface. Magnetic field lines that form a magnetron configuration on the cathode target surface are unbalanced from the center. In some embodiments, magnetic field lines are unbalanced from the edges. The unbalanced magnetic field lines are terminated on a magnet assembly positioned inside an additional electrode that is electrically isolated from ground and positioned around the cathode target. The additional electrode is connected to a power supply that can generate a positive, negative, or high frequency bipolar voltage with a frequency in the range of 100 KHz to 100 MHz. In some embodiments, the additional electrode is connected to the power supply that generates an RF voltage. In some embodiments, the additional electrode can be made from cathode target material. In some embodiments, the additional electrode is not connected to a power supply and has a floating potential. In some embodiments, at least a portion of the magnetic field lines passing the gap are positioned adjacent to the additional electrode prior to terminating on the magnets. The gap can be formed between the anode and additional to a cathode target gap cathode. The gap cathode can be connected with an RF power supply. The RF power supply can generate voltage oscillations with a frequency are in the range of 100 kHz to 100 MHz. The gap cathode can be grounded through an inductor to eliminate negative voltage bias generated by RF discharge. In some embodiments, magnetic field geometry of the electrically and magnetically enhanced sputtering source does not form a magnetron configuration on a cathode target surface. In this case, magnetic field lines on the cathode target surface are substantially perpendicular to the cathode target surface. In some embodiments, the additional electrode magnet assembly forms a cusp magnetic field. In some embodiments, the additional electrode magnet assembly forms a cusp magnetic field in the gap.

The electrically and magnetically enhanced I-PVD unbalanced sputtering source according to the disclosed embodiments includes a cathode target assembly connected to the power supply, an additional electrode assembly electrically isolated from ground, a power supply connected to the additional electrode assembly, a first additional electrode magnet assembly magnetically coupling the additional electrode assembly and the cathode target, a stationary or rotating cathode magnet assembly that generates an unbalanced magnetron magnetic field configuration on the target surface, an anode that is connected to ground, and a flowing liquid that cools and controls the temperature of the cathode.

The magnetically and electrically enhanced I-PVD unbalanced sputtering source may include: a second additional electrode magnet assembly, an electrical circuit that has at least one inductor connected between an additional electrode and ground, and an electrical circuit that has at least one inductor connected between a cathode target assembly and ground, as well as a gap that has a gap cathode and is positioned around the additional electrode.

The electrically and magnetically enhanced I-PVD unbalanced magnetron sputtering apparatus includes an electrically and magnetically enhanced I-PVD unbalanced magnetron sputtering source, vacuum chamber, substrate holder, substrate, feed gas mass flow controller, and vacuum pump.

The electrically and magnetically enhanced I-PVD unbalanced magnetron sputtering apparatus may include a substrate heater, controller, computer, feed gas activation source, substrate bias power supply, and an additional electrically and magnetically enhanced I-PVD unbalanced magnetron sputtering source.

A method of providing electrically and magnetically enhanced I-PVD unbalanced magnetron sputtering includes positioning an electrically and magnetically enhanced I-PVD unbalanced magnetron sputtering source inside a vacuum chamber, positioning a substrate on the substrate holder, applying electrical potential to the additional electrode assembly, providing feed gas, applying power between the cathode target and the anode to form a plasma, and depositing a layer of target material on the substrate surface.

A method of providing electrically and magnetically enhanced sputtering may include applying power to the substrate holder to generate substrate bias, attracting positive ions from sputtered target material atoms to the substrate, applying heat to the substrate, and flowing feed gas through a gas activation source.

A method of depositing a layer on a substrate includes applying a magnetic field to a cathode target to generate an unbalanced magnetic field and a magnetron configuration on the cathode target; electrically coupling an additional electrode to a ground electrical potential using an electrical circuit comprising an inductor; electrically coupling the additional electrode to a radio frequency (RF) power supply; generating magnetic coupling between the cathode target and the anode; providing a feed gas; and applying power to the cathode target, wherein the RF power supply provides a power selected to increase ionization of sputtered target material atoms associated with the cathode target during sputtering.

The method may include coupling a DC power supply to the cathode, wherein the DC power supply provides output power in a range of 1 to 100 kW. The feed gas may include a noble gas including at least one of argon, xenon, neon, and krypton. The feed gas may include a mixture of a noble gas and a reactive gas. The method may include coupling the RF power supply to the cathode target, wherein the RF power supply provides output power in a range of 1 to 20 kW; and coupling a substrate bias voltage to a substrate holder, wherein the substrate bias voltage comprising a range of −10 V to −200 V. The feed gas may include a mixture of a noble gas and a reactive gas; and a mixture of a noble gas and a gas that comprises atoms of the cathode target material. The method may include coupling a pulsed DC power supply to the cathode target, wherein the pulsed DC power supply provides an output peak power during a pulse in a range of 10 to 1000 kW.

An electrically and magnetically enhanced ionized physical vapor deposition (I-PVD) unbalanced sputtering apparatus that deposits a layer on a substrate includes a vacuum chamber; a cathode target magnet assembly that generates an unbalanced magnetic field and provides a magnetron configuration on a target surface; an additional electrode coupled to a ground electrical potential using an electrical circuit comprising an inductor, wherein the anode is coupled to a radio frequency (RF) power supply; an additional electrode magnet assembly that generates magnetic coupling between a cathode target and the additional electrode; a feed gas; a power supply coupled to the cathode magnet target assembly, wherein the power supply generates a magnetron discharge, and the RF power supply provides a power selected to increase an ionization of atoms associated with the cathode target during sputtering.

The power supply coupled to the cathode target assembly may include a DC power supply providing output power in a range of 1 to 100 kW. The power supply coupled to the cathode target assembly may include a pulsed power supply providing a target power density during a pulse in a range of 0.1 to 5 kW/cm2. A pulsed power supply may generate bipolar asymmetrical voltage oscillations. The amplitude of the negative oscillations can be in the range of 500 V to 3000 V. The amplitude of positive oscillations can be in the range of 50 V to 500 V. The duration of the voltage oscillations can be in the range of 5 µs to 50 µs. The frequency of these oscillations can be in the range of 10 kHz to 200 kHz. The apparatus may include a substrate bias power supply coupled to a substrate holder, wherein the substrate bias power supply provides a bias voltage on a substrate in a range of −10 to −200 V. The feed gas may include a noble gas that includes at least one of argon, xenon, neon, and krypton; and/or a mixture of a noble gas and a reactive gas. Reactive gas can be $N_2$, $O_2$ and $H_2$. The power supply coupled to the cathode magnet target assembly may include a RF power supply providing output power in a range of 1 to 20 kW. The power supply coupled to the cathode magnet target assembly may include a pulsed RF power supply providing output power during the pulse in a range of 5 to 50 kW. The feed gas may include a mixture of a noble gas and gas that comprises atoms of the cathode target. The cathode magnet target assembly may rotate with a speed in a range of 10 to 100 revolutions per minute.

The disclosed embodiments relate to a high energy density plasma (HEDP) magnetically enhanced sputtering source, apparatus, and method for sputtering hard coatings in the presence of high-power pulse asymmetrical alternating current (AC) waveforms. The high power pulse asymmetric AC waveform is generated by having a regulated voltage source with variable power feeding a regulated voltage to the high power pulse supply with programmable pulse voltage duration and pulse voltage frequency that produces, at its output, a train of regulated amplitude unipolar negative voltage pulses with programmed pulse frequency and duration, and supplying these pulses to a tunable pulse forming network (PFN) including a plurality of inductors and capacitors for pulse applications connected in a specific format coupled to a magnetically enhanced sputtering source. By adjusting the pulse voltage amplitude, duration, and frequency of the unipolar negative voltage pulses and tuning the values of the inductors and capacitors in the PFN coupled to a magnetically enhanced sputtering source, a resonance pulsed asymmetric AC discharge is achieved.

Another method to produce a resonance pulsed asymmetric AC discharge is implemented using a fixed unipolar pulse power supply parameters (amplitude, frequency, and duration) feeding a pulse forming network, in which the numerical values of the inductors and capacitors, as well as the configuration can be tuned to achieve the desired resonance values on the HEDP source to form a layer on the substrate. The tuning of the PFN can be done manually with test equipment, such as an oscilloscope, voltmeter, and current meter, or other analytical equipment; or electronically with a built-in software algorithm, variable inductors, variable capacitors, and data acquisition circuitry. The negative voltage from the pulse asymmetric AC waveform generates high density plasma from feed gas atoms and sputtered target material atoms between the cathode sputtering target and the anode of the magnetically enhanced sputtering source. The positive voltage from the pulse asymmetrical AC waveform attracts plasma electrons to the cathode sputtering area and generates positive plasma potential. The positive plasma potential accelerates gas and sputtered target material ions from the cathode sputtering target area towards the substrate that improve deposition rate and ion bombardment on the substrate. The reverse electron current can be up to 50% from the discharge current during a negative voltage.

In some embodiments, the magnetically enhanced sputtering source is a hollow cathode magnetron. The hollow cathode magnetron includes a hollow cathode sputtering target, and the tunable PFN has a plurality of capacitors and inductors. The resonance mode associated with the tunable PFN is a function of the input unipolar voltage pulse amplitude, duration, and frequency generated by the high power pulse power supply, inductance, resistance, and capacitance of the hollow cathode magnetron, or any other magnetically enhanced device; the inductance, capacitance, and resistance of the cables between the tunable PFN and hollow cathode magnetron; and a plasma impedance of the hollow cathode magnetron sputtering source itself as well as the sputtered material.

In some embodiments, rather than the hollow cathode magnetron, a cylindrical magnetron is connected to an output of the tunable PFN. In some embodiments, rather than the hollow cathode magnetron, a magnetron with flat target is connected to the output of the tunable PFN. In the resonance mode, the output negative voltage amplitude of the high power pulse voltage mode asymmetrical AC waveform on the magnetically enhanced device exceeds the negative voltage amplitude of the input unipolar voltage pulses into the tunable PFN by 1.1-5 times. The unipolar negative high power voltage output can be in the range of 400V-5000V. In the resonance mode, the absolute value of the negative voltage amplitude of the asymmetrical AC waveform can be in the range of 750-10000 V. In the resonance mode, the output positive voltage amplitude of the asymmetrical AC waveform can be in the range of 100-5000 V. In some cases, the resonance mode of the negative voltage amplitude of the output AC waveform can reach a maximum absolute value while holding all other component parameters (such as the pulse generator output, PFN values, cables and HEDP source) constant, wherein a further increase of the input voltage to the tunable PFN does not result in a voltage amplitude increase on the HEDP source, but rather an increase in the duration of the negative pulse in the asymmetric AC waveform on the HEDP source.

Sputtering processes are performed with a magnetically and electrically enhanced HEDP plasma source positioned in a vacuum chamber. As mentioned above, the plasma source can be any magnetically enhanced sputtering source with a different shape of sputtering cathode target. Magnetic enhancement can be performed with electromagnets, permanent magnets, stationary magnets, moveable magnets, and/or rotatable magnets. In the case of a magnetron sputtering source, the magnetic field can be balanced or unbalanced. A typical power density of the HEDP sputtering process during a negative portion of the high voltage AC waveform is in the range of 0.1-20 kW/cm'. A typical discharge current density of the HEDP sputtering process during a negative portion of the high voltage AC waveform is in the range of 0.1-20 A/cm$^2$. In the case of the hollow cathode magnetron sputtering source, the magnetic field lines form a magnetron configuration on a bottom surface of the hollow cathode target from the hollow cathode magnetron. Magnetic field lines are substantially parallel to the bottom surface of the hollow cathode target and partially terminate on the bottom surface and side walls of the hollow cathode target. The height of the side walls can be in the range of 5-100 mm. Due to the presence of side walls on the hollow cathode target, electron confinement is significantly improved when compared with a flat target in accordance with the disclosed embodiments. In some embodiments, an additional magnet assembly is positioned around the walls of the hollow cathode target. In some embodiments, there is a magnetic coupling between additional magnets and a magnetic field forms a magnetron configuration.

Since the high power resonance asymmetric AC waveform can generate HEDP plasma and, therefore, significant power on the magnetically enhanced sputtering source, the AC waveform is pulsed in programmable bursts to prevent damage to the magnetically enhanced sputtering source from excess average power. The programmable duration of the AC pulse bursts can be in the range of 0.1-100 ms. The frequency of the programmable AC pulse bursts can be in the range of 1 Hz-10000 Hz. In some embodiments, the AC waveform is continuous or has a 100% duty cycle assuming the HEDP plasma source can handle the average power. The frequency of the pulsed AC waveform inside the programmable pulse bursts can be programmed in the range of 100 Hz-400 kHz with a single frequency or mixed frequency.

The magnetically enhanced HEDP sputtering source includes a magnetron with a sputtering cathode target, an anode, a magnet assembly, a regulated voltage source connected to a high power pulsed power supply with programmable output pulse voltage amplitude, frequency, and duration. The pulsed power supply is connected to the input of the tunable PFN, and the output of the tunable PFN is connected to the sputtering cathode target on the magnetically enhanced sputtering source. The tunable PFN, in resonance mode, generates the high power resonance asymmetrical AC waveform and provides HEDP on the magnetically enhanced sputtering source.

The magnetically enhanced high power pulse resonance asymmetric AC HEDP sputtering source may include a hollow cathode magnetron with a hollow cathode sputtering target, a second magnet assembly positioned around the side walls of the hollow cathode target, an electrical switch positioned between the tunable PFN and hollow cathode magnetron with a flat sputtering target rather than a hollow cathode shape, and a magnetic array with permanent magnets, electromagnets, or a combination thereof.

The magnetically enhanced high power pulse resonance asymmetric AC HEDP sputtering apparatus includes a magnetically enhanced HEDP sputtering source, a vacuum chamber, a substrate holder, a substrate, a feed gas mass flow controller, and a vacuum pump.

The magnetically enhanced high power pulse resonance asymmetric AC HEDP sputtering apparatus may include one or more electrically and magnetically enhanced HEDP sputtering sources, substrate heater, controller, computer, gas activation source, substrate bias power supply, matching network, electrical switch positioned between the tunable PFN and magnetically enhanced HEDP sputtering source, and a plurality of electrical switches connected with a plurality of magnetically enhanced high power pulse resonance asymmetric AC HEDP sputtering sources and output of the tunable PFN.

A method of providing high power pulse resonance asymmetric AC HEDP film sputtering includes positioning a magnetically enhanced sputtering source inside a vacuum chamber; connecting the cathode target to the output of the tunable PFN that, in resonance mode, generates the high power asymmetrical AC waveform; positioning a substrate on a substrate holder; providing feed gas; programing voltage pulse frequency and duration; adjusting pulse voltage amplitude of the programmed voltage pulses with fixed frequency and duration; feeding the tunable PFN; and generating the output high voltage asymmetrical AC waveform with a negative voltage amplitude that exceeds the negative voltage amplitude of the voltage pulses in the resonance mode, thereby resulting in a high power pulse resonance asymmetric AC HEDP discharge.

The method of magnetically enhanced high power pulse resonance asymmetric AC HEDP film sputtering may include positioning an electrical switch between the hollow cathode magnetron and the tunable PFN that, in resonance mode, generates the high voltage asymmetrical AC waveform; applying heat to the substrate or cooling down the substrate; applying direct current (DC) or radio frequency (RF) continuously and/or using a pulse bias voltage to the substrate holder to generate a substrate bias; connecting the tunable PFN that, in resonance mode, generates the high voltage asymmetrical AC waveform simultaneously to the plurality of hollow cathode magnetrons or magnetrons with flat targets; and igniting and sustaining simultaneously HEDP in the plurality of the hollow cathode magnetron.

The disclosed embodiments include a method of sputtering a layer on a substrate using a high power pulse resonance asymmetric AC HEDP magnetron. The method includes configuring an anode and a cathode target magnet assembly to be positioned in a vacuum chamber with a sputtering cathode target and the substrate; applying high power negative unipolar voltage pulses with regulated amplitude and programmable duration and frequency to a tunable PFN, wherein the tunable PFN includes a plurality of inductors and capacitors; and adjusting an amplitude associated with the unipolar voltage pulses with programmed duration and frequency to cause a resonance mode associated with the tunable pulse forming network to produce an output high power pulse resonance asymmetric AC on the HEDP sputtering source. The output AC waveform from the tunable PFN is operatively coupled to the HEDP sputtering cathode target, and the output high power pulse resonance asymmetric AC waveform includes a negative voltage exceeding the amplitude of the input unipolar voltage pulses to the tunable PFN during the resonance mode and sputtering discharge of the HEDP magnetron. With all conditions fixed, any further increase of the amplitude of the unipolar voltage pulses causes only an increase in the duration of the maximum value of the negative voltage amplitude of the output high power asymmetric AC waveform in response to the pulse forming network being in the resonance mode, thereby causing the HEDP magnetron sputtering discharge to form the layer on the substrate.

The disclosed embodiments further include an apparatus that sputters a layer on a substrate using a high-power pulse resonance asymmetric AC HEDP magnetron. The apparatus includes an anode, cathode target magnet assembly, regulated high voltage source with variable power, high power pulse power supply with programmable voltage pulse duration and frequency power supply, and a tunable PFN. The anode and cathode target magnet assembly are configured to be positioned in a vacuum chamber with a sputtering cathode target and the substrate. The high power pulse power supply generates programmable unipolar negative voltage pulses with defined amplitude, frequency, and duration. The tunable pulse forming network includes a plurality of inductors and capacitors, and the amplitude of the voltage pulses is adjusted to be in the resonance mode associated with the tunable PFN and magnetically enhanced sputtering source for specific programmed pulse parameters, such as amplitude, frequency, and duration of the unipolar voltage pulses. The output of the tunable PFN is operatively coupled to the sputtering cathode target, and the output of the tunable PFN in the resonance mode generates a high power resonance asymmetric AC waveform that includes a negative voltage exceeding the amplitude of the input to tunable PFN unipolar voltage pulses. An AC waveform sustains plasma and forms high power pulse resonance asymmetric AC HEDP magnetron sputtering discharge, thereby causing the HEDP magnetron sputtering discharge to form the layer of the sputtered target material on the substrate.

The disclosed embodiments also include a computer-readable medium storing instructions that, when executed by a processing device, perform a method of sputtering a layer on a substrate using a high energy density plasma (HEDP) magnetron, wherein the method includes operations include configuring an anode and a cathode target magnet assembly to be positioned in a vacuum chamber with a sputtering cathode target and the substrate; applying regulated amplitude unipolar voltage pulses with programmed frequency and duration to the tunable PFN, wherein the pulse forming network includes a plurality of inductors and capacitors; and adjusting a pulse voltage for programmed voltage pulses frequency and duration to cause a resonance mode associated with the tunable PFN. The output asymmetric AC waveform is operatively coupled to the sputtering cathode target, and the output asymmetric AC waveform includes a negative voltage exceeding the amplitude of the regulated unipolar voltage pulses amplitude with programmed frequency and duration during sputtering discharge of the HEDP magnetron. A further increase in the amplitude of the regulated unipolar voltage pulses with programmed frequency and duration causes a constant amplitude of the negative voltage of the output AC waveform in response to the pulse forming network being in the resonance mode, thereby causing the HEDP magnetron sputtering discharge to form the layer on the substrate.

The disclosed embodiments relate to a method of depositing a layer on a substrate, which includes applying a first magnetic field to a cathode target, the first magnetic field generating an unbalanced magnetic field and a magnetron configuration on the cathode target; electrically coupling the cathode target to a first high power pulse resonance alternating current (AC) power supply; positioning an additional cylindrical cathode target electrode around the cathode; applying a second magnetic field to the additional cylindrical cathode target electrode, wherein the second magnetic field forms a magnetron configuration on the cylindrical cathode target electrode; electrically coupling the additional cylindrical cathode target electrode to a second high power pulse resonance AC power supply; generating magnetic coupling between the cathode target and an anode; providing a feed gas; and selecting a time shift between negative voltage peaks associated with AC voltage waveforms generated by the first high power pulse resonance AC power supply and the second high power pulse resonance AC power supply, wherein the time shift increases ionization of sputtered target material atoms associated with the cathode target during sputtering.

The feed gas may include a noble gas, and the noble gas may include at least one of argon, xenon, neon, krypton. The feed gas may include a mixture of a noble gas and a reactive gas. The method may include positioning a substrate holder, and coupling a substrate bias voltage to a substrate holder. The substrate bias voltage may include a range of −10 V to −200 V. The feed gas may include a mixture of a noble gas and a gas that includes atoms of the cathode target material. At least one of the first high power pulse resonance AC power supply, second high power pulse resonance AC power supply may provide an output peak power during pulse in a range of 10 to 1000 kW.

The disclosed embodiments further relate to an electrically and magnetically enhanced ionized physical vapor deposition (I-PVD) unbalanced magnetron sputtering apparatus that deposits a layer on a substrate. The apparatus includes a vacuum chamber; a cathode target magnet assembly that generates an unbalanced magnetic field and provides a magnetron configuration on a target surface; a first high power pulse resonance AC power supply connected to the cathode target; an additional electrode; an additional electrode magnet assembly that generates magnetic coupling between the cathode target and the additional electrode; a second high power pulse resonance AC power supply connected to the additional electrode; and a feed gas. A time shift is disposed between negative voltage peaks associated with AC voltage waveforms generated by the first high power pulse resonance AC power supply and the second high power pulse resonance AC power supply. The time shift increases ionization of sputtered target material atoms associated with the cathode target during sputtering.

At least one of the first high power pulse resonance AC power supply, second high power pulse resonance AC power supply may provide a target power density during a pulse in a range of 0.1 to 100 kW/cm$^2$. The apparatus may include a substrate bias power supply coupled to a substrate holder, and the substrate bias power supply may provide a bias voltage on a substrate in a range of −10 to −200 V. The feed gas may include a noble gas, and the noble gas may include at least one of argon, xenon, neon, krypton. The feed gas may include a mixture of a noble gas and a reactive gas. The power supply coupled to the cathode magnet target assembly may include a radio frequency (RF) power supply, and the RF power supply may provide output power in a range of 1 to 20 kW. The feed gas may include a mixture of a noble gas and gas that includes atoms of the cathode target. The cathode magnet target assembly may rotate with a speed in a range of 10 to 100 revolutions per minute.

Other embodiments will become apparent from the following detailed description considered in conjunction with the accompanying drawings. It is to be understood, however, that the drawings are designed as an illustration only and not as a definition of the limits of any of the embodiments.

BRIEF DESCRIPTION OF THE DRAWINGS

The following drawings are provided by way of example only and without limitation, wherein like reference numerals (when used) indicate corresponding elements throughout the several views, and wherein:

FIG. 5 (b) shows a voltage waveform generated by the RF power supply on the anode when the anode is not connected to ground through the inductor;

FIGS. 7 (b, c) show output voltage waveforms from the high-power pulse resonance forming network (PFN) shown in FIG. 7(a);

FIG. 7 (d) shows an illustrative cross-sectional view of the additional electrode and gap electrode assembly;

FIG. 7 (e) shows an illustrative cross-sectional view of the magnetic field lines between magnetron sputtering source and cusp magnetic field near the additional electrode;

FIG. 8 (b) shows an illustrative cross-sectional view of the additional electrode and gap electrode assembly together with the substrate;

FIG. 10 (b) shows an illustrative view of an output resonance asymmetrical AC voltage waveform with a duration of negative voltage T1 from a tunable pulse forming network (PFN);

FIG. 10 (c) shows an illustrative view of a train of output negative unipolar voltage pulses with amplitude V2 and frequency f1 from a high-power resonance pulse forming network (PFN) with programmable pulse voltage duration and pulse voltage frequency;

FIG. 10 (d) shows an illustrative view of the output resonance asymmetrical AC voltage waveform with a duration of negative voltage T2 from the tunable PFN;

FIG. 10 (e) shows an illustrative view of the output resonance asymmetrical AC voltage waveform with three oscillations from the tunable PFN;

FIG. 10 (f) shows an illustrative view of the output resonance asymmetrical AC current waveform with three oscillations from the PFN;

FIG. 10 (g) shows an illustrative cross-sectional view of components and magnetic field lines of a magnetically enhanced HEDP sputtering source with a stationary cathode target magnetic array;

FIG. 10 (h) shows an illustrative cross-sectional view of a hollow cathode target;

FIG. 11 (b) shows an illustrative view of a train of unipolar voltage pulses with frequency f1 and amplitude V1 applied to the tunable PFN, and an output voltage waveform from the tunable PFN without a resonance mode in the tunable PFN;

FIG. 11 (c) shows an illustrative view of a train of unipolar voltage pulses with frequency f2 and amplitude V2 applied to the tunable PFN, and an output voltage waveform from the tunable PFN in a partial resonance mode;

FIG. 11 (d) shows an illustrative view of a train of unipolar voltage pulses with frequency f3 and amplitude V4 applied to the tunable PFN, and an output resonance asymmetrical AC voltage waveform from the tunable PFN in the resonance mode.

FIG. 11 (e) shows an illustrative circuit diagram of the tunable PFN with the plurality of inductors and capacitors being connected in series;

FIG. 11 (f) shows an illustrative circuit diagram of the tunable PFN with the inductors and capacitors being connected in parallel;

FIG. 12 (b) shows an illustrative view of output resonance asymmetrical AC voltage waveform pulses with two different voltage amplitudes generated at resonance conditions in the tunable PFN;

FIG. 13 (b) shows a train of resonance asymmetrical AC waveforms applied to different magnetically enhanced sputtering sources;

FIG. 14 (b) shows different voltage pulse shapes that can be generated by a substrate bias power supply;

FIG. 14 (c) shows an illustrative view of a via in the semiconductor wafer;

FIG. 15 (b) shows a plurality of unipolar voltage pulses generated by a high-power resonance pulse forming network (PFN);

FIG. 15 (c) shows a plurality of unipolar RF voltage pulses generated by a pulse RF power supply;

FIGS. 16 (b, c, d) show illustrative views of trains of oscillatory unipolar voltage pulses applied to the tunable PFN, and an output voltage waveform from the tunable PFN without a resonance mode in the tunable PFN;

FIG. 18 (b) shows the voltage output from two high power pulse resonance AC power supplies;

FIG. 25 (b) shows a cross-sectional view of a V-shaped HEDP sputtering source;

It is to be appreciated that elements in the figures are illustrated for simplicity and clarity. Common but well-understood elements that are useful or necessary in a commercially feasible embodiment are not shown in order to facilitate a less hindered view of the illustrated embodiments.

DETAILED DESCRIPTION

Figure 1:
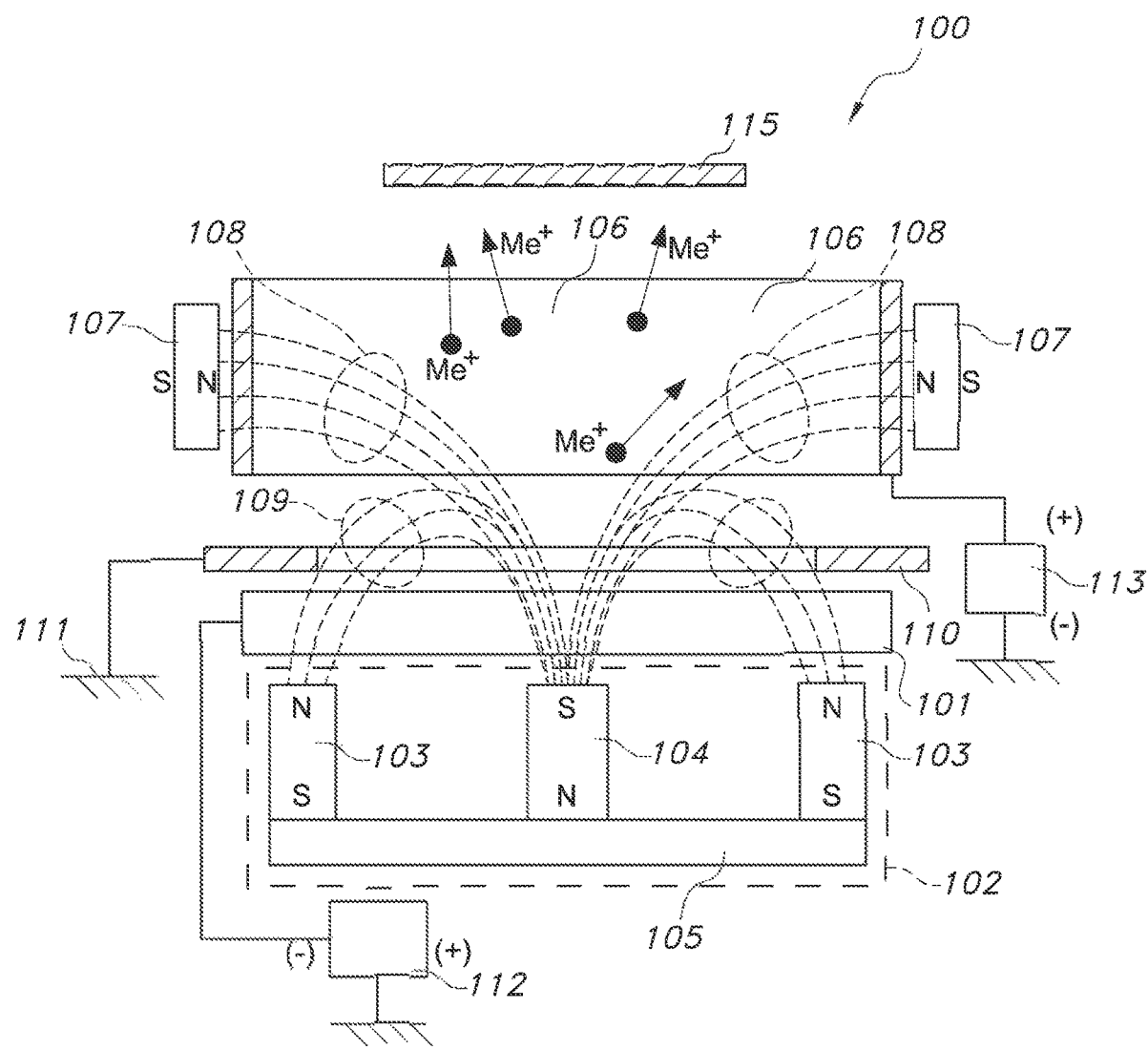
FIG. 1 shows an illustrative cross-sectional view of magnetic field lines of an embodiment of an electrically and magnetically enhanced I-PVD unbalanced magnetron sputtering source with one additional electrode magnet assembly.

FIG. 1 shows a cross-sectional view 100 of magnetic field lines in an embodiment, in which an additional electrode 106 has one magnet assembly. A cathode magnet assembly 102 includes magnets 103, 104 and magnetic pole piece 105. The cathode magnet assembly 102 forms a magnetron configuration with magnetic field lines 109 near a surface of a cathode target 101. A portion of the magnetic field lines 108 cross the additional electrode 106 and terminate on a magnet 107. The additional electrode 106 is connected to a power supply 113. The power supply 113 can generate positive voltage. In an embodiment, the power supply 113 can generate high frequency bipolar asymmetrical voltages. In an embodiment, the power supply 113 can generate a radio frequency (RF) voltage with frequencies in the range of 100 KHz to 100 MHz. In an embodiment, the power supply 113 can generate a negative voltage. When a power supply 112 generates power and a magnetron discharge is formed near the cathode target 101, electrons drift from the surface of the cathode target 101 towards the additional electrode 106. If power supply 113 provides a positive voltage, electrons are absorbed by the additional electrode 106 and the magnetron discharge has a positive space charge. The positive space charge accelerates a portion of the ionized sputtered target material atoms Me$^+$ away from the cathode target 101 towards a substrate 115. If power supply 113 provides a negative voltage, electrons are trapped between the cathode target 101 and additional electrode 106. Some electrons escape on the anode 110, which has a ground potential. By controlling the value and duration of the negative output voltage from the power supply 113, the electron density can be controlled. By controlling the value and duration of the positive output voltage from the power supply 113, the ion energy and ion density near the substrate 115 can be controlled. In an embodiment, power supply 113 generates RF discharge near the surface of the additional electrode 106. RF discharge increases electron temperature and electron density and, therefore, the degree of ionization of sputtered target material atoms. In an embodiment, power supply 113 generates RF discharge near the surface of the additional electrode 106. Additional electrode 106 is inductively grounded. RF discharge increases electron temperature and electron density and, therefore, the degree of ionization of sputtered target material atoms.

Figure 2:
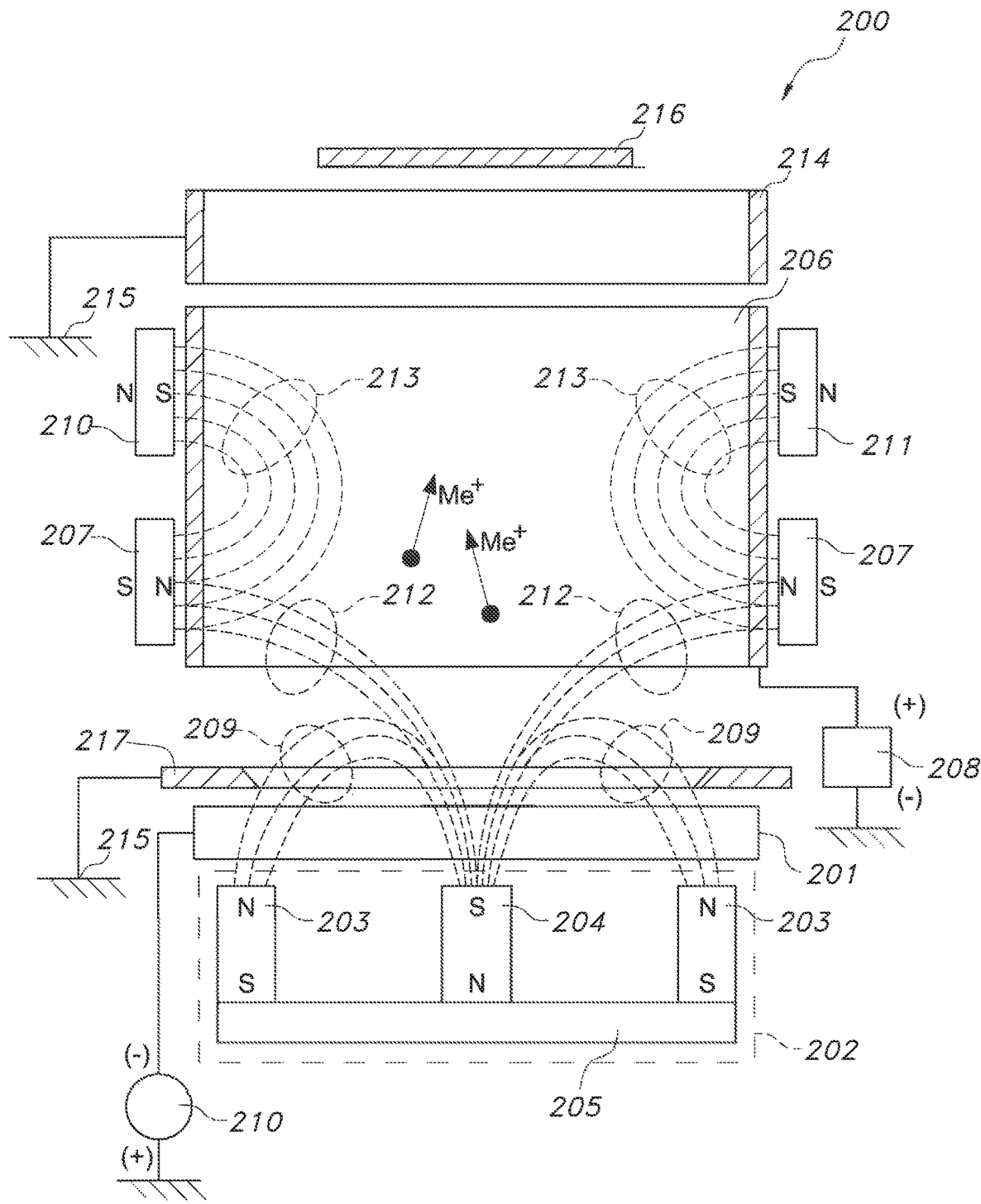
FIG. 2 shows an illustrative cross-sectional view of magnetic field lines of another embodiment of the electrically and magnetically enhanced I-PVD unbalanced magnetron sputtering source with two additional electrode magnet assemblies.
Figure 3:
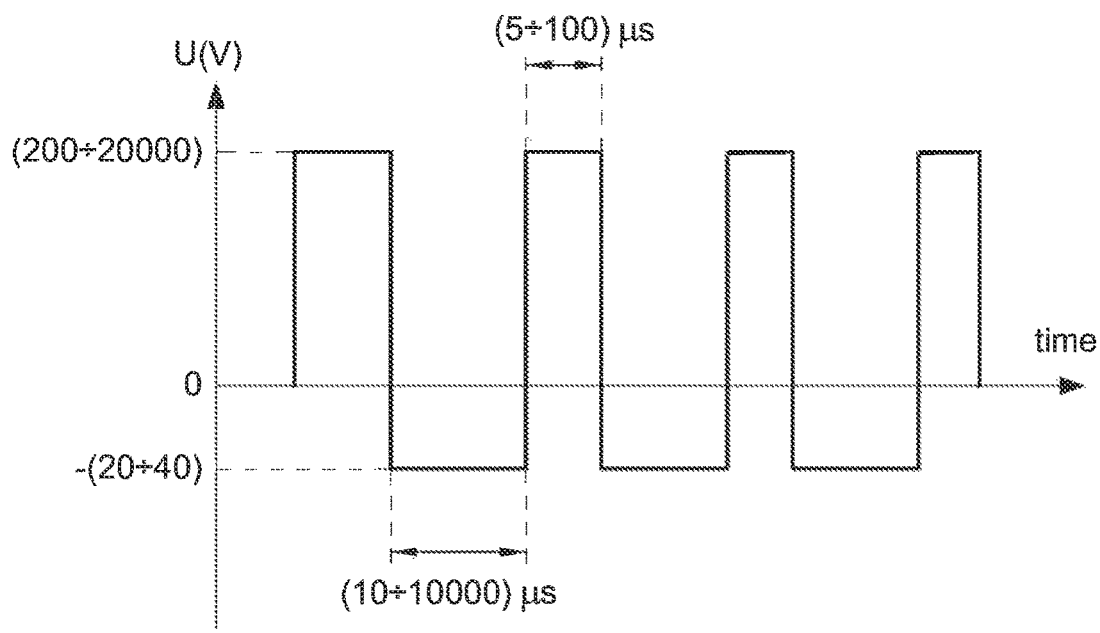
FIG. 3 shows an illustrative view of a bipolar voltage waveform that can be applied to the anode.

FIG. 2 shows a cross-sectional view 200 of magnetic field lines in an embodiment, in which an additional electrode 206 has two magnet assemblies. A cathode magnet assembly 202 includes magnets 203, 204 and magnetic pole piece 205. An anode 214 is positioned adjacent to the substrate 216 and additional electrode 206. The anode 214 is connected to ground 215. An anode 217 is positioned adjacent to the cathode target 201 and connected to ground 215. The cathode magnet assembly 202 forms a magnetron configuration with magnetic field lines 209 near the surface of the cathode target 201. A portion of the magnetic field lines 212 cross the additional electrode 206 and terminate on the magnet 207. The additional electrode 206 is connected to power supply 208. In an embodiment, additional electrode 106 and/or 206 may have a floating electrical potential. The power supply 208 can generate floating, negative, or high frequency bipolar voltages. When power supply 210 generates power and a magnetron discharge is formed near the cathode target 201, electrons drift from the target surface towards the additional electrode 206. If power supply 208 provides a negative voltage, electrons are trapped between target 201 and additional electrode 206. Some electrons escape on the anode 214, which has a ground potential. By controlling the value and duration of the negative output voltage from the power supply, the electron density can be controlled. The applied negative voltage should not exceed a 40-50 V sputtering threshold in order to prevent sputtering from the additional electrode if the additional electrode is not made from the target material. Preferably, a negative voltage value should be in the range of −10 to −30 V. The electron density controls the degree of ionization of sputtered target material atoms. By controlling the value of the positive output voltage and time duration of the power supply 208, the ion energy and ion density near the substrate can be controlled. A typical rectangular bipolar output voltage provided by power supply 113 or 208 is shown in FIG. 3.

Figure 4:
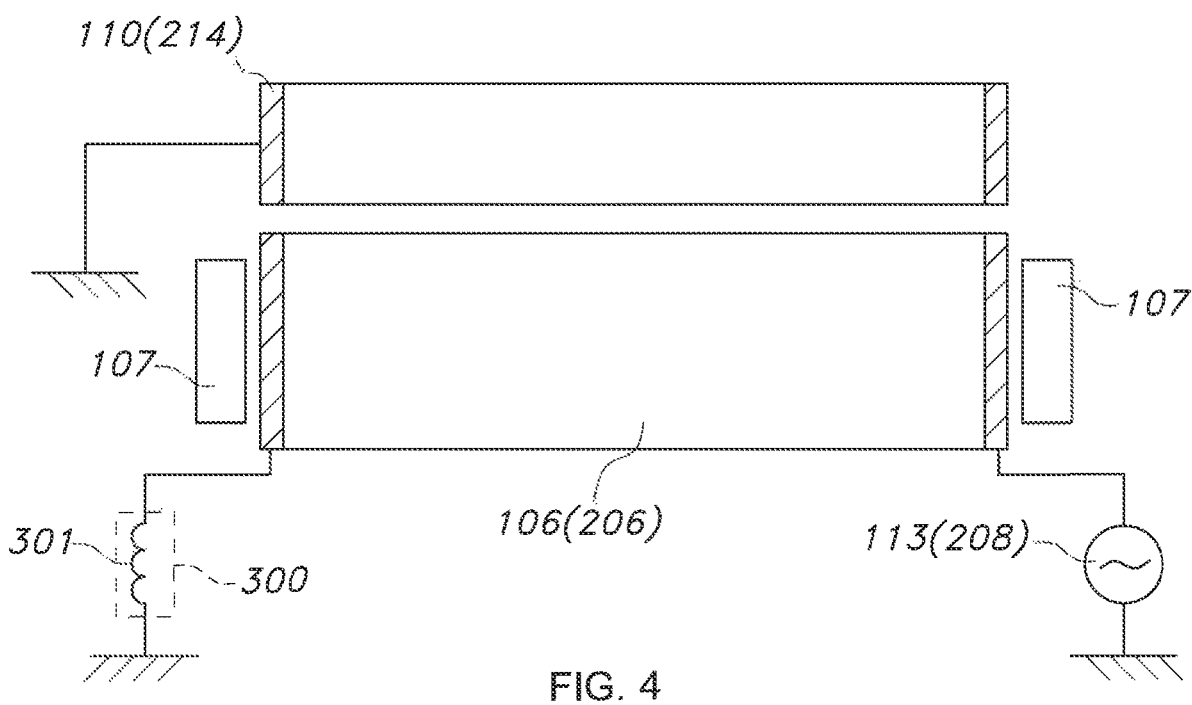
FIG. 4 shows an illustrative cross-sectional view of the anode magnet assembly connected to ground through an inductor and powered with a radio frequency (RF) power supply.
Figure 5A:
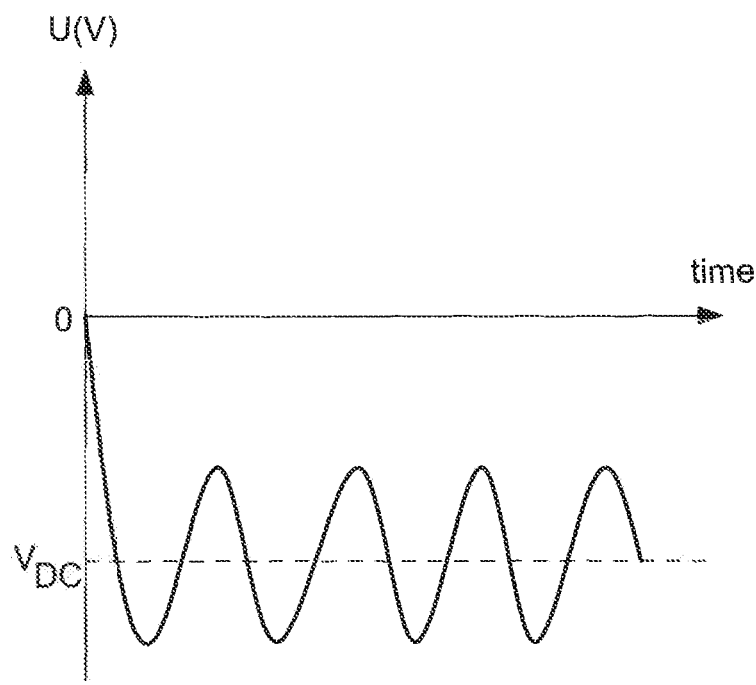
FIG. 5 (a) shows a voltage waveform generated by the RF power supply on the anode when the anode is not connected to ground through the inductor.
Figure 5B:
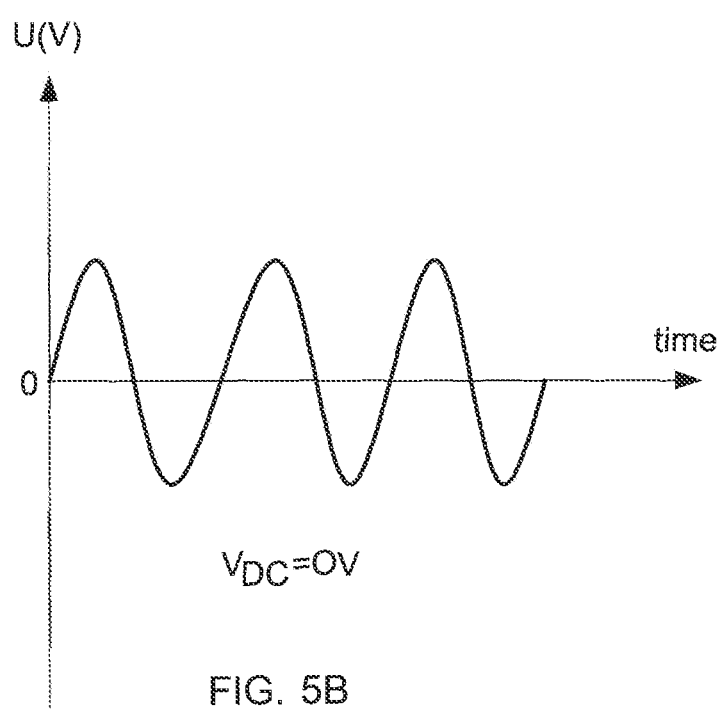

Power supplies 113, 208 can be radio frequency (RF) power supplies that generate output voltages with frequencies in the range of 100 kHz to 100 MHz, as shown in FIG. 4. RF discharge has rectifying properties and generates a negative constant voltage bias VDC on a surface of the additional electrode 106, 206 as shown in FIG. 5 (a). In order to eliminate this voltage bias and eliminate potential sputtering from the additional electrode, the additional electrode can be connected to ground through an electrical circuit 300 shown in FIG. 4. The electrical circuit 300 has at least one inductor 301 that has a high impedance for RF frequency signals and a substantially zero impedance for DC current generated by a constant voltage bias. In this case, the additional electrodes 106, 206 are inductively grounded. The RF voltage signal, when additional electrodes 106, 206 are connected to electrical circuit 300, is shown in FIG. 5(b). In this case, if a DC or pulsed DC power supply is connected to the cathode target assembly, the additional electrode 106, 206 is the anode for only a direct current (DC) discharge. If an RF or pulsed RF power supply is connected to the cathode target assembly, the additional electrode 106, 206 is an anode. For a high frequency component, the anode 110, 214 is used.

Figure 6:
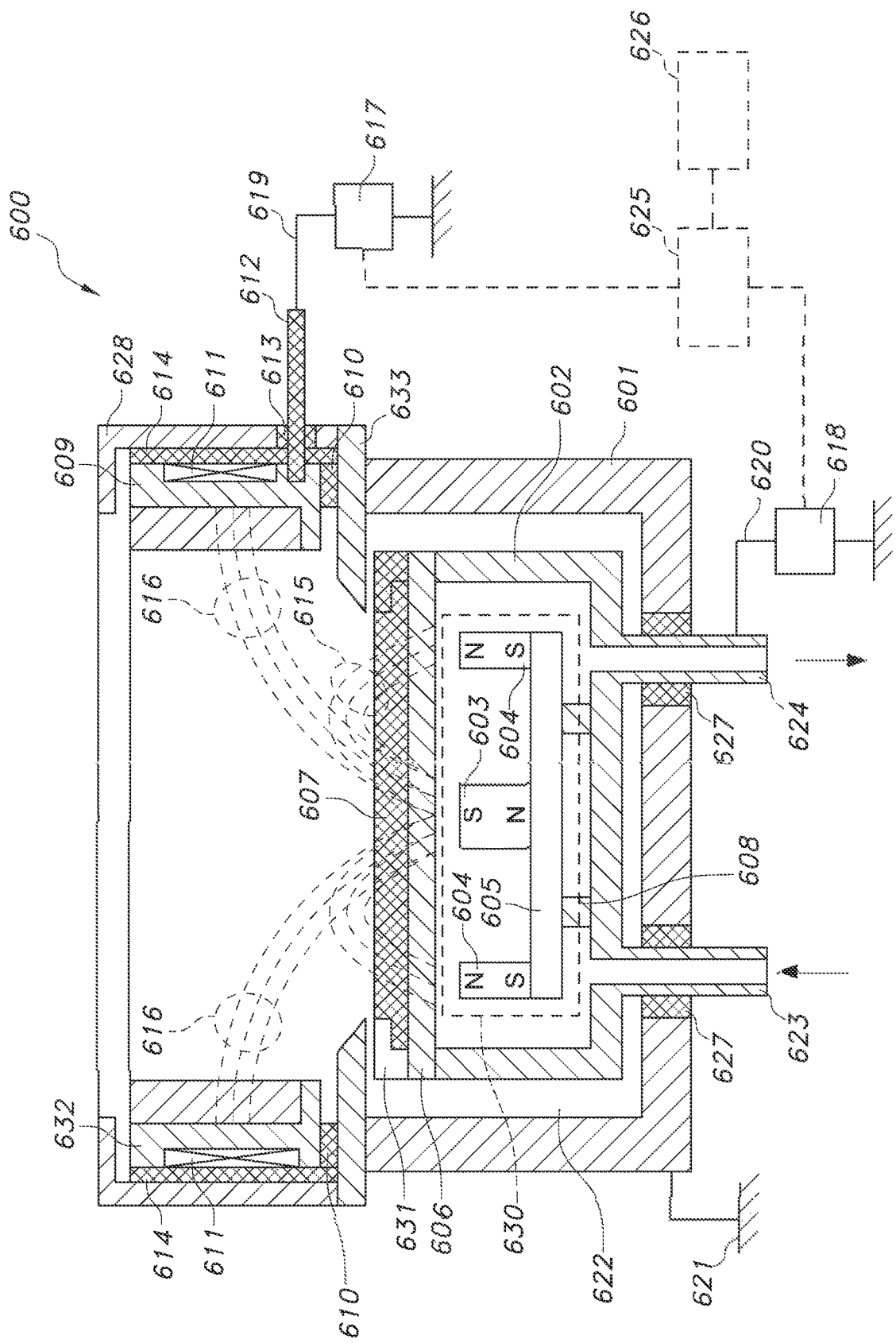
FIG. 6 shows an illustrative cross-sectional view of the electrically and magnetically enhanced I-PVD unbalanced magnetron sputtering source with an anode magnet assembly.
Figure 7A:
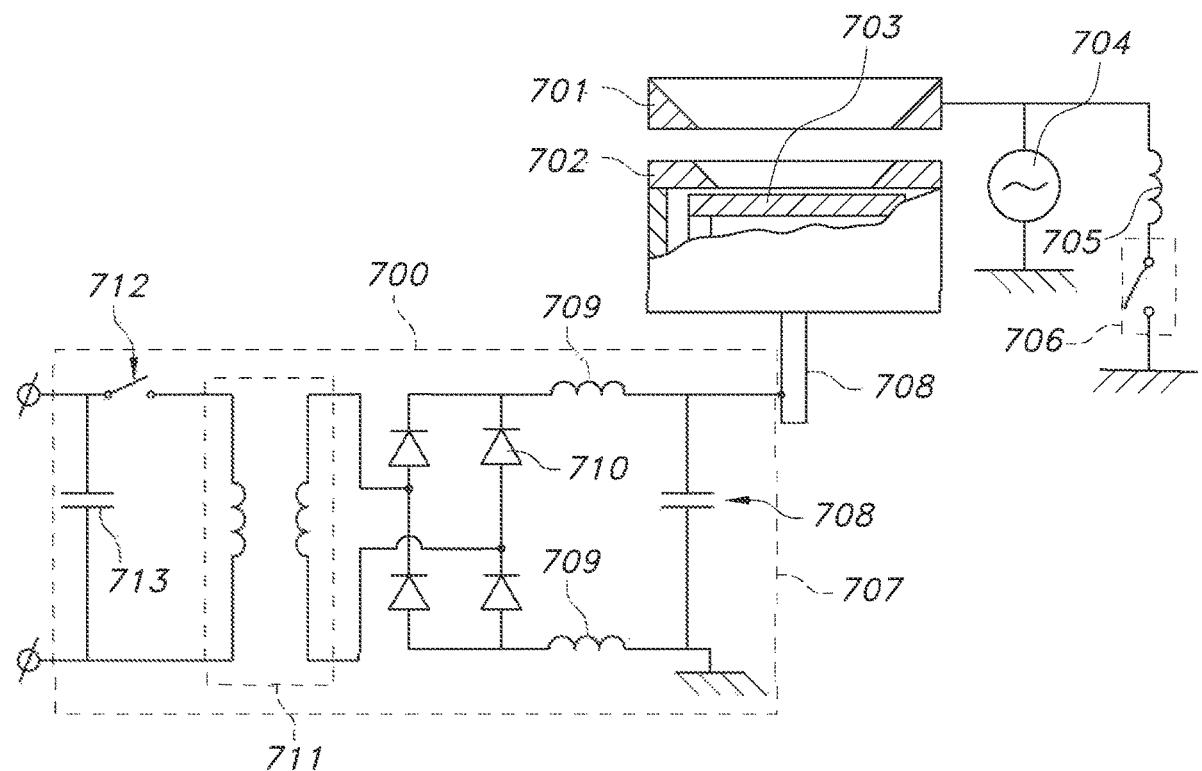
FIG. 7 (a) shows an illustrative cross-sectional view of the electrically and magnetically enhanced I-PVD unbalanced magnetron sputtering source including an additional electrode connected with the RF power supply and the cathode target connected to a high-power resonance pulse forming network (PFN)
Figure 7B:
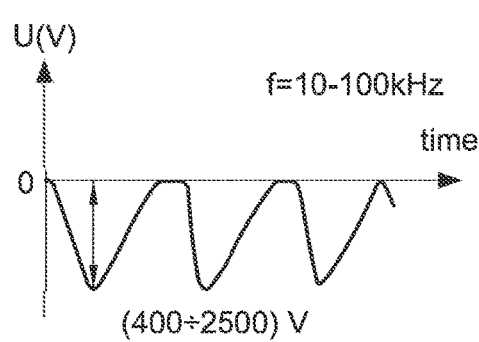
Figure 7C:
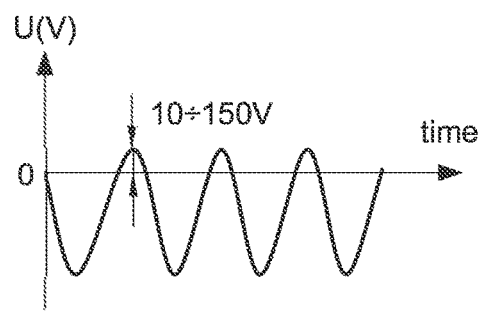
Figure 7D:
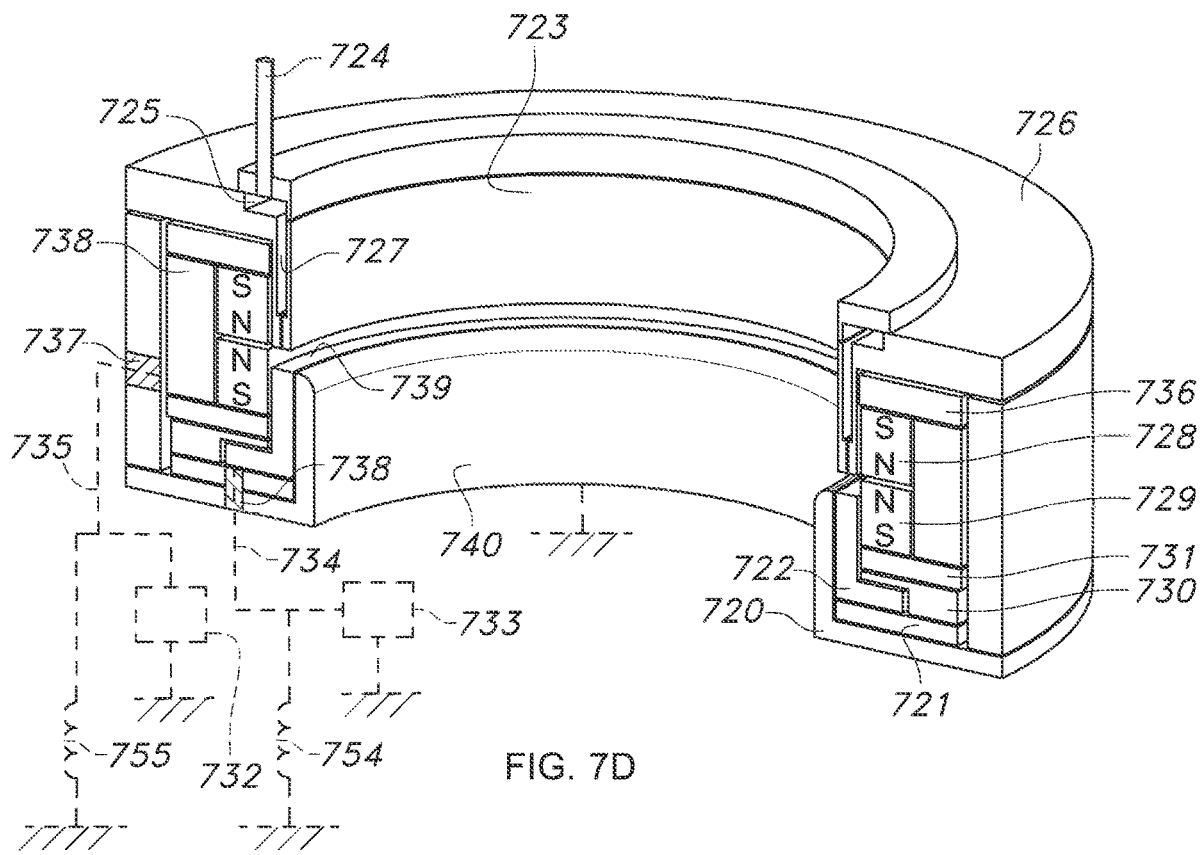
Figure 7E:
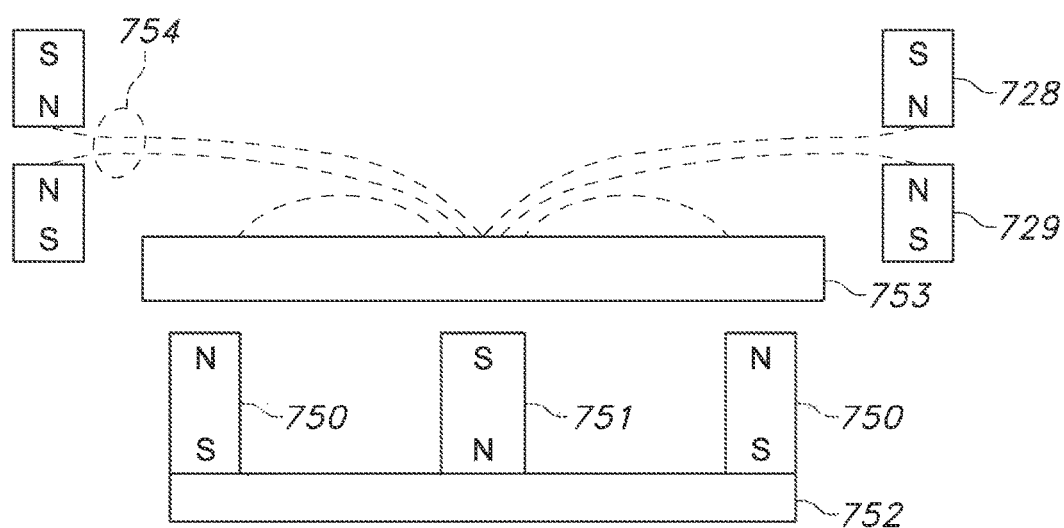

FIG. 6 shows a cross-sectional view of an embodiment of the electrically and magnetically enhanced ionized physical vapor deposition (I-PVD) unbalanced magnetron sputtering source 600. The electrically and magnetically enhanced I-PVD unbalanced magnetron sputtering source 600 includes a housing 601. The housing 601 is electrically connected to ground 621. The cathode assembly includes a water jacket 602 and a cathode target 607. The cathode target 607 can be bonded to a copper backing plate 606 or can be attached to the copper backing plate 606 with a clamp 631. An anode 633 is positioned adjacent to the cathode target 607. The water jacket 602 is electrically isolated from the housing 601 with isolators 627. Water or another fluid for cooling can move inside the water jacket 602 through inlet 623 and can flow outside the water jacket 602 through the outlet 624. There is an air gap 622 between the housing 601 and water jacket 602. The water jacket 602 and, therefore, cathode target 607 are electrically connected to a negative terminal of a power supply 618 through a transmission line 620. The power supply 618 can include a radio frequency (RF) power supply, pulsed RF power supply, high frequency (HF) power supply, pulsed HF power supply, and a matching network. The power supply 618 can include a direct current (DC) power supply, a pulsed DC power supply that generates unipolar negative voltage pulses, a high power pulsed power supply, a pulsed DC power supply that generates asymmetrical bipolar voltage pulses, and/or a pulsed DC power supply that generates symmetrical bipolar voltage pulses. The power supply 618 can include a pulsed power supply that generates negative triangular voltage pulses. The power supply 618 can be a combination of any power supplies mentioned above. For example, the RF power supply can provide power together with the DC power supply, or the pulsed RF power supply can provide power together with the pulsed DC power supply, or any other pulse power supply. The frequency of the RF power supply and HF power supply can be in the range of 500 kHz-100 MHz. All of the above-mentioned power supplies can operate in current control mode, voltage control mode, and/or power control mode.

The cathode target 607 is formed in the shape of a disk, but can be formed in other shapes, such as a rectangle, and the like. The cathode target 607 material can be conductive, semi-conductive, and/or non-conductive. The following chemical elements, or their combination, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements or their combination with the gases $O_2$, $N_2$, F, Cl, and/or $H_2$ can also be used as a cathode material. Power supply 618 can be connected to a controller 625 and computer 626. Controller 625 and/or computer 626 control the output power values and timing of the power supplies 618 and 617. Power supply 618 can operate as a standalone unit without connecting to the controller 625 and/or computer 626.

The cathode assembly includes a cathode magnetic assembly 630 positioned inside the water jacket 602. The cathode magnetic assembly 630 in an embodiment includes magnets 604, 603, and a disc-shaped magnetic pole piece 605 made from magnetic material, such as iron. Magnets 604, 603 form a magnetron configuration on the surface of the cathode target 607. The magnetron configuration has magnetic field lines 615.

A ring-shaped additional electrode 609 is positioned around the cathode target 607 on a supporter 632. An additional electrode magnet assembly has a cylindrical shape and is positioned behind a ring-shaped additional electrode 609 in the supporter 632. The anode magnet assembly includes a plurality of permanent magnets 611. In an embodiment, rather than using permanent magnets, electromagnets can be used. The value of the magnetic field caused by the permanent magnets 611 is in a range of 100 to 1000 G. The magnets 611 provide magnetic coupling with magnet 603 and, therefore, with a surface of the target 607 through magnetic field lines 616. In an embodiment, the magnet 611 provides magnetic coupling with magnets 604.

The additional electrode 609 is electrically isolated from a ground shield 628 by isolators 614, 610, 613. The additional electrode 609 is connected to power supply 617 through transmission line 619 and electrode 612. Power supply 617 can be connected to controller 625.

The magnetic fields 616 shown in FIG. 6 are shaped to provide electron movement between the cathode target 607 and additional electrode 609. During this movement, electrons ionize and/or dissociate feed gas molecules and/or sputtered target material atoms.

FIG. 7 (a) shows the additional electrode 701 connected to RF power supply 704 and inductively grounded through inductor 705 and switch 706. The cathode target 703 is connected to a high power pulsed power supply that generates oscillatory voltage with frequency in a range of 10 to 100 KHz. The block diagram of the high power supply shows a capacitor or capacitor bank 713 and solid state switch 712, which can release energy from the capacitor 713 to transformer 711. Transformer 711, diodes 710, inductors 709, and capacitor 708 form oscillatory voltage waveforms, as shown in FIGS. 7 (b), (c).

In an embodiment, the additional electrode 738 is positioned behind the gap 739 as shown in FIG. 7 (d). The additional electrode 738 has two rows of permanent magnets that form a cusp magnetic field in the gap 739. Two pole pieces 736, 731 are positioned on top and bottom of the magnets 728, 729. Additional electrode 738 has anode 723. The anode 723 has feed gas chamber 725 and feed gas inlet 724. The fed gas enters through a plurality of cylindrical holes 727. The additional electrode can be connected to a power supply 732 through transmission line 735. The power supply 732 can be an RF power supply that generates output voltage with frequencies in the range of 100 KHz to 100 MHz. The power supply 732 can be a pulsed power supply or DC (direct current) power supply. The additional electrode 738 can be grounded through inductor 755. The gap 739 is formed between the anode 723 and gap electrode 722. The gap electrode 722 is positioned behind the grounded shield 720. The additional electrode 738 is positioned on the isolator 730. The gap electrode 722 is positioned on isolator 721. The gap electrode is connected to the power supply 733. The power supply 733 can be an RF power supply that generates output voltage with frequencies in the range of 100 KHz to 100 MHz. The power supply 733 can be a pulsed power supply or DC power supply. The gap electrode 722 can be grounded through inductor 754. The electric field in the gap 739 is substantially perpendicular to magnetic field lines. The magnetic field lines are shown in FIG. 7 (e). In an embodiment, the gap electrode 722 has a ground potential, and power supply 732 releases voltage on additional electrode 738. In an embodiment, additional electrode 738 has a ground potential or floating potential, and power supply 733 releases voltage on gap electrode 722.

Magnetic field lines are shown in FIG. 7 (e). Magnets 750, 751 and magnetic pole piece 752 form a magnetron configuration on the cathode target 753. Magnets 728 and 729 form a cusp magnetic field 754.

Figure 8A:
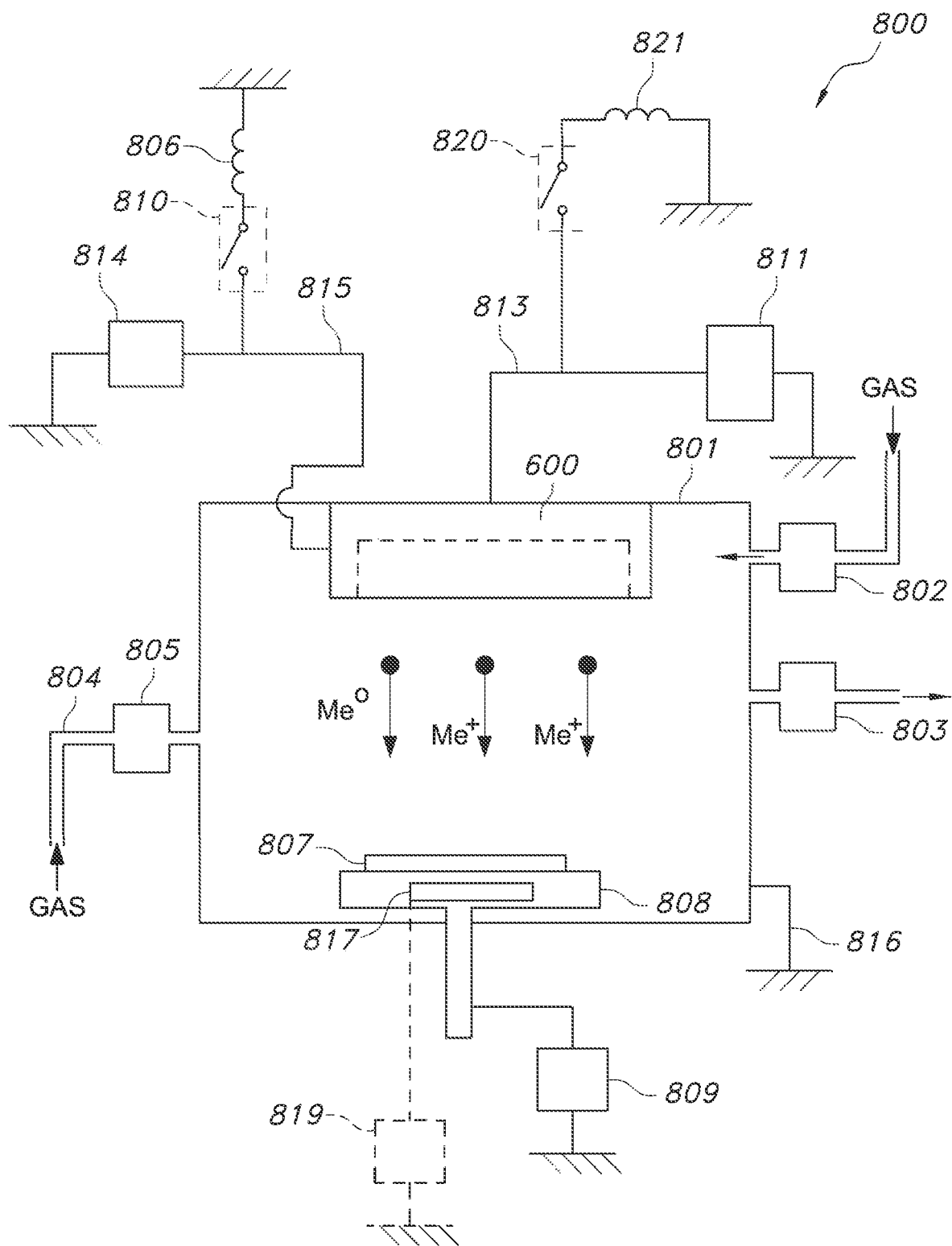
FIG. 8 (a) shows an illustrative cross-sectional view of an electrically and magnetically enhanced I-PVD unbalanced magnetron sputtering system.
Figure 8B:
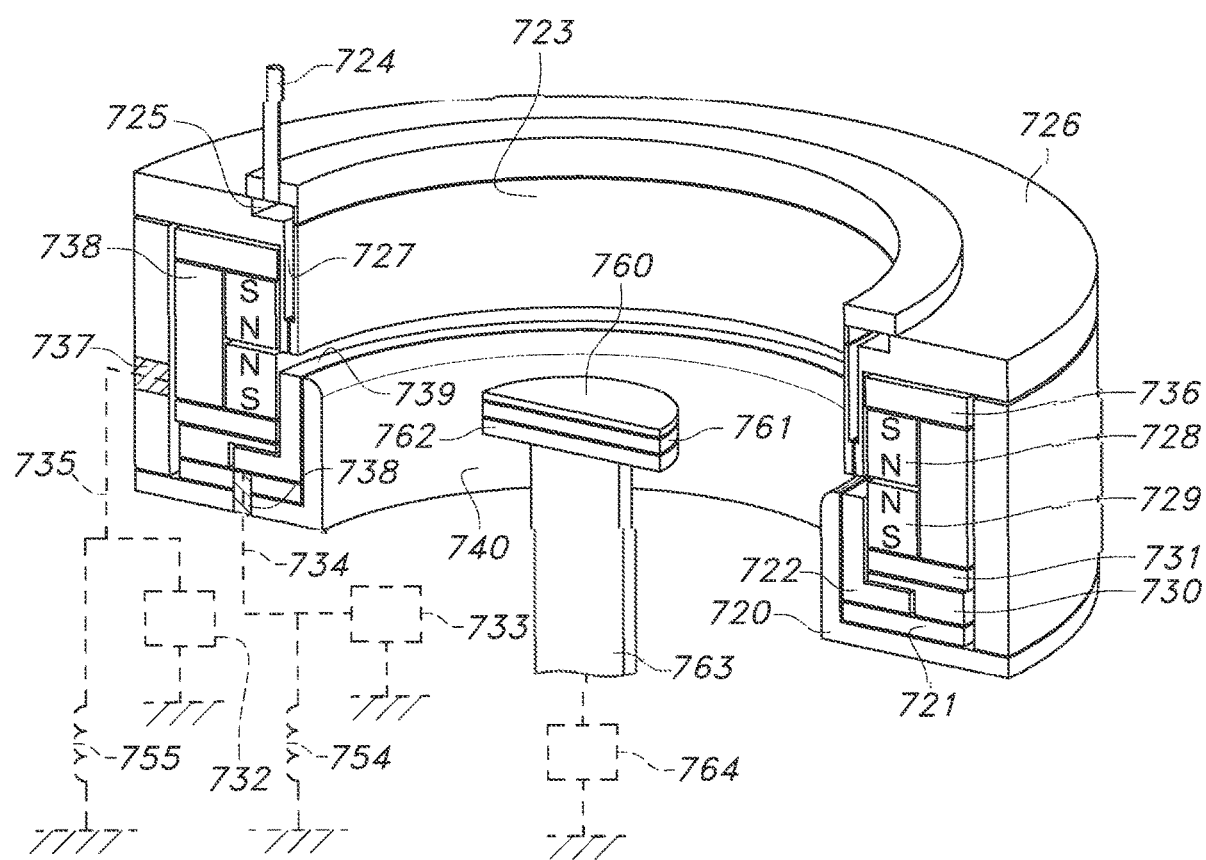

The electrically and magnetically enhanced I-PVD unbalanced magnetron sputtering source 600 can be mounted inside a vacuum chamber 801 as shown in FIG. 8 in order to construct the electrically and magnetically enhanced I-PVD unbalanced magnetron sputtering apparatus 800. The vacuum chamber 801 contains feed gas and plasma. The vacuum chamber 801 is coupled to ground 816. The vacuum chamber 801 is positioned in fluid communication with a vacuum pump 803, which can evacuate the feed gas from the vacuum chamber 801. Typical baseline pressure in the vacuum chamber 801 is in a range of $10^{-6}$-$10^{-9}$ Torr.

A feed gas is introduced into the vacuum chamber 801 through a gas inlet 804 from a feed gas source. In an embodiment, a feed gas is introduced into the vacuum chamber 801 through a gas activation source 802. A mass flow controller 805 controls gas flow to the vacuum chamber 801. In an embodiment, the vacuum chamber 801 has a plurality of gas inlets and mass flow controllers. The gas flow can be in a range of 1 to 1000 SCCM depending on plasma operating conditions, pumping speed of the vacuum pump 803, process conditions, and the like. Typical gas pressure in the vacuum chamber 801 during a sputtering process can be in a range of 0.1 mTorr to 100 mTorr. In an embodiment, a plurality of gas inlets and a plurality of mass flow controllers sustain a desired gas pressure during the sputtering process. The plurality of gas inlets and plurality of mass flow controllers may be positioned in the vacuum chamber 801 at different locations. The feed gas can be a noble gas, such as Ar, Ne, Kr, Xe; a reactive gas, such as $N_2$, $O_2$; or any other gas that are suitable for sputtering or reactive sputtering processes. The feed gas can also be a mixture of noble and reactive gases. The feed gas can be a gas that contains the same atoms as a target material.

In an embodiment, the target material is carbon. The feed gases are $C_2H_2$ or any other gas that contains carbon atoms and a noble gas such as argon.

FIG. 8 shows an embodiment of an electrically and magnetically enhanced magnetron sputtering apparatus 800, which includes a substrate support 808 that holds a substrate 807 or other work piece for plasma processing. The substrate support 808 is electrically connected to a bias voltage power supply 809. The bias voltage power supply 809 can include a radio frequency (RF) power supply, alternating current (AC) power supply, very high frequency (VHF) power supply, direct current (DC) power supply, and/or high power pulse power supply. The bias power supply 809 can operate in continuous mode or pulse mode. The bias power supply 809 can be combination of different power supplies that can provide different frequencies. The negative bias voltage on the substrate can be in a range of 0 and −2000 V. The negative substrate bias voltage can attract positive ions to the substrate. At bias voltages in the range of −800 V to −1000 V, the ions from sputtered target material atoms can etch substrate surface. At higher bias voltage, sputtered target material ions can be implanted to substrate surface. The substrate support 808 can include a heater 817 that is connected to a temperature controller (not shown). The temperature controller regulates the temperature of the substrate 807. In an embodiment, the temperature controller controls the temperature of the substrate 807 to be in a range of −20 C to 400 C.

The cathode target from the electrically and magnetically enhanced magnetron sputtering source is connected to power supply 811 through transmission line 813. The additional electrode from the electrically enhanced sputtering source is connected to power supply 814 through the transmission line 815. If power supply 814 is an RF power supply, the additional electrode can be inductively grounded through inductor 806 and switch 810. In an embodiment, there is no switch 810. If power supply 811 is an RF power supply, the additional cathode target assembly can be inductively grounded through inductor 821 and switch 820. In an embodiment, there is no switch 820.

During sputtering, a noble gas, such as argon, is flowing in the chamber 801 through inlet 804 or gas activation source 802. The gas pressure can be in the range of 0.5-50 mTorr. The substrate bias can be between −10 V and −200 V. In an embodiment, power supply 811 generates pulsed power with triangular or rectangular voltage pulse shapes or any other voltage pulse shapes. The pulsed power supply can generate asymmetrical bipolar pulses. At the same time, power supply 814 generates pulsed or continuous RF discharge near the additional electrode. This RF discharge increases the electron energy and electron density, thereby increasing the ionization rate of the sputtered target material atoms. That is, the pulsed power supply connected to the cathode target controls the deposition rate, and the RF power supply that is connected to the additional electrode controls plasma density and electron energy. The RF power can be in the range of 1-20 kW. In an embodiment, power supply 811 generates DC power. The DC power can be in the range of 1-100 kW depending on the area of the cathode target.

In an embodiment, a cathode target magnet assembly includes multiple small magnetrons. In an embodiment, one part of the cathode target magnet assembly forms a magnetron configuration and another part forms a non-magnetron configuration.

The electrically and magnetically enhanced ionized physical vapor deposition (I-PVD) unbalanced magnetron sputtering apparatus can be configured for chemically enhanced I-PVD, plasma enhanced CVD, reactive ion etch (RIE), or sputter etch applications. Typically, for CVD, RIE, and sputter etch applications, the cathode target assembly and additional electrodes are connected to the RF power supplies and are inductively grounded. The RF frequency on the additional electrode and cathode target assembly can be different. In an embodiment, the RF frequency on the additional electrode is 27 MHz, and the RF frequency on the cathode target assembly is 13.56 MHz. The RF power supplies 814, 811 can be pulsed RF power supplies and can be synchronized. The cathode target magnet assembly for CVD, RIE, and sputter etch applications can have magnet assemblies that generate magnetic field lines, which are substantially perpendicular to the cathode surface.

In some embodiments, the assembly of the additional electrode and the gap electrode shown in FIG. 7 (*d*) can be used separately from the magnetron sputtering source shown in FIG. 8 (*b*). A substrate 760 is positioned on the magnetic pole piece 761 and heater 762. Supporter 763 is connected to substrate bias power supply 764. This configuration can be used for CVD and RIE applications.

Figure 9:
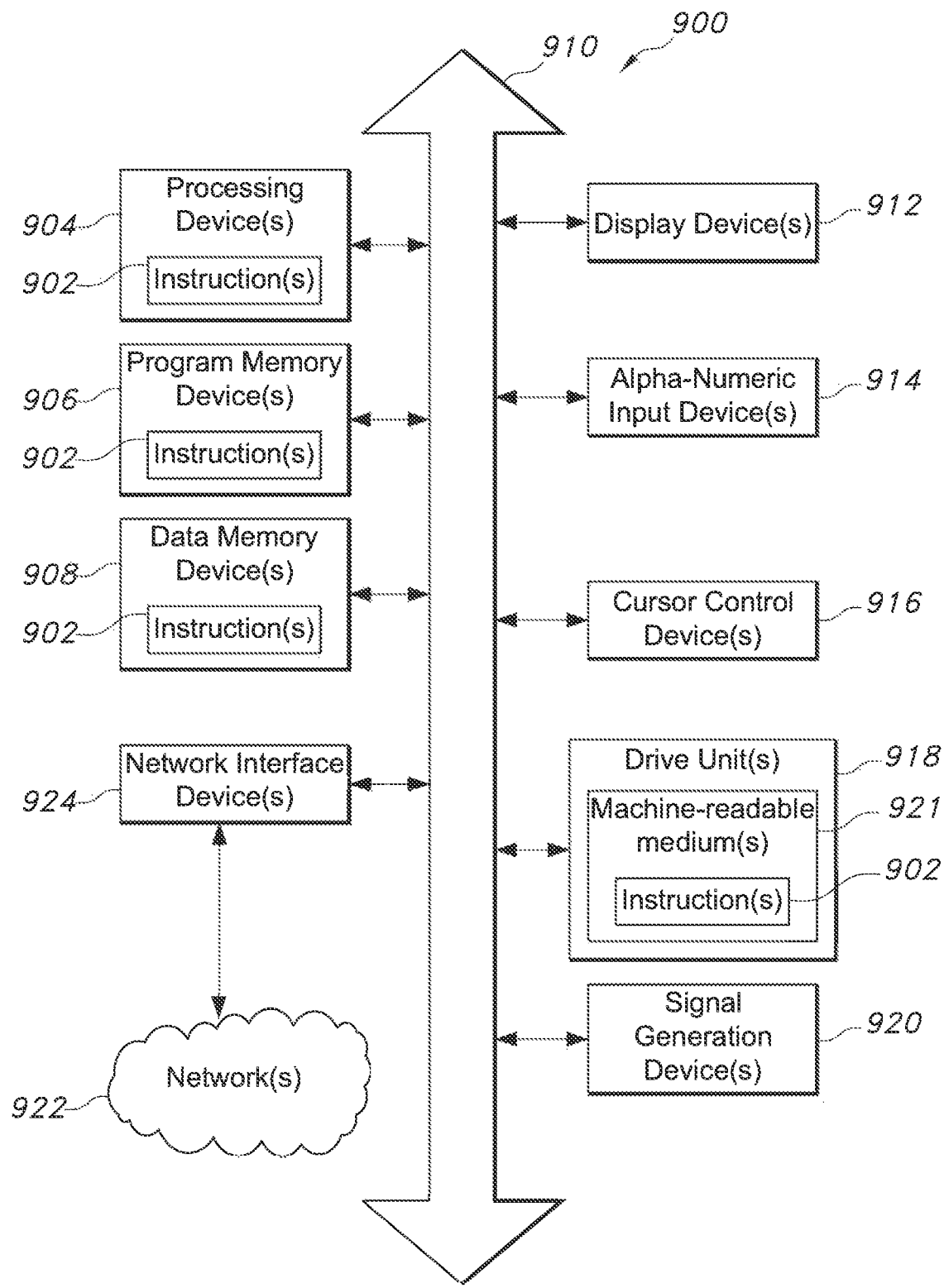
FIG. 9 shows a block diagram of at least a portion of an exemplary machine in the form of a computing system that performs methods according to one or more embodiments disclosed herein.
Figure 10A:
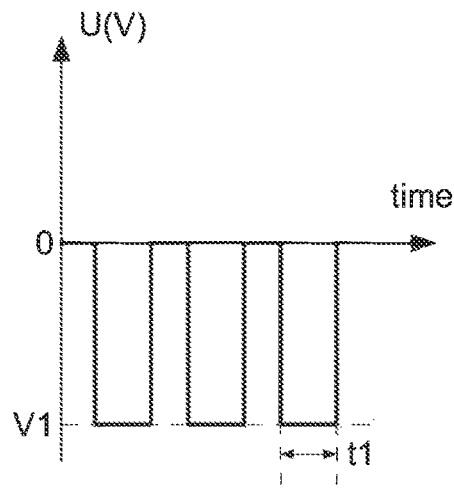
FIG. 10 (a) shows an illustrative view of a train of output negative unipolar voltage pulses with amplitude V1 and frequency f1 from a high-power resonance pulse forming network (PFN) with programmable pulse voltage duration and pulse voltage frequency.
Figure 10B:
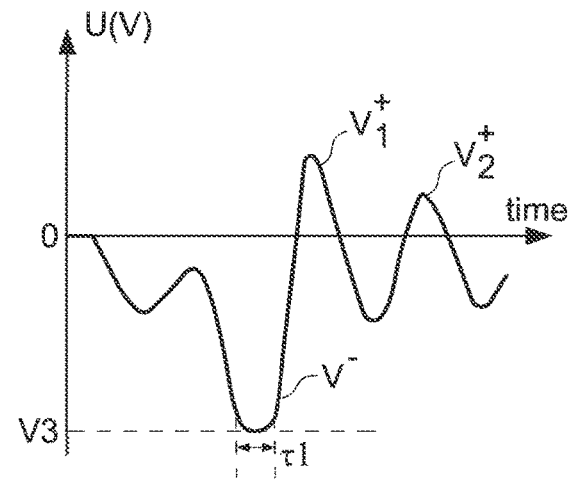
Figure 10C:
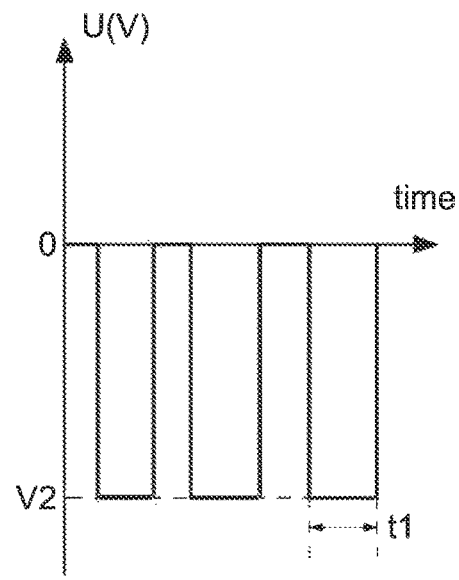
Figure 10D:
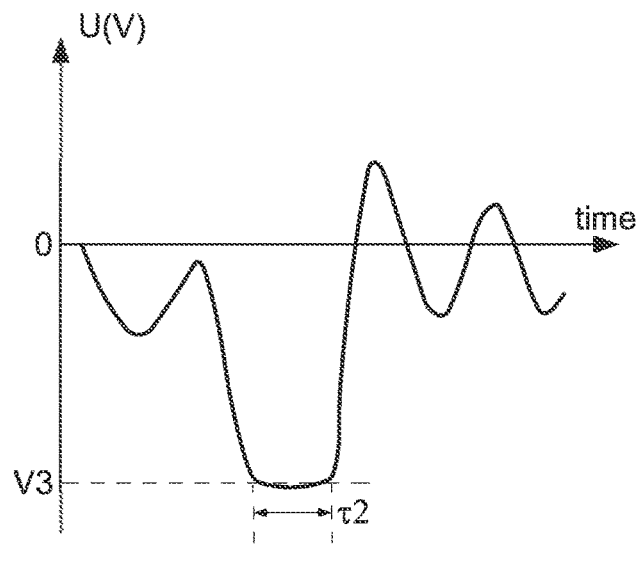
Figure 10E:
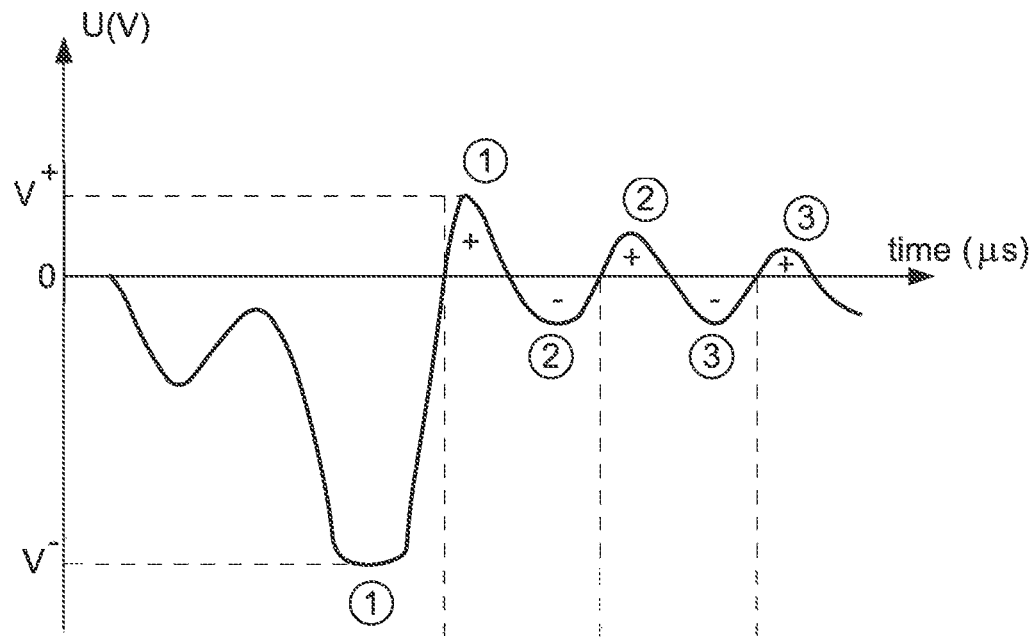
Figure 10F:
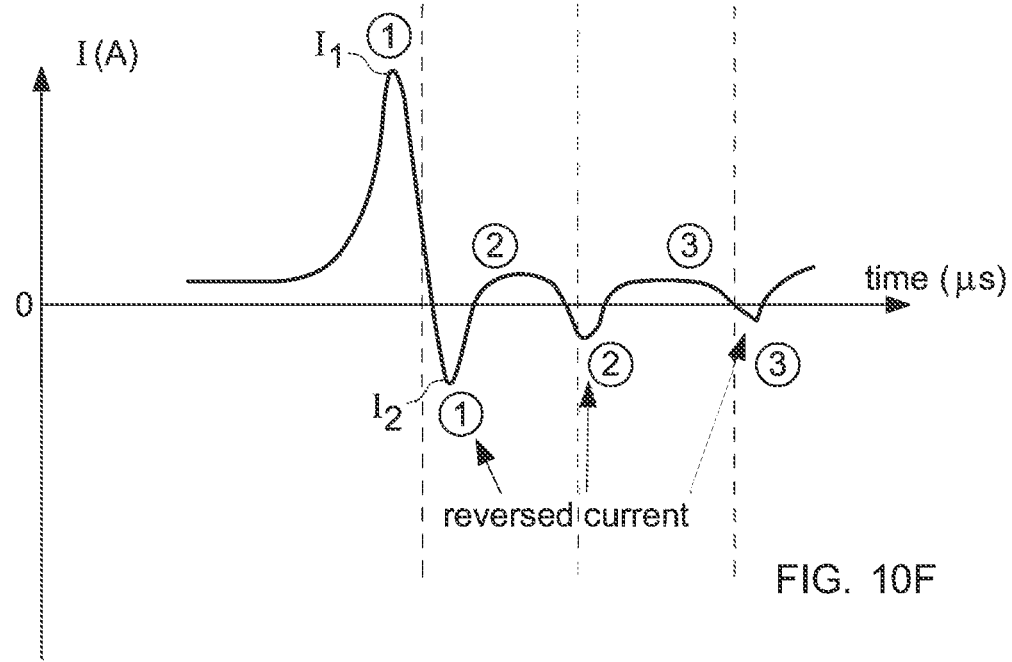
Figure 10G:
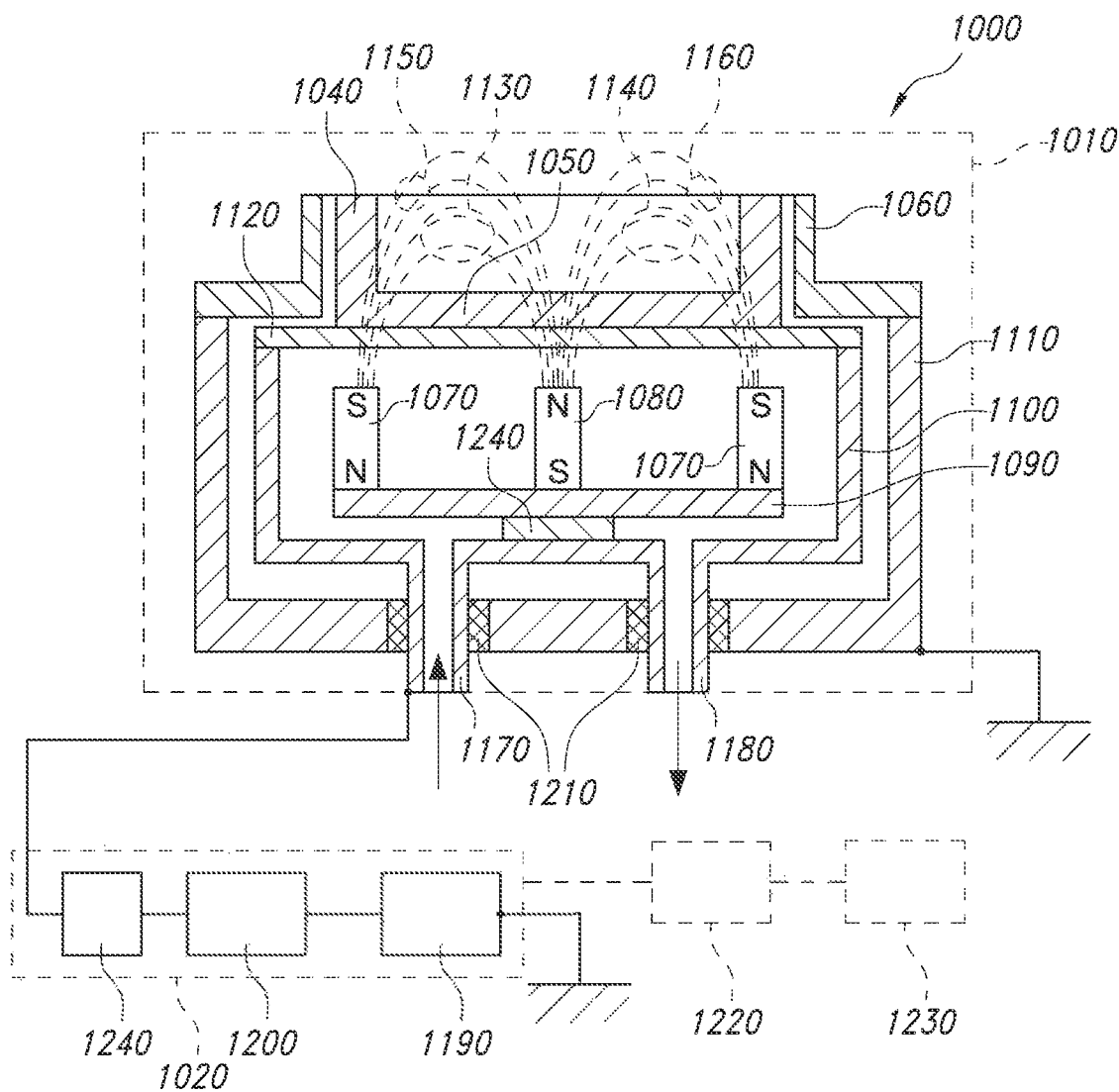
Figure 10H:
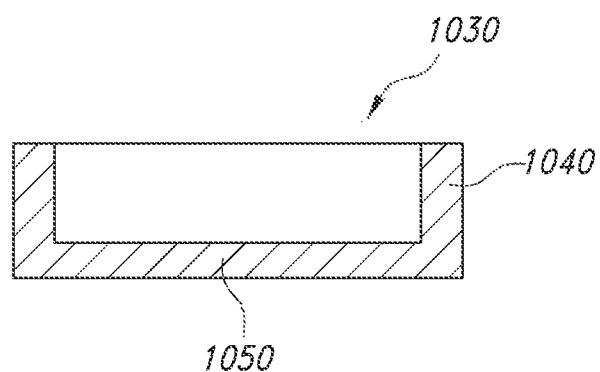

One or more embodiments disclosed herein, or a portion thereof, may make use of software running on a computer or workstation. By way of example, only and without limitation, FIG. 9 is a block diagram of an embodiment of a machine in the form of a computing system 900, within which is a set of instructions 902 that, when executed, cause the machine to perform any one or more of the methodologies according to embodiments of the invention. In one or more embodiments, the machine operates as a standalone device; in one or more other embodiments, the machine is connected (e.g., via a network 922) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 900 includes a processing device(s) 904 (e.g., a central processing unit (CPU), a graphics processing unit (GPU), or both), program memory device(s) 906, and data memory device(s) 908, which communicate with each other via a bus 910. The computing system 900 further includes display device(s) 912 (e.g., liquid crystal display (LCD), flat panel, solid state display, or cathode ray tube (CRT)). The computing system 900 includes input device(s) 914 (e.g., a keyboard), cursor control device(s) 916 (e.g., a mouse), disk drive unit(s) 918, signal generation device(s) 920 (e.g., a speaker or remote control), and network interface device(s) 924, operatively coupled together, and/or with other functional blocks, via bus 910.

The disk drive unit(s) 918 includes machine-readable medium(s) 926, on which is stored one or more sets of instructions 902 (e.g., software) embodying any one or more of the methodologies or functions herein, including those methods illustrated herein. The instructions 902 may also reside, completely or at least partially, within the program memory device(s) 906, the data memory device(s) 908, and/or the processing device(s) 904 during execution thereof by the computing system 900. The program memory device(s) 906 and the processing device(s) 904 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 912, input device(s) 914, cursor control device(s) 916, signal generation device(s) 920, etc., can be collectively referred to as an "input/output interface," and is intended to include one or more mechanisms for inputting data to the processing device(s) 904, and one or more mechanisms for providing results associated with the processing device(s). Input/output or I/O devices (including but not limited to keyboards (e.g., alpha-numeric input device(s) 914, display device(s) 912, and the like) can be coupled to the system either directly (such as via bus 910) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited, to personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 902, or that which receives and executes instructions 902 from a propagated signal so that a device connected to a network environment 922 can send or receive voice, video or data, and to communicate over the network 922 using the instructions 902. The instructions 902 are further transmitted or received over the network 922 via the network interface device(s) 924. The machine-readable medium also contains a data structure for storing data useful in providing a functional relationship between the data and a machine or computer in an illustrative embodiment of the systems and methods herein.

While the machine-readable medium 902 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory automobile or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

Although the specification describes components and functions implemented in the embodiments with reference to particular standards and protocols, the embodiment are not limited to such standards and protocols.

The disclosed embodiments may also relate to a high energy density plasma (HEDP) magnetically enhanced sputtering source, apparatus, and method for sputtering hard coatings in the presence of high-power pulse asymmetrical alternating current (AC) waveforms. The high power pulse asymmetric AC waveform is generated by having a regulated voltage source with variable power feeding a regulated voltage to the high power pulse supply with programmable pulse voltage duration and pulse voltage frequency producing at its output a train of regulated amplitude unipolar negative voltage pulses with programmed pulse frequency and duration and supplying these pulses to a tunable pulse forming network (PFN) including a plurality of inductors and capacitors for pulse applications connected in a specific format coupled to a magnetically enhanced sputtering source. By adjusting the pulse voltage amplitude, duration, and frequency of the unipolar negative voltage pulses and tuning the values of the inductors and capacitors in the PFN coupled to a magnetically enhanced sputtering source, a resonance pulsed asymmetric AC discharge is achieved.

Another method to produce a resonance pulsed asymmetric AC discharge is to have fixed unipolar pulse power supply parameters (amplitude, frequency, and duration) feeding a pulse forming network, in which the numerical values of the inductors and capacitors, as well as the configuration can be tuned to achieve the desired resonance values on the HEDP source to form a layer on the substrate. The tuning of the PFN can be done manually with test equipment, such as an oscilloscope, voltmeter and current meter or other analytical equipment; or electronically with a built-in software algorithm, variable inductors, variable capacitors, and data acquisition circuitry. The negative voltage from the pulse asymmetric AC waveform generates high density plasma from feed gas atoms and sputtered target material atoms between the cathode sputtering target and the anode of the magnetically enhanced sputtering source. The positive voltage from the pulse asymmetrical AC waveform attracts plasma electrons to the cathode sputtering area and generates positive plasma potential. The positive plasma potential accelerates gas and sputtered target material ions from the cathode sputtering target area towards the substrate that improve deposition rate and ion bombardment on the substrate. The reverse electron current can be up to 50% from the discharge current during negative voltage.

In some embodiments, the magnetically enhanced sputtering source is a hollow cathode magnetron. The hollow cathode magnetron includes a hollow cathode sputtering target, and the tunable PFN has a plurality of capacitors and inductors. The resonance mode associated with the tunable PFN is a function of the input unipolar voltage pulse amplitude, duration, and frequency generated by the high power pulse power supply, inductance, resistance and capacitance of the hollow cathode magnetron or any other magnetically enhanced device, the inductance, capacitance, and resistance of the cables between the tunable PFN and hollow cathode magnetron, and a plasma impedance of the hollow cathode magnetron sputtering source itself as well as the sputtered material.

In some embodiments, rather than the hollow cathode magnetron, a cylindrical magnetron is connected to an output of the tunable PFN. In some embodiments, rather than the hollow cathode magnetron, a magnetron with flat target is connected to the output of the tunable PFN. In the resonance mode, the output negative voltage amplitude of the high power pulse voltage mode asymmetrical AC waveform on the magnetically enhanced device exceeds the negative voltage amplitude of the input unipolar voltage pulses into the tunable PFN by 1.1-5 times. The unipolar negative high power voltage output can be in the range of 400V-5000V. In the resonance mode, the absolute value of the negative voltage amplitude of the asymmetrical AC waveform can be in the range of 750-10000 V. In the resonance mode, the output positive voltage amplitude of the asymmetrical AC waveform can be in the range of 100-5000 V. In some cases, the resonance mode of the negative voltage amplitude of the output AC waveform can reach a maximum absolute value while holding all other component parameters (such as the pulse generator output, PFN values, cables and HEDP source) constant, wherein a further increase of the input voltage to the tunable PFN does not result in a voltage amplitude increase on the HEDP source, but rather an increase in the duration of the negative pulse in the asymmetric AC waveform on the HEDP source.

Sputtering processes are performed with a magnetically and electrically enhanced HEDP plasma source positioned in a vacuum chamber. As mentioned above, the plasma source can be any magnetically enhanced sputtering source with a different shape of sputtering cathode target. Magnetic enhancement can be performed with electromagnets, permanent magnets, stationary magnets, moveable magnets, and/or rotatable magnets. In the case of a magnetron sputtering source, the magnetic field can be balanced or unbalanced. A typical power density of the HEDP sputtering process during a negative portion of the high voltage AC waveform is in the range of 0.1-20 kW/cm'. A typical discharge current density of the HEDP sputtering process during a negative portion of the high voltage AC waveform is in the range of 0.1-20 A/cm$^2$. In the case of the hollow cathode magnetron sputtering source, the magnetic field lines form a magnetron configuration on a bottom surface of the hollow cathode target from the hollow cathode magnetron. Magnetic field lines are substantially parallel to the bottom surface of the hollow cathode target and partially terminate on the bottom surface and side walls of the hollow cathode target. The height of the side walls can be in the range of 5-100 mm. Due to the presence of side walls on the hollow cathode target, electron confinement is significantly improved when compared with a flat target in accordance with the disclosed embodiments. In some embodiments, an additional magnet assembly is positioned around the walls of the hollow cathode target. In some embodiments, there is a magnetic coupling between additional magnets and a magnetic field forms a magnetron configuration.

Since the high power resonance asymmetric AC waveform can generate HEDP plasma and, therefore, significant power on the magnetically enhanced sputtering source, the AC waveform is pulsed in programmable bursts to prevent damage to the magnetically enhanced sputtering source from excess average power. The programmable duration of the AC pulse bursts can be in the range of 0.1-100 ms. The frequency of the programmable AC pulse bursts can be in the range of 1 Hz-10000 Hz. In some embodiments, the AC waveform is continuous or has a 100% duty cycle assuming the HEDP plasma source can handle the average power. The frequency of the pulsed AC waveform inside the programmable pulse bursts can be programmed in the range of 100 Hz-400 kHz with a single frequency or mixed frequency.

The magnetically enhanced HEDP sputtering source includes a magnetron with a sputtering cathode target, an anode, a magnet assembly, a regulated voltage source connected to a high power pulsed power supply with programmable output pulse voltage amplitude, frequency, and duration. The pulsed power supply is connected to the input of the tunable PFN, and the output of the tunable PFN is connected to the sputtering cathode target on the magnetically enhanced sputtering source. The tunable PFN, in resonance mode, generates the high power resonance asymmetrical AC waveform and provides HEDP on the magnetically enhanced sputtering source.

The magnetically enhanced high power pulse resonance asymmetric AC HEDP sputtering source may include a hollow cathode magnetron with a hollow cathode sputtering target, a second magnet assembly positioned around the side walls of the hollow cathode target, an electrical switch positioned between the tunable PFN and hollow cathode magnetron with a flat sputtering target rather than a hollow cathode shape, and a magnetic array with permanent magnets, electromagnets, or a combination thereof.

The magnetically enhanced high power pulse resonance asymmetric AC HEDP sputtering apparatus includes a magnetically enhanced HEDP sputtering source, a vacuum chamber, a substrate holder, a substrate, a feed gas mass flow controller, and a vacuum pump.

The magnetically enhanced high power pulse resonance asymmetric AC HEDP sputtering apparatus may include one or more electrically and magnetically enhanced HEDP sputtering sources, substrate heater, controller, computer, gas activation source, substrate bias power supply, matching network, electrical switch positioned between the tunable PFN and magnetically enhanced HEDP sputtering source, and a plurality of electrical switches connected with a plurality of magnetically enhanced high power pulse resonance asymmetric AC HEDP sputtering sources and output of the tunable PFN.

A method of providing high power pulse resonance asymmetric AC HEDP film sputtering includes positioning a magnetically enhanced sputtering source inside a vacuum chamber, connecting the cathode target to the output of the tunable PFN that, in resonance mode, generating the high power asymmetrical AC waveform, positioning a substrate on a substrate holder, providing feed gas, programming voltage pulses frequency and duration, adjusting pulse voltage amplitude of the programmed voltage pulses with fixed frequency and duration feeding the tunable PFN, generating the output high voltage asymmetrical AC waveform with a negative voltage amplitude that exceeds the negative voltage amplitude of the voltage pulses in the resonance mode, thereby resulting in a high power pulse resonance asymmetric AC HEDP discharge.

The method of magnetically enhanced high power pulse resonance asymmetric AC HEDP film sputtering may include positioning an electrical switch between the hollow cathode magnetron and the tunable PFN that, in resonance mode, generates the high voltage asymmetrical AC waveform, applying heat to the substrate or cooling down the substrate, applying direct current (DC) or radio frequency (RF) continuously and/or using a pulse bias voltage to the substrate holder to generate a substrate bias, connecting the tunable PFN that, in resonance mode, generates the high voltage asymmetrical AC waveform simultaneously to the plurality of hollow cathode magnetrons or magnetrons with flat targets, and igniting and sustaining simultaneously HEDP in the plurality of the hollow cathode magnetron.

The disclosed embodiments include a method of sputtering a layer on a substrate using a high power pulse resonance asymmetric AC HEDP magnetron. The method includes configuring an anode and a cathode target magnet assembly to be positioned in a vacuum chamber with a sputtering cathode target and the substrate, applying high power negative unipolar voltage pulses with regulated amplitude and programmable duration and frequency to a tunable PFN, wherein the tunable PFN includes a plurality of inductors and capacitors, and adjusting an amplitude associated with the unipolar voltage pulses with programmed duration and frequency to cause a resonance mode associated with the tunable pulse forming network to produce an output high power pulse resonance asymmetric AC on the HEDP sputtering source. The output AC waveform from the tunable PFN is operatively coupled to the HEDP sputtering cathode target, and the output high power pulse resonance asymmetric AC waveform includes a negative voltage exceeding the amplitude of the input unipolar voltage pulses to the tunable PFN during the resonance mode and sputtering discharge of the HEDP magnetron. With all conditions fixed, any further increase of the amplitude of the unipolar voltage pulses causes only an increase in the duration of the maximum value of the negative voltage amplitude of the output high power asymmetric AC waveform in response to the pulse forming network being in the resonance mode, thereby causing the HEDP magnetron sputtering discharge to form the layer on the substrate.

The disclosed embodiments further include an apparatus that sputters a layer on a substrate using a high-power pulse resonance asymmetric AC HEDP magnetron. The apparatus includes an anode, cathode target magnet assembly, regulated high voltage source with variable power, high power pulse power supply with programmable voltage pulse duration and frequency power supply, and a tunable PFN. The anode and cathode target magnet assembly are configured to be positioned in a vacuum chamber with a sputtering cathode target and the substrate. The high power pulse power supply generates programmable unipolar negative voltage pulses with defined amplitude, frequency, and duration. The tunable pulse forming network includes a plurality of inductors and capacitors, and the amplitude of the voltage pulses are adjusted to be in the resonance mode associated with the tunable PFN and magnetically enhanced sputtering source for specific programmed pulse parameters, such as amplitude, frequency and duration of the unipolar voltage pulses. The output of the tunable PFN is operatively coupled to the sputtering cathode target, and the output of the tunable PFN in the resonance mode generates a high power resonance asymmetric AC waveform that includes a negative voltage exceeding the amplitude of the input to tunable PFN unipolar voltage pulses. An AC waveform sustains plasma and forms high power pulse resonance asymmetric AC HEDP magnetron sputtering discharge, thereby causing the HEDP magnetron sputtering discharge to form the layer of the sputtered target material on the substrate.

The disclosed embodiments also include a computer-readable medium storing instructions that, when executed by a processing device, perform a method of sputtering a layer on a substrate using a high energy density plasma (HEDP) magnetron, wherein the operations include configuring an anode and a cathode target magnet assembly to be positioned in a vacuum chamber with a sputtering cathode target and the substrate, applying regulated amplitude unipolar voltage pulses with programmed frequency and duration to the tunable PFN, wherein the pulse forming network includes a plurality of inductors and capacitors, and adjusting a pulse voltage for programmed voltage pulses frequency and duration to cause a resonance mode associated with the tunable PFN. The output asymmetric AC waveform is operatively coupled to the sputtering cathode target, and the output asymmetric AC waveform includes a negative voltage exceeding the amplitude of the regulated unipolar voltage pulses amplitude with programmed frequency and duration during sputtering discharge of the HEDP magnetron. A further increase in the amplitude of the regulated unipolar voltage pulses with programmed frequency and duration causes a constant amplitude of the negative voltage of the output AC waveform in response to the pulse forming network being in the resonance mode, thereby causing the HEDP magnetron sputtering discharge to form the layer on the substrate.

Other embodiments will become apparent from the following detailed description considered in conjunction with the accompanying drawings. It is to be understood, however, that the drawings are designed as an illustration only and not as a definition of the limits of any of the embodiments.

A high energy density plasma (HEDP) magnetically enhanced sputtering source includes a hollow cathode magnetron, pulse power supply, and tunable pulse forming network (PFN). The tunable PFN, in resonance mode, generates a high voltage asymmetrical alternating current (AC) waveform with a frequency in the range of 400 Hz to 400 kHz. The resonance mode of the tunable PFN, as used herein, is a mode in which input negative unipolar voltage pulses with adjusted amplitude, and programmed duration, and frequency generate an output high power resonance pulse asymmetric AC waveform with negative amplitude that exceeds the negative amplitude of the input negative unipolar voltage pulses. Further increase of the amplitude of the input negative unipolar voltage pulses from the high power pulse power supply does not increases the negative amplitude of the output high resonance asymmetric AC voltage waveform, but increases the duration of the maximum value of the negative resonance AC voltage waveform as shown in FIGS. 10 (a, b, c, d). When the amplitude of the input unipolar negative voltage pulses equals V1 as shown in FIG. 10 (a) at the output of the tunable PFN during the HEDP discharge, there is an asymmetrical resonance AC voltage waveform as shown in FIG. 10 (b). The resonance asymmetrical AC voltage waveform has a negative portion V⁻ with a duration $\tau 1$, and positive portions $V_1^+$ and $V_2^+$. When the amplitude voltage becomes V2 and V2>V1, the amplitude of the resonance negative AC voltage waveform is the same as V3, but the duration is $\tau 2$ and $\tau 2 > \tau 1$. A negative portion of the resonance asymmetrical AC voltage waveform generates AC discharge current $I_1$ and positive voltage generates discharge current $I_2$ as shown in FIGS. 10 (e, f). A negative portion of the high power asymmetrical resonance AC voltage waveform generates HEDP magnetron discharge from feed gas and sputtering target material atoms inside a hollow cathode target due to high discharge voltage and improved electron confinement. During the sputtering process, the hollow cathode target power density is in the range of 0.1 to 20 kW/cm$^2$. A positive portion of the high voltage asymmetrical AC voltage waveform provides absorption of electrons from the HEDP by the hollow cathode magnetron surface and, therefore, generates a positive plasma potential that causes ions to accelerate towards the hollow cathode target walls and a substrate. The ion energy is a function of the amplitude and duration of the positive voltage. The duration of the maximum absolute value of the negative voltage from the high voltage asymmetrical AC voltage waveform is in the range of 0.001-to 100 ms. The discharge current during the positive voltage of the asymmetrical resonance AC voltage waveform can be in the range of 5-50% of the discharge current during the negative voltage from the AC voltage waveform.

The high power pulse resonance asymmetric AC HEDP magnetron sputtering process is substantially different from high power impulse magnetron sputtering (HIPIMS) due to the resonance AC nature of the discharge generated by the tunable PFN and HEDP magnetron discharge. The resonance asymmetrical high power AC discharge is substantially more stable when compared with HIPIMS discharge. In the resonance mode, the high power AC waveform can be symmetrical or asymmetrical. For example, for a carbon hollow cathode magnetron, a sputtering process with stable AC discharge current density of about 6 A/cm$^2$ is obtained. The disclosed embodiments relate to ionized physical vapor deposition (I-PVD) with an HEDP sputtering apparatus and method.

A sputtering process can be performed with a hollow cathode magnetron sputtering source and direct current (DC) power supply. An example of such an apparatus and sputtering process is described in Zhehui Wang and Samuel A. Cohen, *Hollow cathode magnetron*, J. Vac. Sci. Technol., Vol. 17, January/February 1999, which is incorporated by reference herein in its entirety. However, these techniques do not address operation of a hollow cathode magnetron sputtering source with a high voltage asymmetrical AC voltage waveform, a method of accelerating ions from the feed gas and sputtering target material atoms by controlling a positive voltage portion of a high power asymmetrical resonance AC waveform applied to an entirely hollow cathode magnetron, or operation of a pulse power supply and tunable PFN when the tunable PFN is in a resonant mode and generating a high power resonance asymmetrical AC waveform on a hollow cathode magnetron sputtering source.

A magnetically and electrically enhanced HEDP sputtering source 1000 shown in FIG. 10 (*g*) includes a hollow cathode magnetron 1010 and a high power pulse resonance AC power supply 1020, which includes a high power voltage source 1190, a high power pulsed power supply with programmable voltage pulse frequency and amplitude 1200, and tunable PFN 1240. This tunable PFN, in resonance mode, generates a high power resonance asymmetrical AC waveform. The hollow cathode magnetron 1010 includes a hollow cathode target 1030. The hollow cathode target 1030 has side walls 1040 and a bottom part 1050 as shown in FIGS. 10 (*g*), (*h*). An anode 1060 is positioned around the side walls 1040. Magnets 1070, 1080, and magnetic pole piece 1090 are positioned inside a water jacket 1100. The water jacket 1100 is positioned inside a housing 1110. The hollow cathode target 1030 is bonded to a copper backing plate 1120. Magnets 1070, 1080 and magnetic pole piece 1090 generate magnetic field lines 1130, 1140 that terminate on a bottom part 1050 and form a magnetron configuration. Magnetic pole piece 1090 is positioned on a supporter 1240. Magnetic field lines 1150, 1160 terminate on the side walls 1040. Water jacket 1100 has a water inlet 1170 and a water outlet 1180. The water inlet 1170 and water outlet 1180 are isolated from housing 1110 by isolators 1210. Water jacket 1100 and, therefore, hollow cathode target 1010 are connected to a high power pulse resonance AC power supply 1020. The following chemical elements, or a combination of any two or more of these elements, can be used as a cathode material: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, and/or Ba. A combination of these chemical elements with the gases $O_2$, $N_2$, F, Cl, and/or $H_2$ can also be used as the cathode material.

The hollow cathode target magnetic array may have electromagnets rather than permanent magnets. In some embodiments, the electromagnets are positioned around the side walls 1040 of the hollow cathode target. These side electromagnets can balance and unbalance the hollow cathode target magnetic array.

In some embodiments, the hollow cathode target, during the sputtering process, has a temperature between 20 C and 1000 C. A high target temperature in the range of 0.5-0.7 of the melting target temperature increases the deposition rate since the sputtering yield is a function of the temperature in this temperature range. In some embodiments, a portion of the target material atoms arriving on the substrate is evaporated from the target surface. In some embodiments, the sputtering yield is increased due to high target temperature.

The high power pulse resonance AC power supply 1020 includes a regulated voltage source with variable power feeding 1190, a high power pulsed power supply with programmable voltage pulse frequency and amplitude 1200 and tunable PFN 1240 as shown in FIG. 11 (*a*). The high power pulsed power supply with programmable voltage pulse frequency and amplitude 1200 has a computer 1230 and controller 1220. A regulated voltage source with variable power feeding 1190 supplies voltage in the range of 400-5000 V to the high power pulsed power supply with programmable voltage pulse frequency and amplitude 1200. The high power pulsed power supply with programmable voltage pulse frequency and amplitude 1200 generates a train of unipolar negative voltage pulses to the tunable PFN 1240. The amplitude of the unipolar negative voltage pulses is in the range of 400 to 5000 V, the duration of each of the voltage pulses is in the range of 1 to 100 µs. The distance between voltages pulses can be in the range of 0.4 to 1000 µs, thus controlling the frequency to be between 0.1 to 400 kHz. In some embodiments, there is a step-up transformer between the high power pulsed power supply with programmable voltage pulse frequency and amplitude 1200 and the tunable PFN 1240. The tunable PFN includes a plurality of specialized variable inductors L1-L4 and a plurality of specialized variable capacitors C1-C2 for high power pulse applications. The value of the inductors and capacitors can be controlled by computer 1230 and/or controller 1220. In some embodiments, at least one inductor and/or one capacitor are variable and their values can be computer controlled. The inductors L1, L2, L3, L4 values can be in the range of 0 to 1000 µH each. Capacitors C1, C2, C3, and C4 have values in the range of 0 to 1000 µF each. The high power pulse programmable power supply 1200 is connected to controller 1220 and/or computer 1230. Controller 1220 and/or computer 1230 control output values and timing of the power supply 1020. Power supply 1020 can operate as a standalone unit without connection to the controller 1220 and/or computer 1230.

Figure 11A:
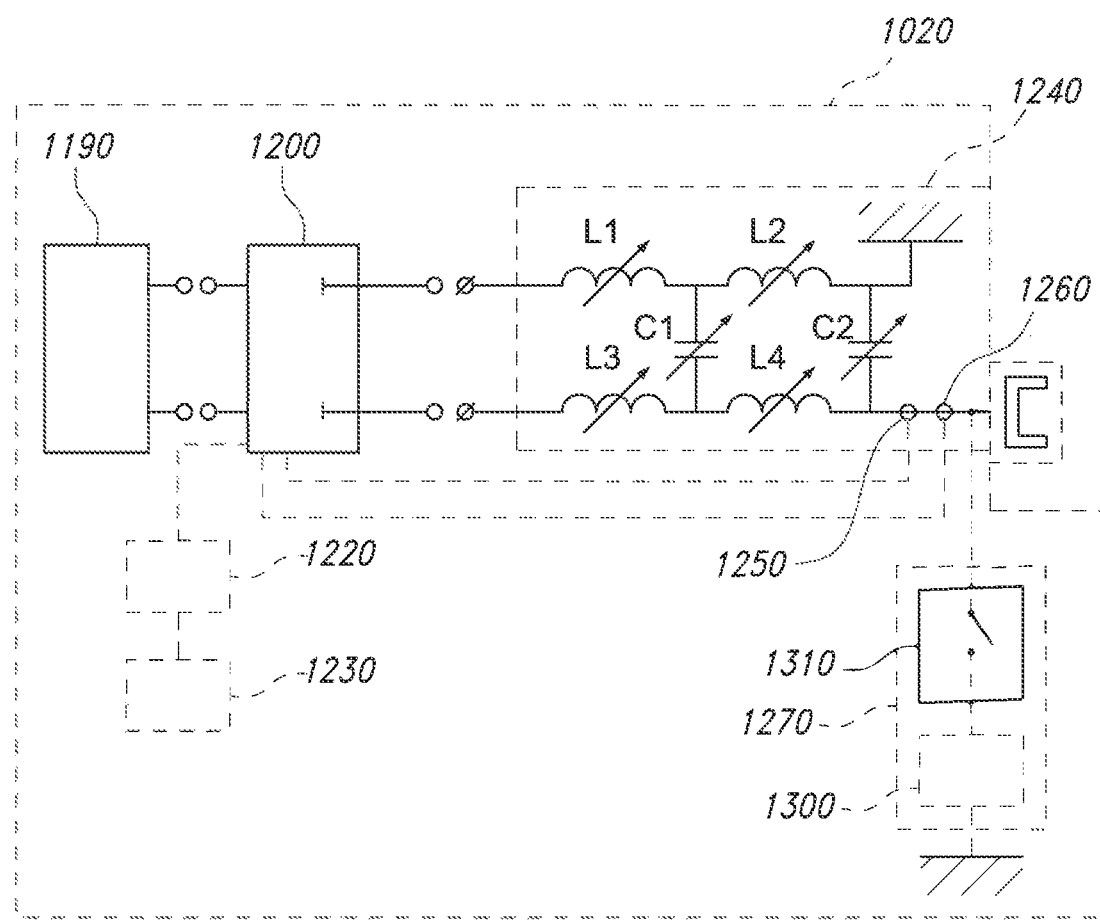
FIG. 11 (a) shows an illustrative circuit diagram of the high-power resonance pulse forming network (PFN)
Figure 11B:
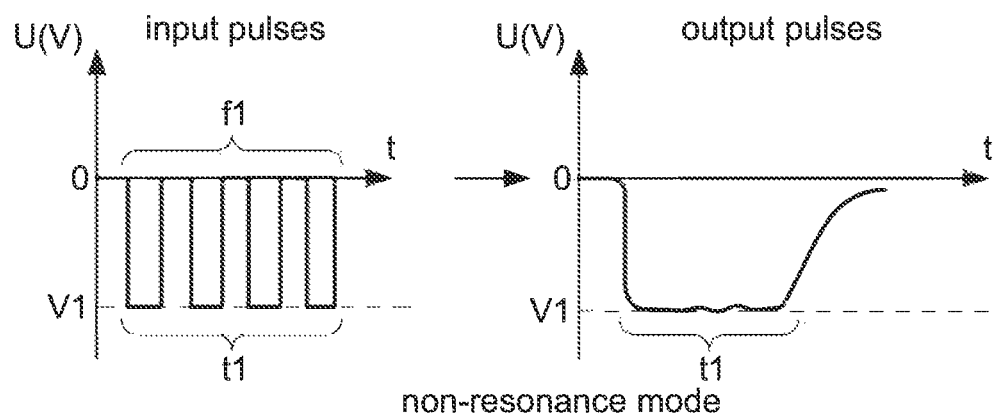
Figure 11C:
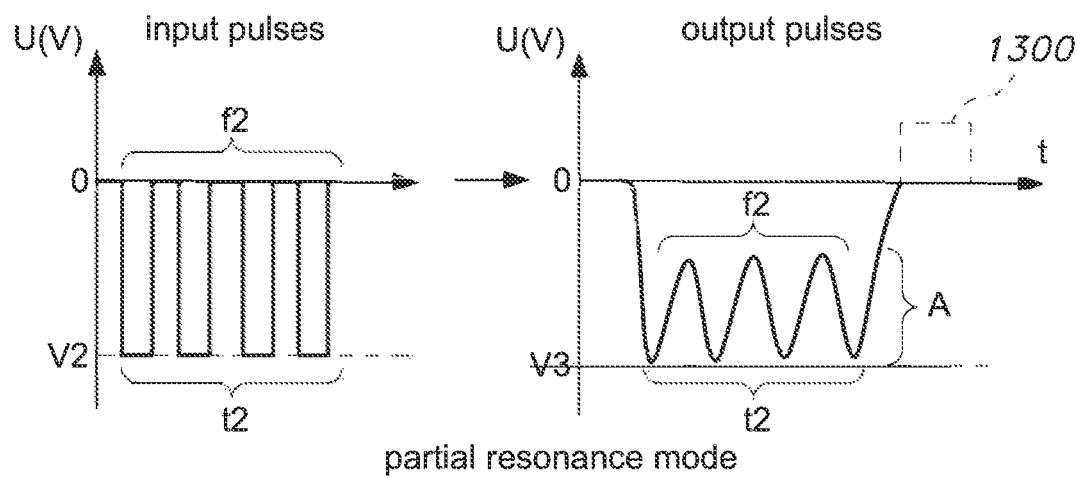
Figure 11D:
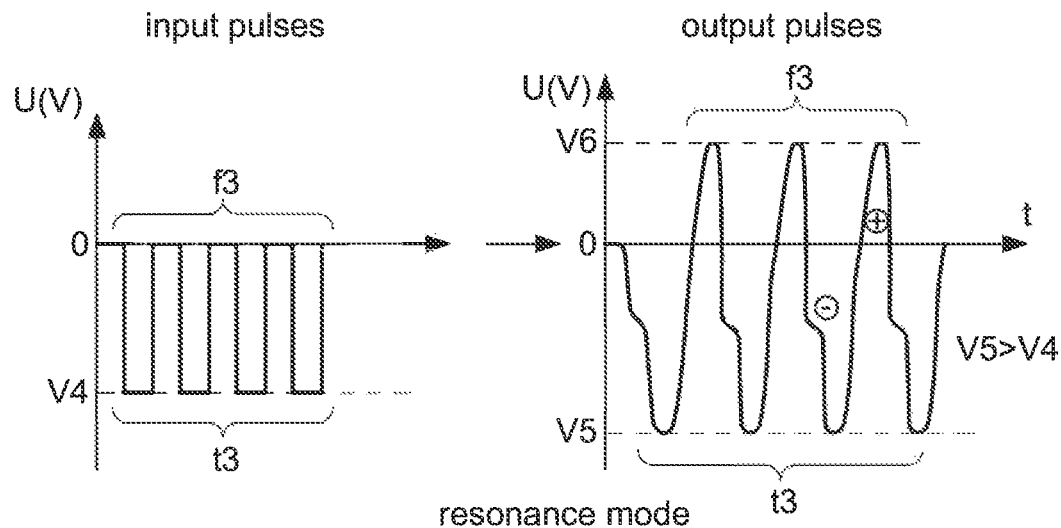
Figure 11E:
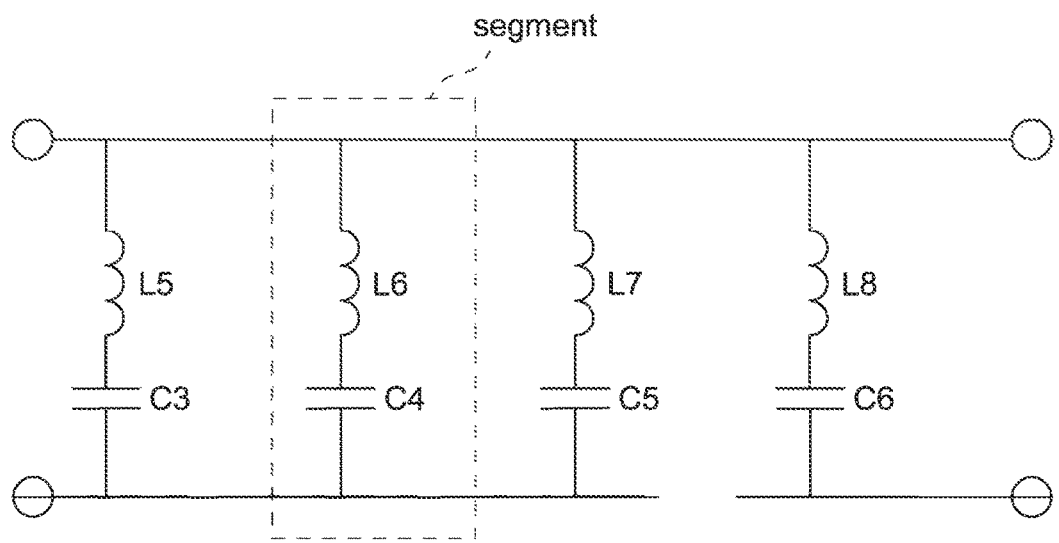
Figure 11F:
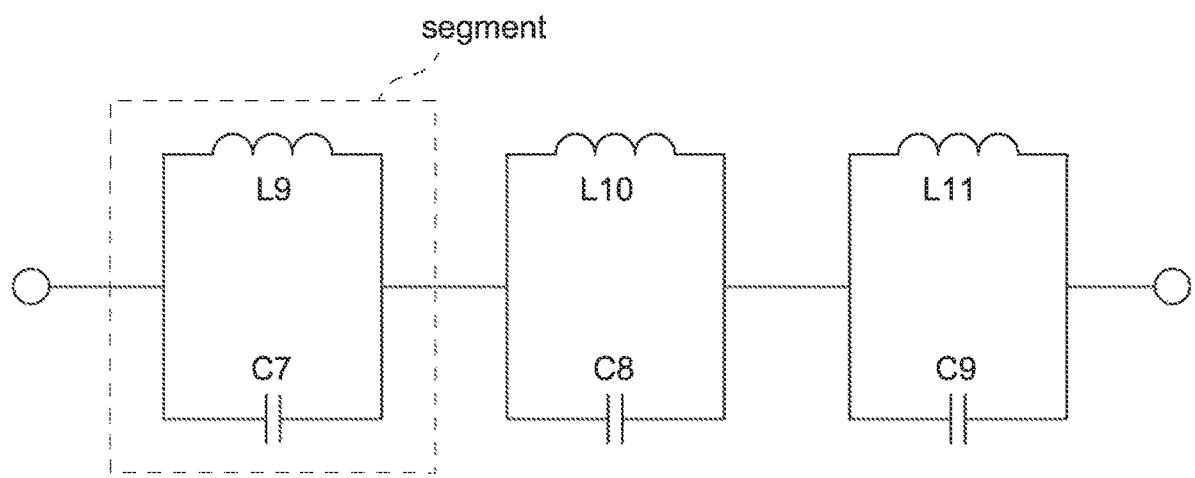

A high power pulse resonance AC power supply 1020 shown in FIG. 11(a) includes output current and voltage monitors 1250, 1260, respectively. The current and voltage monitors 1250, 1260 are connected to an arc suppression circuit 1270. If the current monitor 1250 detects a high current and the voltage monitor 1260 detects a low voltage, the arc suppression circuit 1270 is activated. It is to be noted that the voltage monitor 1260 is connected to an output of the tunable PFN. The arc suppression circuit sends a signal to stop generating incoming voltage pulses to the tunable PFN 1240 and connects the output of the tunable PFN through switch 1310 to the positive electrical potential generated by power supply 1300 in order to eliminate arcing as shown in FIG. 11 (a). The hollow cathode is shown as a C-shaped structure coupled to the output of the tunable PFN 1240.

The train of unipolar negative voltage pulses from the high power pulse programmable power supply 1200 is provided to the tunable PFN 1240. Depending on the amplitude, duration, and frequency of the input unipolar negative voltage pulses in the train, the output train from the tunable PFN 1240 of the unipolar negative voltage pulses can have a different shape and amplitude when compared with input unipolar negative voltage pulses. In non-resonant mode, in the tunable PFN 1240, the input train of negative unipolar pulses forms one negative voltage pulse with an amplitude equivalent to the amplitude of the negative unipolar voltage pulses and a duration equivalent to the duration of the input train of unipolar negative voltage pulses. When connected with the magnetically enhanced sputtering source, this voltage pulse can generate a quasi-static pulse DC discharge. In partial resonance mode, in the tunable PFN 1240, the input train of negative unipolar pulses forms one negative pulse with an amplitude and duration, but with voltage oscillations. The amplitude of these oscillations can be 30-80% of the total voltage amplitude. The frequency of the voltage oscillations is substantially equivalent to the frequency of the input unipolar negative voltage pulses. This mode of operation is beneficial to maintaining a high deposition rate, which is greater than that obtained in full resonance mode, and a high ionization of sputtered target material atoms. In resonance mode, the input train of unipolar negative voltage pulses forms asymmetrical AC voltage waveforms with a maximum negative voltage amplitude that can significantly exceed the voltage amplitude of the input unipolar negative voltage pulses. The positive amplitude of the AC voltage waveform can reach the absolute value of the negative amplitude and form a symmetrical AC waveform. In FIG. 11 (b), the pulsing unit generates, during time t1, a train of unipolar negative voltage pulses with a frequency f1 and amplitude V3 V1 (Please review the voltage, frequency, and time designations regarding at least FIGS. 11, 12, 16, and 18 in the description of drawings, detailed description and drawings (I DID).

In FIG. 11 (c), the high power pulse programmable power supply 1190 generates, during time t2, a train of unipolar negative voltage pulses with a frequency f2 and amplitude V3. In this case, the partial resonance mode exists. The amplitude A of the voltage oscillations is about 30-80% of the voltage amplitude V2. At the end of the pulse, the positive voltage pulse 1300 can be added by activating a positive voltage power supply connected to the output of the tunable PFN. If the high power pulse programmable power supply 1200 generates unipolar voltage pulses with a frequency f3 and amplitude V4 during time t3, the resonance mode exists in the PFN 1240. The resonance mode generates asymmetrical AC voltage waveform. The negative voltage amplitude V5 exceeds the amplitude of the input voltage pulses V4 as shown in FIG. 11 (d). In some embodiments, the amplitude of the voltage pulses V4 is −1200 V, amplitude of the negative voltage V5 is −1720 V and the amplitude of the positive voltage V6 is +280 V. In some embodiments, the amplitude of the voltage pulses V4 is −1500 V, and amplitude of the negative voltage V5 is −1720 V. The amplitude of the output positive voltage V6 is +780 V. Different tunable PFN that can be used to generate asymmetrical AC voltage waveforms are shown in FIGS. 11 (e, f).

Figure 12A:
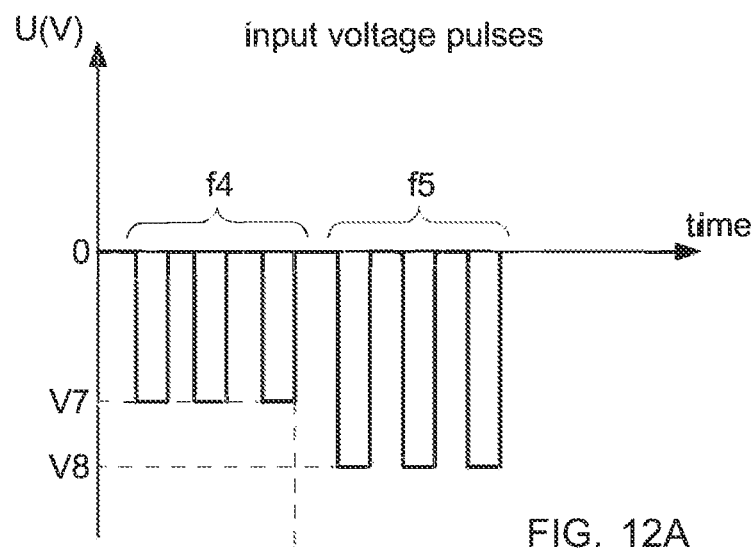
FIG. 12 (a) shows an illustrative view of a train of input unipolar negative voltage pulses with two different voltage amplitudes applied to the tunable PFN.
Figure 12B:
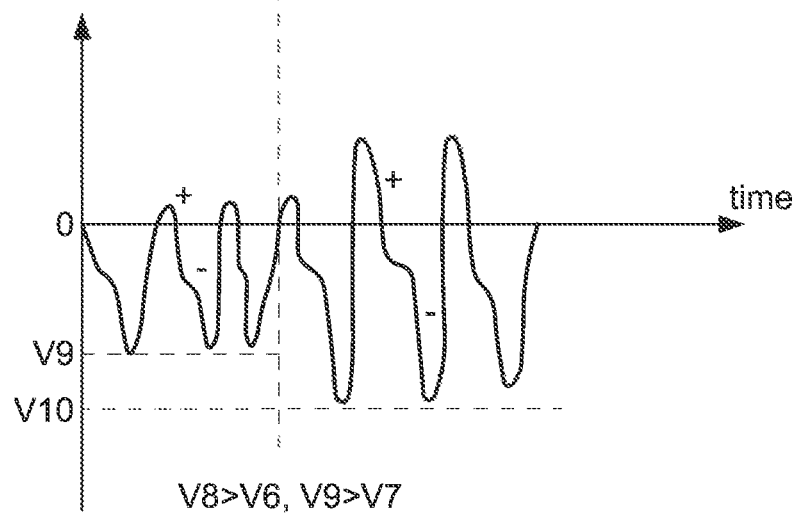

In some embodiments, the high power pulse programmable power supply pulsing 1200 can generate a train of unipolar negative voltage pulses with different amplitudes V7, V8 and frequencies f4, f5 as shown in FIG. 12 (a). There is a resonance mode in the tunable PFN 1240 when the output negative voltage amplitudes V9, V10 exceed the amplitude of the input voltage pulses V7, V8 as shown in FIG. 12 (b). During a negative portion of the asymmetrical AC discharge, a surface of the hollow cathode target 1030 emits secondary electrons due to ion bombardment, and during the positive portion of the asymmetrical AC discharge the hollow cathode 1030 absorbs electrons. The reduced quantity of electrons in the plasma generates a positive plasma potential. This plasma potential accelerates ions towards the substrate.

During a reactive sputtering process, positive electrical charge is formed on the hollow cathode target surface 1050 due to reactive feed gas interaction with the hollow cathode target surface 1050. The positive voltage of the asymmetrical high voltage AC waveform attracts electrons to the hollow cathode target surface. These electrons discharge a positive charge on top of the cathode target surface 1050 and significantly reduce or completely eliminate the probability of arcing. Since the electrons are absorbed by the hollow cathode target surface 1050, it is possible to generate positive space charge in the plasma. The positive space charge provides additional energy to the ions in the plasma and leads the ions toward the substrate and hollow cathode target walls. The positive voltage applied to the cathode target surface can attract negative ions that were formed when the negative voltage was applied to the target surface and, therefore, reduce substrate ion bombardment.

Figure 13A:
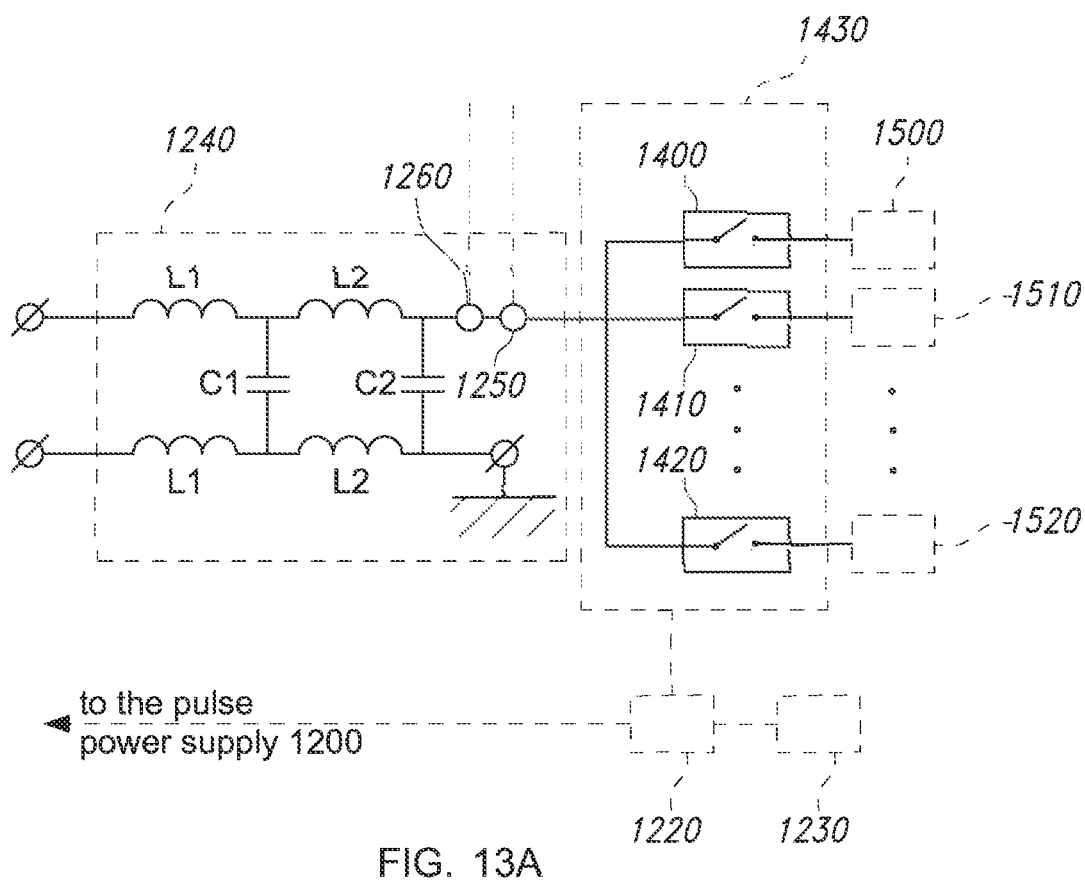
FIG. 13 (a) shows an illustrative circuit diagram of the tunable PFN and a plurality of electrical switches.
Figure 13B:
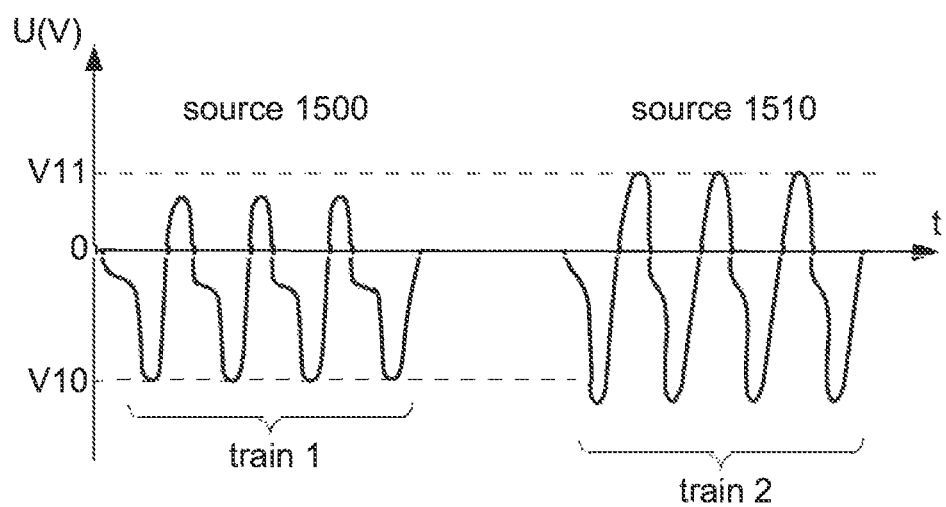

The tunable PFN 1240 can be connected with a plurality of electrical switches 1400-1420. The switches 1400, 1410, 1420 are connected to separate magnetron sputtering sources 1500, 1510, 1520 as shown in FIG. 13 (a). For example, during operation, the train 1 of pulses of high voltage AC waveform is directed to the sputtering source 1500, and the train 2 of pulses of high voltage AC waveform is directed to the sputtering source 1510 as shown in FIG. 13 (b). In this approach, small size sputtering sources can provide large area sputtering.

Figure 14A:
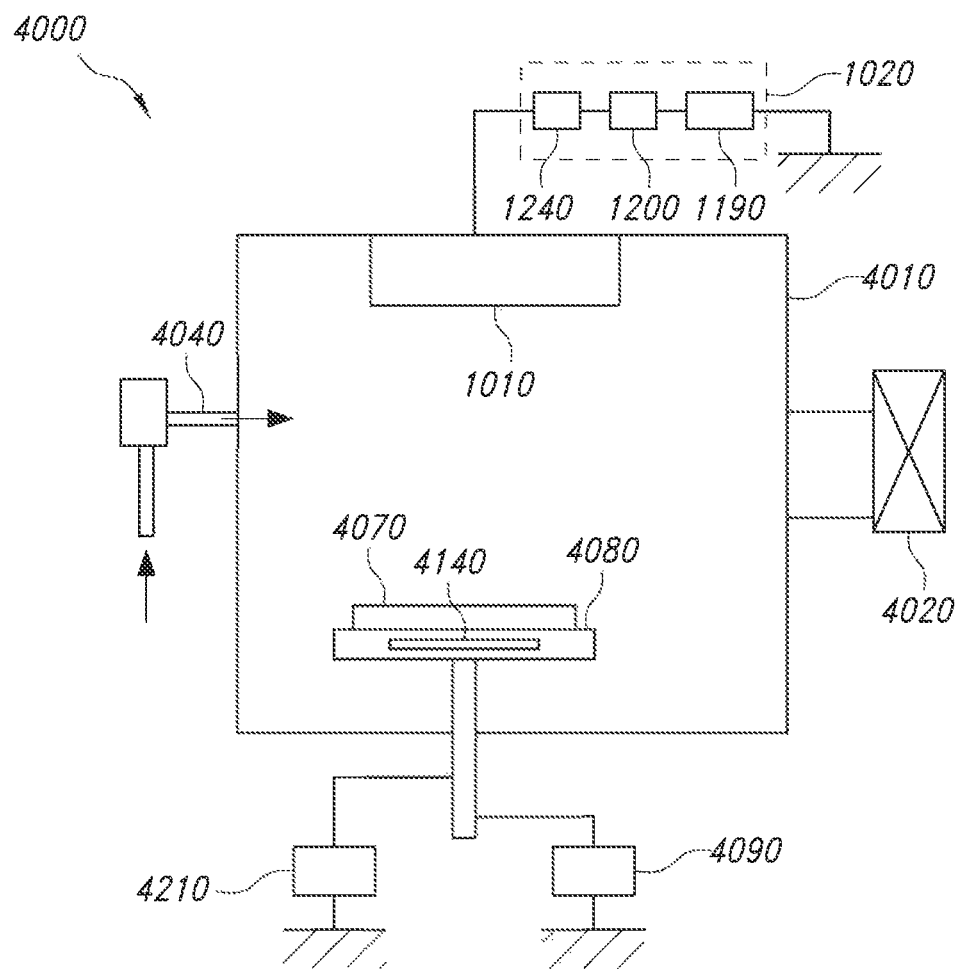
FIG. 14 (a) shows an illustrative view of the magnetically enhanced HEDP sputtering apparatus.
Figure 14B:
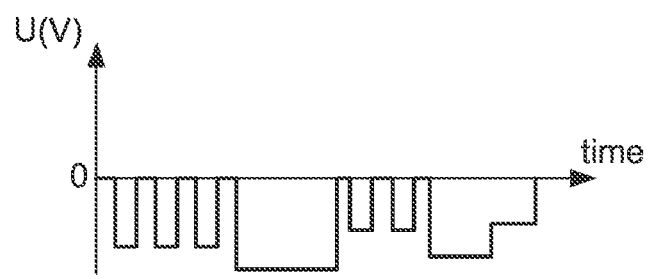
Figure 14C:
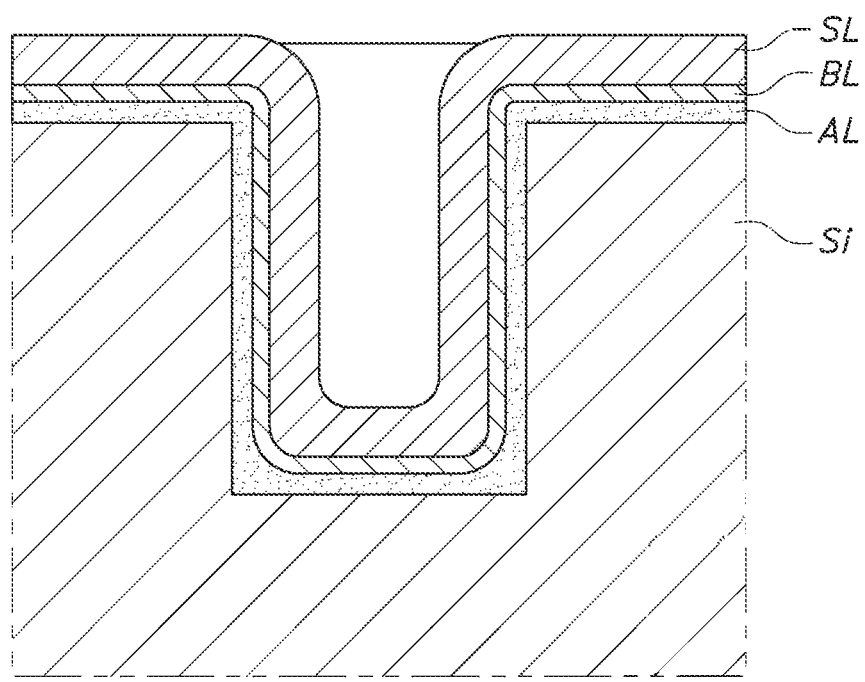

The hollow cathode magnetron 1010 from the magnetically and electrically enhanced HEDP sputtering source 1000 is mounted inside a vacuum chamber 4010 to construct the magnetically and electrically enhanced HEDP sputtering apparatus 4000 shown in FIG. 14 (a). The vacuum chamber 4010 contains feed gas and plasma, and is coupled to ground. The vacuum chamber 4010 is positioned in fluid communication with a vacuum pump 4020, which can evacuate the feed gas from the vacuum chamber 4010. Typical baseline pressure in the vacuum chamber 4010 is in a range of $10^{-6}$ to $10^{-9}$ Torr.

A feed gas is introduced into the vacuum chamber 4010 through a gas inlet 4040 from feed gas sources. A mass flow controller 4040 controls gas flow to the vacuum chamber 4010. In an embodiment, the vacuum chamber 4010 has a plurality of gas inlets and mass flow controllers. The gas flow is in a range of 1 to 1000 SCCM depending on plasma operating conditions, pumping speed of a vacuum pump 4030, process conditions, and the like. Typical gas pressure in the vacuum chamber 4010 during a sputtering process is in a range of 0.5 to 50 mTorr. In some embodiments, a plurality of gas inlets and a plurality of mass flow controllers sustain a desired gas pressure during the sputtering process. The plurality of gas inlets and plurality of mass flow controllers may be positioned in the vacuum chamber 401 at different locations. The feed gas can be a noble gas, such as Ar, Ne, Kr, Xe; a reactive gas, such as $N_2$, $O_2$; or any other gas suitable for sputtering or reactive sputtering processes. The feed gas can also be a mixture of noble and reactive gases.

The magnetically enhanced HEDP sputtering apparatus 4000 includes a substrate support 4080 that holds a substrate 4070 or other work piece for plasma processing. The substrate support 4080 is electrically connected to a bias voltage power supply 4090. The bias voltage power supply 4090 can include a radio frequency (RF) power supply, alternating current (AC) power supply, very high frequency (VHF) power supply, and/or direct current (DC) power supply. The bias power supply 4090 can operate in continuous mode or pulsed mode. The bias power supply 4090 can be a combination of different power supplies that can provide different frequencies. The negative bias voltage on the substrate is in a range of 0 to −2000 V. In some embodiments, the bias power supply generates a pulse bias with different voltage pulse frequency, amplitude, and shape as shown in FIG. 13 (b). In some embodiments, the voltage is a pulse voltage. The negative substrate bias voltage can attract positive ions to the substrate. The substrate support 4008 can include a heater 4140 that is connected to a temperature controller 4210. The temperature controller 4210 regulates the temperature of the substrate 4000. In an embodiment, the temperature controller 4210 controls the temperature of the substrate 4070 to be in a range of −100 C to (+1000) C.

In some embodiments, the hollow cathode target material is copper and the substrate is a semiconductor wafer that has at least one via or trench. The semiconductor wafer diameter is in the range of 25 to 450 mm. The depth of the via can be between 100 Å and 400 μm. The via can have an adhesion layer, barrier layer, and seed layer. Typically, the seed layer is a copper layer. The copper layer can be sputtered with the HEDP magnetron discharge as shown in FIG. 14 (c).

A method of sputtering films, such as hard carbon, includes the following conditions. The feed gas pressure can be in the range of 0.5 to 50 mTorr. The substrate bias can be between 0 V and −120 V. The substrate bias voltage can be continuous or pulsed. The frequency of the pulsed bias can be in the range of 1 Hz and 400 kHz. The substrate bias can be generated by RF power supply and matching network. The RF frequency can be in the range of 500 kHz and 27 MHz. The RF bias can be continuous or pulsed. In embodiment during the deposition the substrate can have a floating potential. The high power pulse power supply 1200 generates a train of negative unipolar voltage pulses with frequency and amplitude that provide a resonance mode in the tunable PFN 1240. In this case, tunable PFN 1240 generates the high voltage asymmetrical AC waveform and, therefore, generates HEDP discharge. The negative AC voltage can be in the range of −1000 to −10000 V. The duration of the pulse high voltage asymmetrical AC waveforms can be in the range of 1 to 20 msec. The substrate temperature during the sputtering process can be in the range of −100 C and +200 C. The hardness of the diamond like coating formed on the substrate can be in the range of 5 to 70 GPa. The concentration of sp3 bonds in the carbon film can be in the range of 10-80%. In some embodiments, the feed gas is a noble gas such as Ar, Ne, and Kr. In some embodiments, the feed gas is a mixture of a noble gas and hydrogen. In some embodiments, the feed gas is a mixture of a noble gas and a gas that contains carbon atoms. In some embodiments, the feed gas is a mixture of a noble gas and oxygen in order to sputter oxygenated carbon films $CO_x$ for non-volatile memory devices or any other devices. The oxygen gas flow can be in the range of 1-100 sccm. The discharge current density during the sputtering process can be 0.2-20 A/cm². In some embodiments, the amorphous carbon films are sputtered for non-volatile memory semiconductor based devices or for any other semiconductor based devices.

In some embodiments, the hollow cathode target material is aluminum. The feed gas can also be a mixture of argon and oxygen, or argon and nitrogen. The feed gases pass through a gas activation source. In some embodiments, feed gasses pass directly to the vacuum chamber. PFN 1240 generates the asymmetrical high voltage AC waveform to provide HEDP magnetron discharge to sputter hard α-$Al_2O_3$ coating on the substrate. The substrate temperature during the sputtering process is in the range of 350 to 800 C.

HEDP magnetron discharge can be used for sputter etching the substrate with ions from sputtering target material atoms and gas atoms. A method of sputter etch processing with argon ions and sputtered target material ions uses high negative substrate bias voltage in the range of −900 to −1200 V. The gas pressure can be in the range of 1 to 50 mTorr. The pulse power supply generates a train of negative unipolar voltage pulses with frequency and amplitude that provide resonance mode in the tunable PFN 1240. In this case, the PFN 1240 generates the high voltage asymmetrical AC waveform that provides HEDP discharge. For example, a sputter etch process can be used to sharpen or form an edge on a substrate for cutting applications, such as surgical tools, knives, or razor blade for hair removal applications, or for cleaning a substrate by removing impurities to enhance adhesion. HEDP magnetron discharge also can be used for ion implantation of ions from sputtered target material atoms into a substrate. For ion implantation, the negative bias voltage on the substrate can be in the range −900-15000 V. An ion implantation example includes the doping of a silicon based device or ion implantation to enhance thin film adhesion to the substrate where the layer is forming.

In some embodiments, the electrically enhanced HEDP magnetron sputtering source can be used for chemically enhanced I-PVD deposition (CE-IPVD) of metal containing or non-metal films. For example, in order to sputter carbon films with different concentrations of sp3 bonds in the film, the cathode target may be made from carbon material. The feed gas can be a noble gas and carbon atoms containing gas, such as $C_2H_2$, $CH_4$, or any other gases. The feed gas can also contain $H_2$. Carbon films on the substrate are formed by carbon atoms from the feed gas and from carbon atoms from the cathode target. The carbon films on the substrate are formed by carbon atoms from the feed gas.

The carbon films sputtered with the electrically enhanced HEDP magnetron sputtering source with noble gas, such as Argon, Neon, and the like, or reactive gas, such as Hydrogen, Nitrogen, Oxygen, and the like can be used for hard mask applications in etch processes, such as 3D NAND; for protectively coating parts, such as bearings, camshafts, gears, fuel injectors, cutting tools, carbide inserts, drill bits, broaches, reamers, razor blades for surgical applications and hair removal, hard drives, solar panels, optical filters, flat panel displays, thin film batteries, batteries for storage, hydrogen fuel cell, cutleries, jewelry, wrist watch cases and parts, coating metal on plastic parts such as lamps, air vents in cars, aerospace applications, such as turbine blades and jet engine parts, jewelry, plumbing parts, pipes, and tubes; medical implants, such as stents, joints, and the like.

The carbon films sputtered with the electrically enhanced HEDP magnetron sputtering source can be used to sputter thin ta-C and $CO_x$ films for carbon based resistive memory devices.

In some embodiments, the HEDP magnetron discharge with a carbon target is used to grow carbon nanotubes. In some embodiments, these nanotubes are used to build memory devices.

Figure 15A:
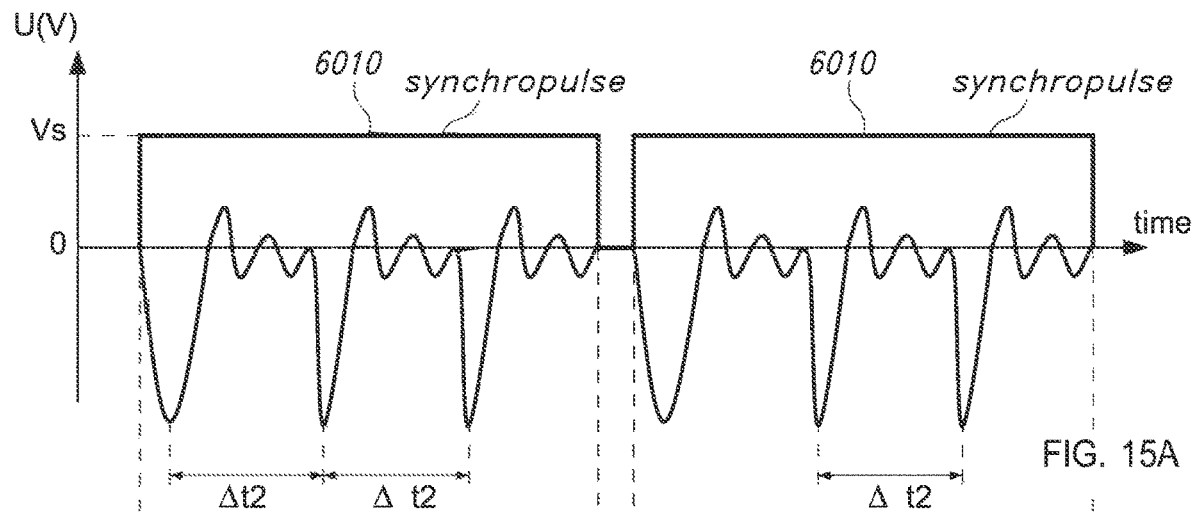
FIG. 15 (a) shows a train of resonance asymmetrical AC voltage waveforms.
Figure 15B:
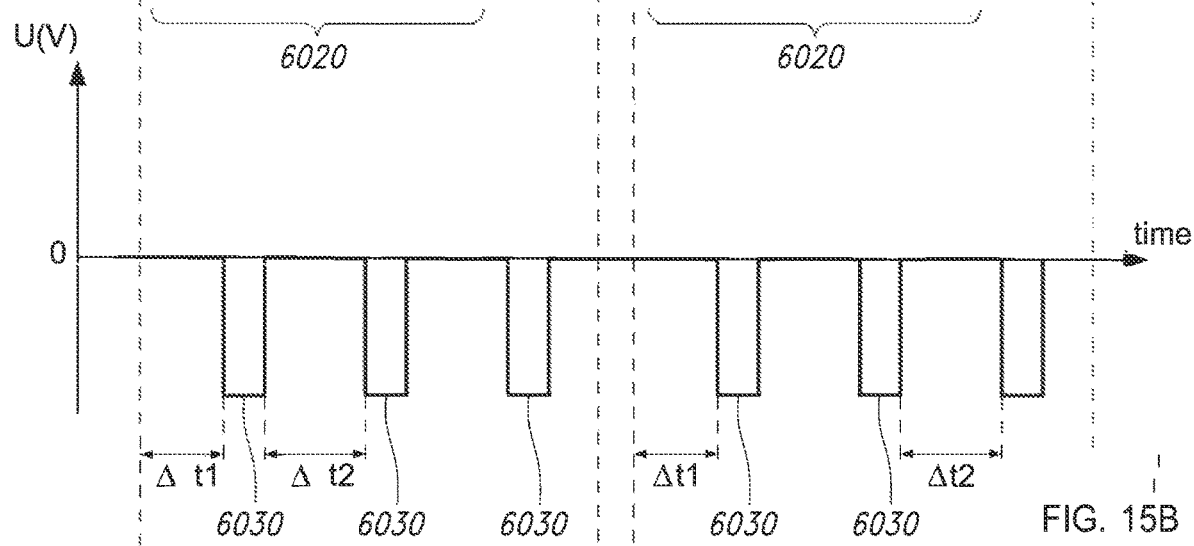
Figure 15C:
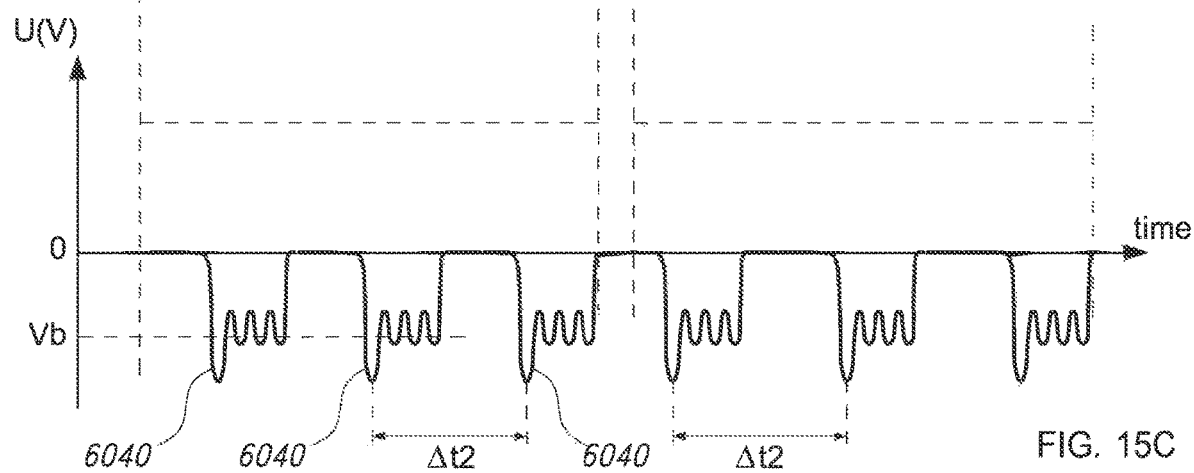
Figure 16A:
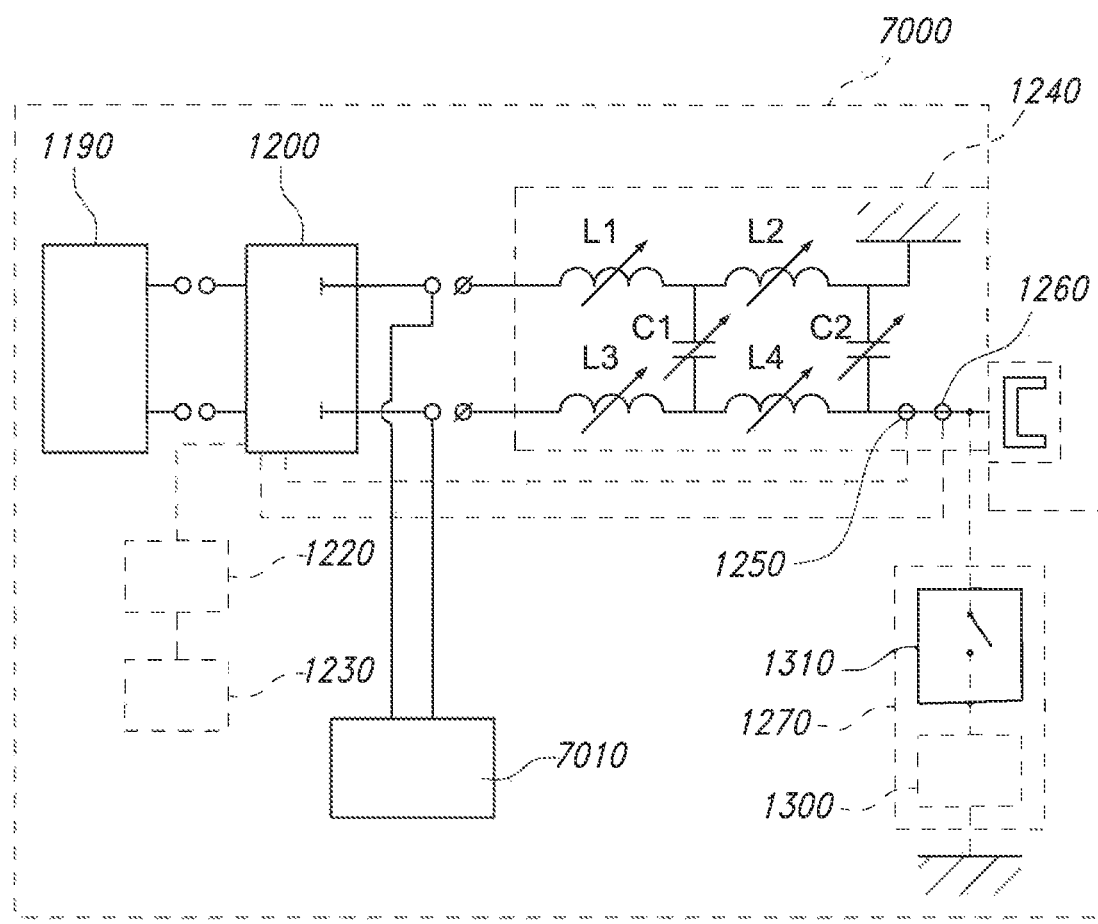
FIG. 16 (a) shows an illustrative circuit diagram of a high-power resonance pulse forming network (PFN) with an additional high-frequency power supply.
Figure 16C:
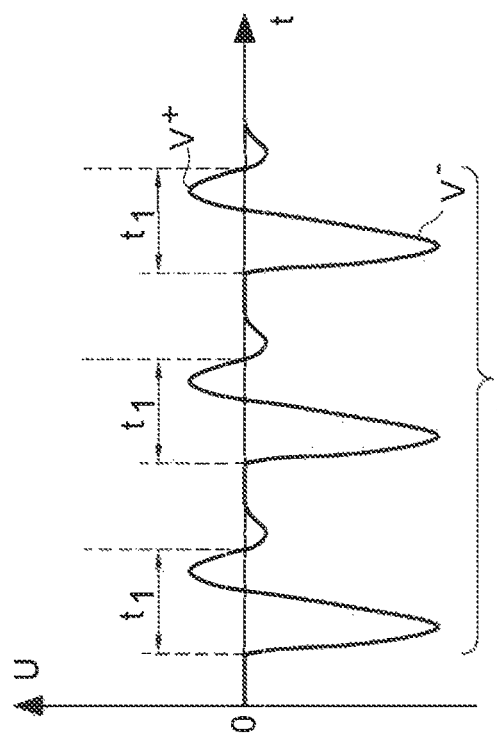
Figure 16D:
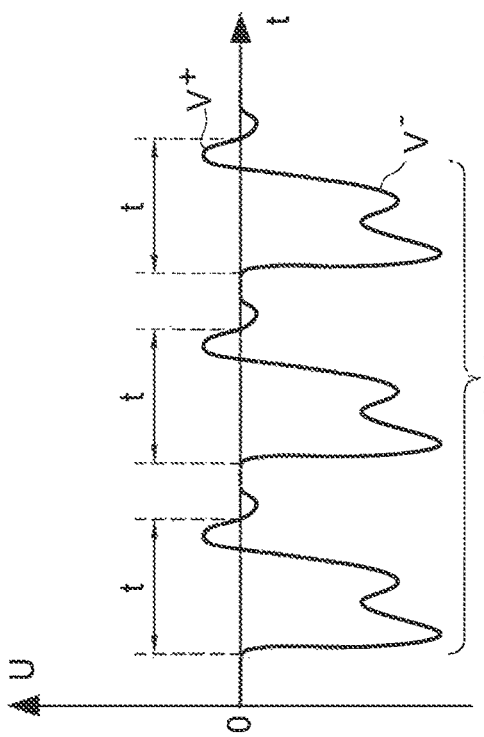
Figure 16B:
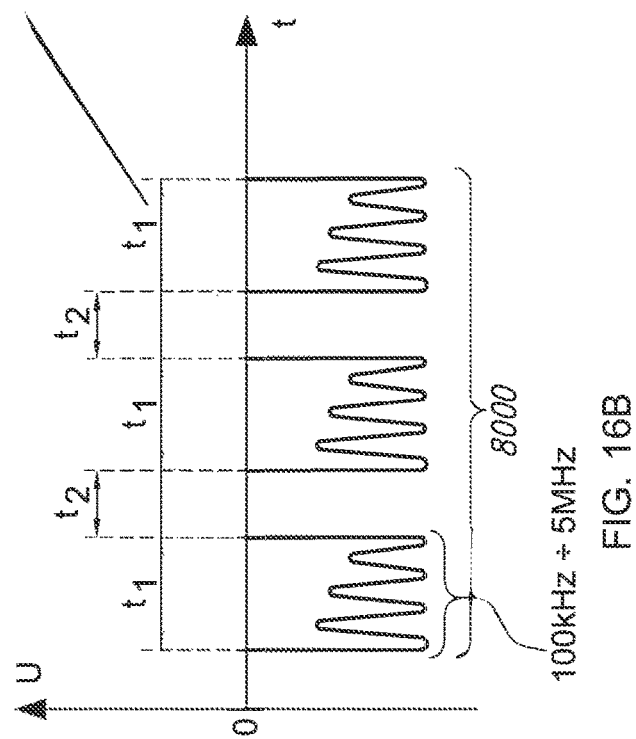

During the HEDP sputtering process, when the high power pulse asymmetric AC waveform is applied to the magnetically enhanced sputtering source, a pulse bias voltage can be applied to the substrate to control ion bombardment of the growing film. The amplitude of the negative voltage can be in the range of −10 V and −200 V. Trains of asymmetrical AC voltage waveforms 6020 are shown in FIG. 15 (*a*). Trains of negative voltage pulses 6030 applied to the substrate are shown in FIG. 15 (*b*). In order to control time t1 when bias voltage pulse is applied to the substrate, the high power pulse resonance AC power supply and bias power supply are synchronized. In this case, the controller from the high power pulse resonance AC power supply sends synchronization pulses that correspond to the trains of asymmetrical AC voltage waveforms to the controller from the bias power supply. The bias power supply controller can set time Δt1 in the range of 0-1000 μs.

In some embodiments, the bias power supply includes an RF power supply. FIG. 15 (*c*) shows a train of RF pulses 6040 generated by the RF bias power supply.

The method of generating resonance AC voltage waveforms for the magnetically enhanced sputtering source can also be used to generate resonance AC waveforms for the cathodic arc sources that have widespread applications in the coating industry. Resonance AC waveforms, when connected with a magnetically enhanced sputtering source, generate volume discharge. Resonance AC voltage waveforms, when connected with an arc source, generate point arc discharge. DC power supplies generate and sustain continuous arc discharge on an arc evaporation source with a carbon target. The arc current can be in the range of 40-100 A. The arc discharge voltage can be in the range of 20-120 V. A regulated voltage with a variable power source feeds the high power pulse programmable power supply. Specifically, the high power pulse asymmetric AC waveform is generated by having the regulated voltage source with variable power feeding a regulated voltage to the high power pulse supply with programmable pulse voltage duration and pulse voltage frequency producing at its output a train of regulated amplitude unipolar negative voltage pulses with programmed pulse frequency and duration, and supplying these pulses to a tunable pulse forming network (PFN) including a plurality of specialized inductors and capacitors designed for pulse applications connected in a specific configuration coupled to an arc evaporation source. The resonance occurs in the PFN and in the already existing arc discharge generated by the DC power supply. By adjusting the pulse voltage amplitude, duration, and frequency of the unipolar negative voltage pulses and tuning the values of the inductors and capacitors in the PFN coupled to an arc evaporation source, a resonance pulsed asymmetric AC arc discharge can be achieved.

Another method of producing a resonance pulsed asymmetric AC arc discharge is to have fixed unipolar pulse power supply parameters (amplitude, frequency, and duration) feeding a pulsed forming network, in which the numerical values of the inductors and capacitors, as well as their configurations are tuned to achieve the desired resonance values on the arc evaporation source to form a layer on the substrate. The tuning of the PFN can be performed manually with test equipment, such as an oscilloscope, voltmeter, and current meter or other analytical equipment; or electronically with a built-in software algorithm, variable inductors, variable capacitors, and data acquisition circuitry. The negative voltage from the pulse asymmetric AC waveform generates high density plasma from the evaporated target material atoms between the cathode target and the anode of the arc evaporation source. The positive voltage from the pulse asymmetrical AC waveform attracts plasma electrons to the cathode area and generates positive plasma potential. The positive plasma potential accelerates evaporated target material ions from the cathode target area towards the substrate that improve deposition rate and ion bombardment on the substrate. The reverse electron current can be up to 50% from the discharge current during the negative voltage. In some embodiments, the arc evaporation source may have one of a rotatable magnetic field, movable magnetic field, or stationary magnetic field. The tunable PFN includes a plurality of capacitors and inductors. The resonance mode associated with the tunable PFN is a function of the input unipolar voltage pulse amplitude, duration, and frequency generated by the high power pulse power supply; inductance, resistance, and capacitance of the arc evaporation source, or any other magnetically enhanced arc evaporation source; the inductance, capacitance, and resistance of the cables between the tunable PFN and arc evaporation source; and a plasma impedance of the arc evaporation source itself as well as the evaporated material. In the resonance mode, the output negative voltage amplitude of the high power pulse voltage mode asymmetrical AC waveform on the arc evaporation source exceeds the negative voltage amplitude of the input unipolar voltage pulses into the tunable PFN by 1.1-5 times. The unipolar negative high power voltage output can be in the range of 400V-5000V. In the resonance mode, the absolute value of the negative voltage amplitude of the asymmetrical AC waveform can be in the range of 750-5000 V. In the resonance mode, the output positive voltage amplitude of the asymmetrical AC waveform can be in the range of 100-2500 V.

In the resonance mode, the negative voltage amplitude of the output AC waveform can reach a maximum absolute value at which point a further increase of the input voltage to the tunable PFN will not result in a voltage amplitude increase, but rather an increase in duration of the negative pulse in the asymmetric AC waveform. In some embodiments, the frequency of the unipolar voltage pulses is in the range of 1 kHz and 10 kHz. In some embodiments, the duration of the unipolar voltage pulses is in the range of 3-20 μs. Asymmetrical AC voltage waveforms significantly influence the size on of the cathode arc spot and velocity. In some embodiments, generation of the resonance AC voltage waveforms reduce the formation of macro particles from evaporated cathode target material.

In an embodiment, a high power pulse resonance AC power supply 7000, as compared with the high power pulse resonance AC power supply 1020 shown in FIG. 10 (*g*), includes a high frequency high power pulsed power supply 7010 with a programmable voltage pulse frequency and amplitude as shown in FIG. 16 (*a*). The high frequency high power pulsed power supply 7010 generates pulse negative, unipolar oscillatory voltage waveforms with a frequency in the range of 100 KHz to 5 MHz and a duration t1 in a range of 5 µs to 20 µs. The absolute value of the voltage of these waveforms is in a range of 500 V to 5000 V. The frequency of these pulses with negative unipolar voltage waveforms is in a range of 5 Hz to 200 KHz.

Pulse negative unipolar oscillatory voltage waveforms 8000 are shown in FIG. 16 (*b*). The tunable PFN 1240, which is in resonance mode for these pulses, generates a high power resonance asymmetrical AC waveform. The resonance mode can be achieved by adjusting the values of inductors L1, L2, L3, and L4 and by adjusting the values of capacitors C1 and C2 for a particular shape of the pulse negative unipolar oscillatory voltage waveforms, their frequency, type of process gas, target material, and magnetic field strength of the hollow cathode sputtering source 7020. The resonance mode is defined by conditions when the adjustment of the frequency and amplitude of the plurality of negative unipolar oscillatory voltage waveforms 800 generate the plurality of asymmetrical AC voltage waveforms 8010, 8020 with positive V+ and negative V− voltages shown in FIGS. 16 (*b*, *c*). Further increase of the oscillatory voltage waveform amplitude causes an increase in the value of the positive portion of the AC voltage waveform. By adjusting time t1, time t2, or both time t1 and time t2, double negative peak asymmetrical AC voltage waveforms 8020 can be achieved as shown in FIG. 16 (*d*).

Figure 17A:
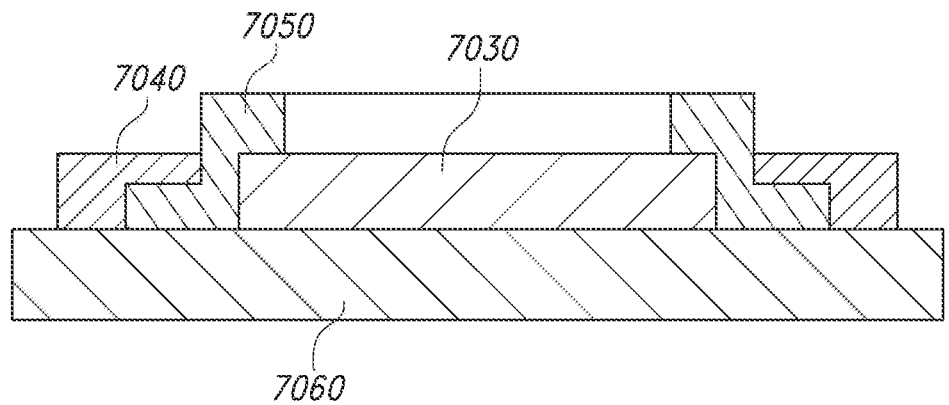
FIGS. 17 (a, b) show a hollow cathode target combined from two pieces.
Figure 17B:
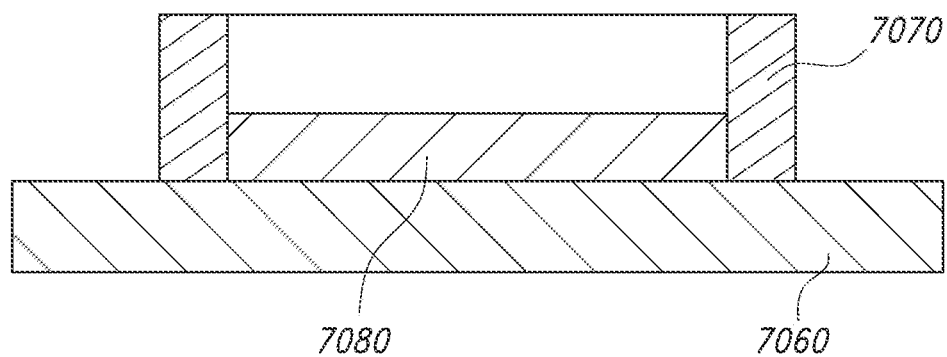

In an embodiment, a magnetically and electrically enhanced HEDP sputtering source 1000 shown in FIG. 10 (*g*) has a hollow cathode target 1030 that includes two parts as shown in FIG. 17 (*a*) and FIG. 17 (*b*). FIG. 17 (*a*) shows the hollow cathode target 1030 that includes pieces 7030 and 7050. These two pieces are attached to a copper baking plate by a clamp 7040. FIG. 17 (*b*) shows the hollow cathode target that include pieces 7070 and 7080. These two pieces are bonded to the copper baking plate 7060.

Figure 18A:
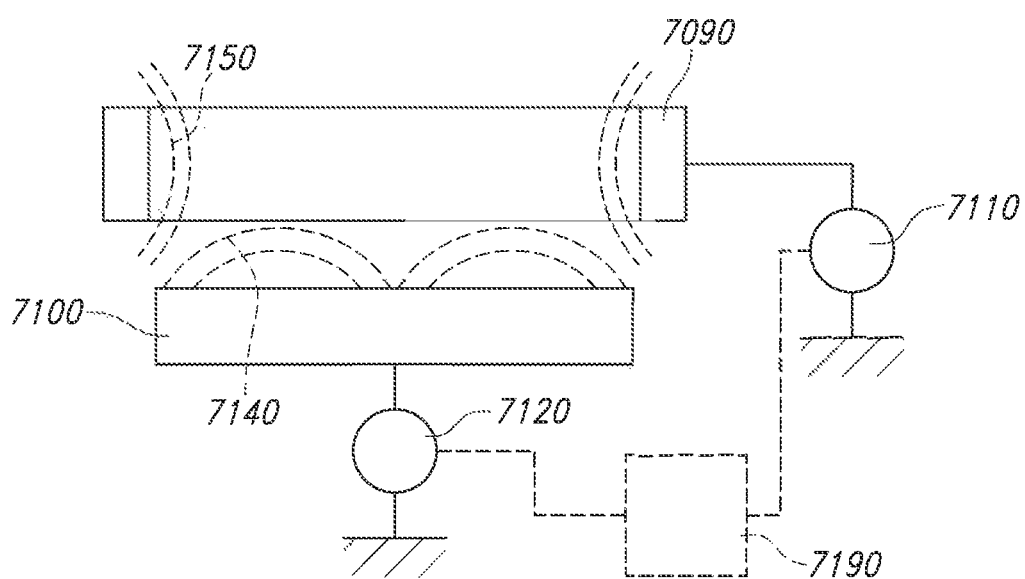
FIG. 18 (a) shows a hollow cathode target combined from two pieces and connected with two different power supplies.
Figure 18B:
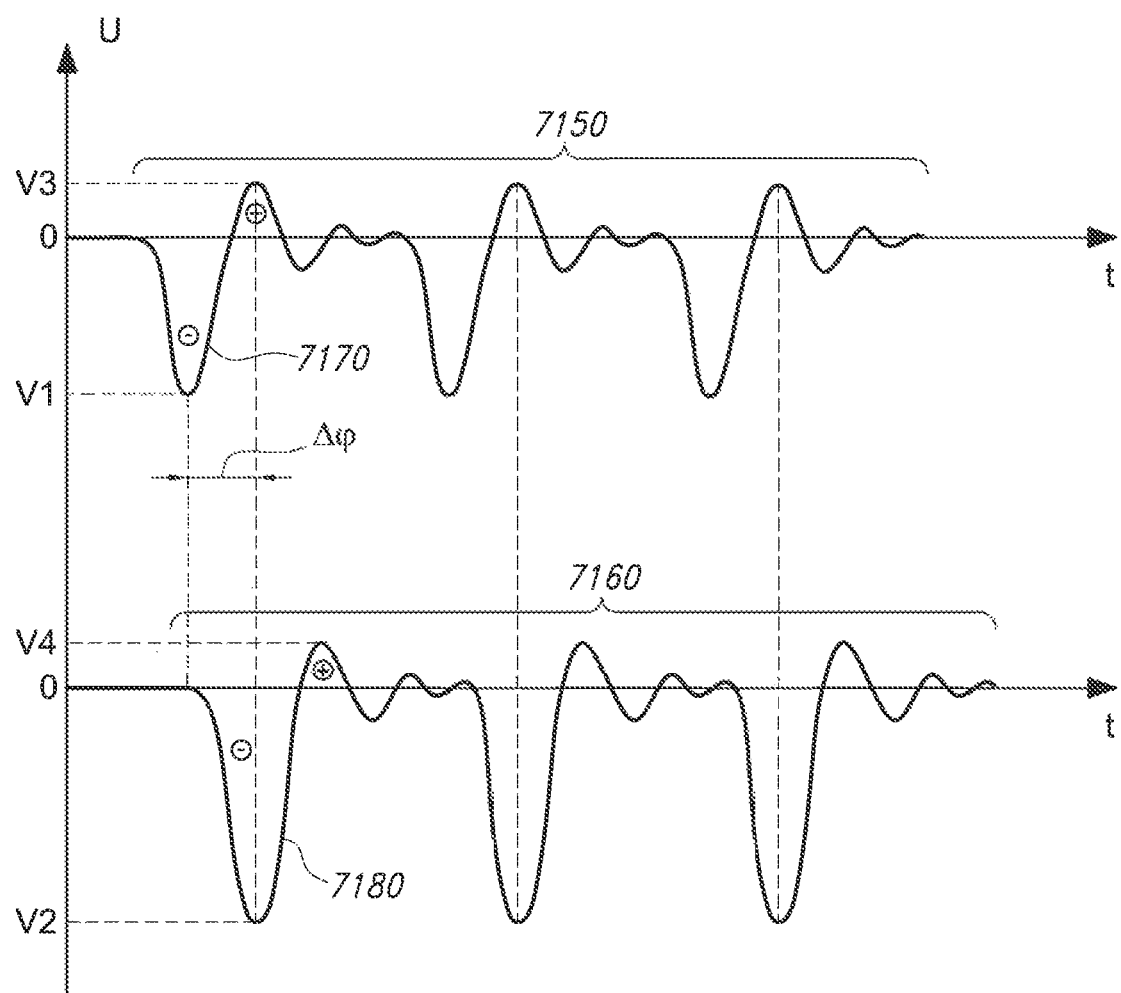

In an embodiment, the hollow cathode target 1030 includes two pieces 7100 and 7090 as shown in FIG. 18 (*a*). The piece 7090 has magnetic field lines 7150 and the piece 7100 has magnetic field lines 7140. Each of these pieces is connected to different high power pulse resonance AC power supplies 7110 and 7120. The block diagram of these high power pulse resonance AC power supplies is shown in FIG. 16 (*a*). The high power pulse resonance AC power supplies 7110 and 7120 generate AC voltage waveforms 7150 and 7160 shown in FIGS. 18 (*a*) and 18 (*b*). A time shift between negative voltage peaks 7170 and 7180 is controlled through controller 7190. In an embodiment, the power supply 7110 sends a synchro pulse to power supply 7120 to initiate the start of power supply 7120. In an embodiment, the power supply 7120 sends a synchro pulse to power supply 7110 to initiate the start of power supply 7110. The time shift influences electron energy and, therefore, a degree of ionization of sputtered material atoms. In an embodiment, the time shift is in a range of 10 to 1000 microseconds.

In an embodiment, a magnetically enhanced HEDP sputtering source that is shown in FIG. 10 (*g*) includes an additional magnetic assembly positioned adjacent to the side walls 1040 as shown in FIG. 10 (*h*). The magnetic assembly may have permanent magnets or electromagnets or a combination of permanent magnets and electromagnetics.

Figure 19:
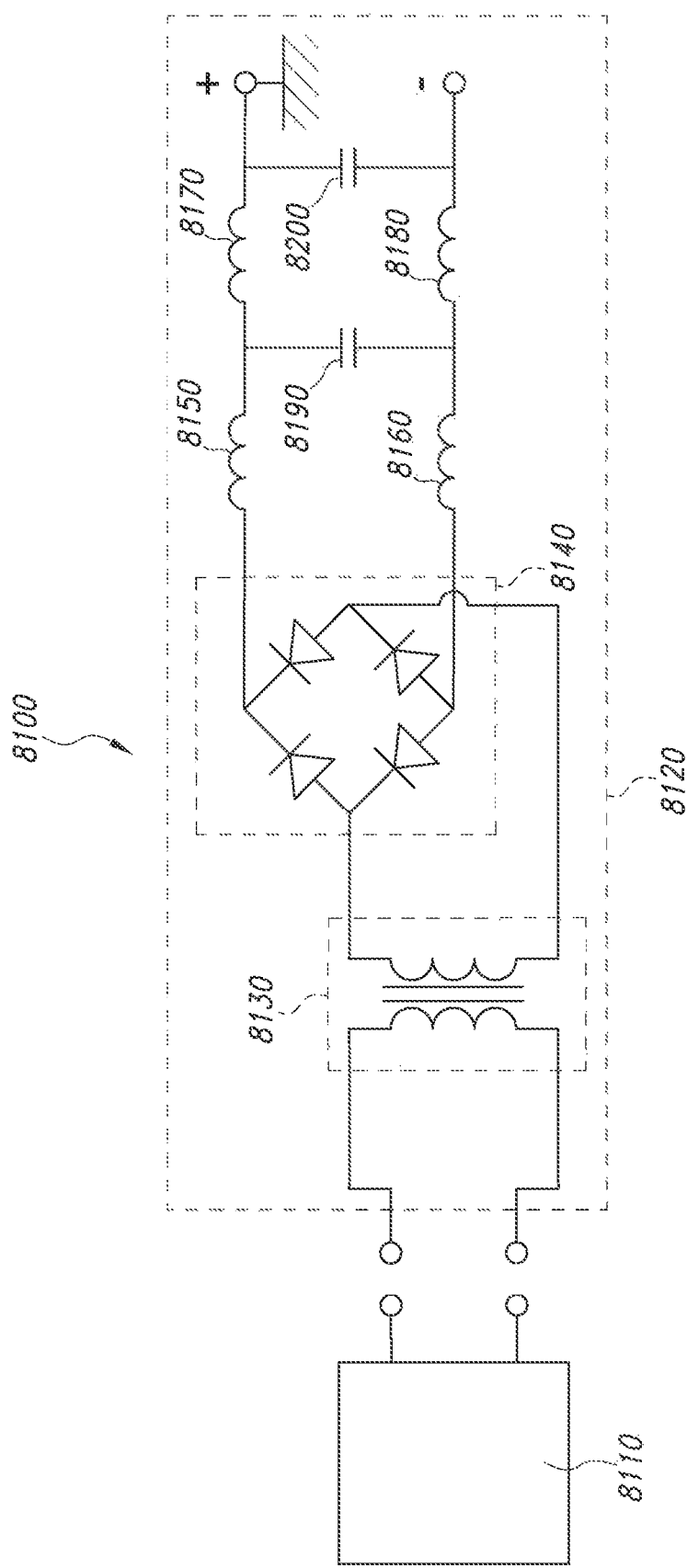
FIG. 19 shows an illustrative circuit diagram of the high-power resonance pulse forming network (PFN) that includes a transformer and diodes.
Figure 20A:
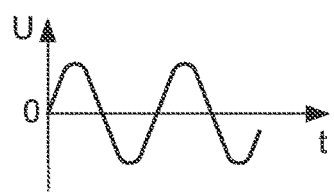
FIGS. 20 (a)-(g) show different AC voltage waveforms.
Figure 20B:
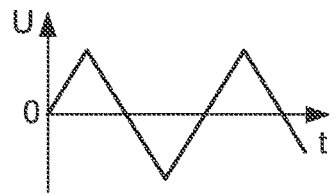
Figure 20C:
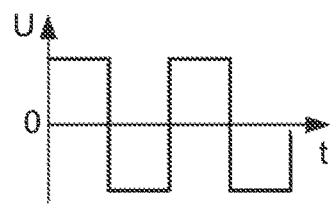
Figure 20D:
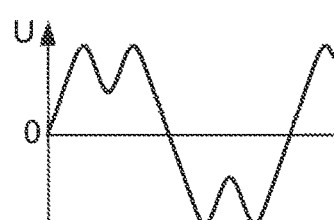
Figure 20E:
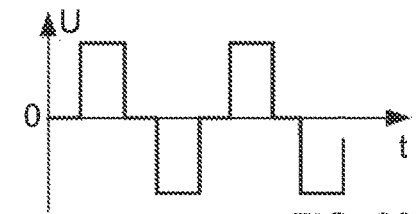
Figure 20F:
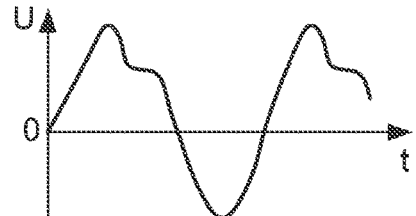
Figure 20G:
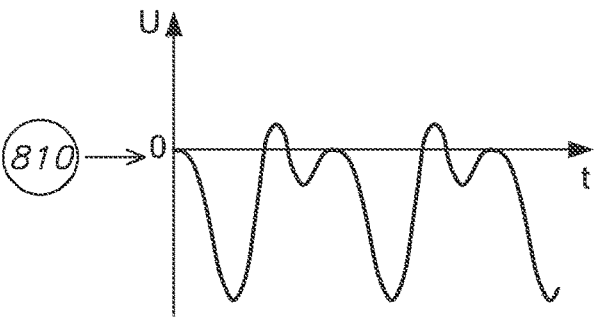
Figure 21:
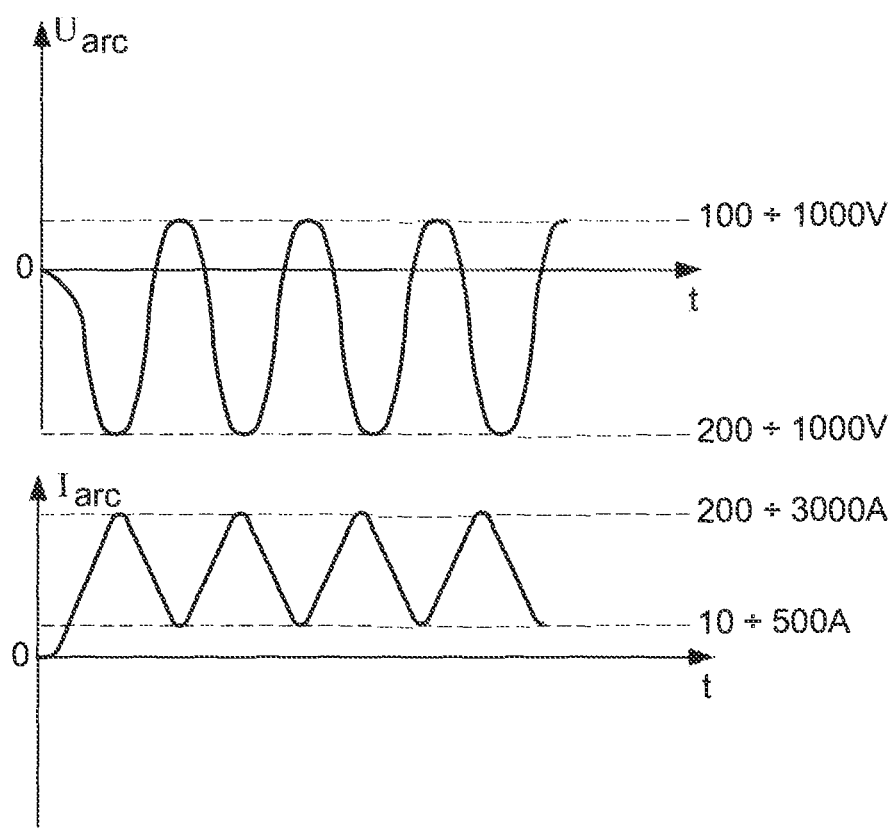
FIG. 21 shows arc resonance AC discharge current and arc resonance AC discharge voltage waveforms.

In an embodiment, a high power pulse resonance AC power supply 8100 includes an AC power supply 8110 and PFN 8120 as shown in FIG. 19. High power AC power supply 8110 can generate different AC voltage waveforms at the output as shown in FIGS. 20 (a, b, c, d, e, f). The frequency of these voltage waveforms can be in the range of 3 KHz to 100 KHz. The peak voltage amplitude can be in the range of 100 V to 1000 V. The PFN includes a step-up transformer 8130, a diode bridge 8140, a plurality of inductors 8150, 8160, 8170, 8180, and a plurality of capacitors 8190 and 8200. This PFN converts AC voltage waveforms to an asymmetrical complex AC voltage waveform during the resonance mode as shown in FIG. 19. AC voltage waveforms and frequencies that correspond to this particular AC voltage waveform are associated with specific values of inductors 8150, 8160, 8170, 8180 and capacitors 8190, 8200 in order to generate the resonance mode and form, at the output, the asymmetrical AC voltage waveform. In an embodiment, the PFN does not have a diode bridge.

In an embodiment, the high power pulse resonance AC power supply can be connected to the HEDP magnetron sputtering source and RF power supply. The frequency of the RF power supply can be in the range of 500 KHz to 30 MHz. The RF power supply can operate in continuous mode or pulsed mode. In an embodiment, the RF power supply turns on before on the high power pulse resonance AC power supply turns on in order to provide stable plasma ignition for plasma that will be generated with the high power pulse resonance AC power supply. The RF power supply can be turned off after the high density plasma is generated. In an embodiment, the RF power supply operates in continuous mode together with the high power pulse resonance AC power supply. This operation reduces parasitic arcs during the reactive sputtering process. This operation is beneficial for sputtering ceramic target materials and target materials with low electrical conductivity such as those containing B, Si, and the like.

Figure 22A:
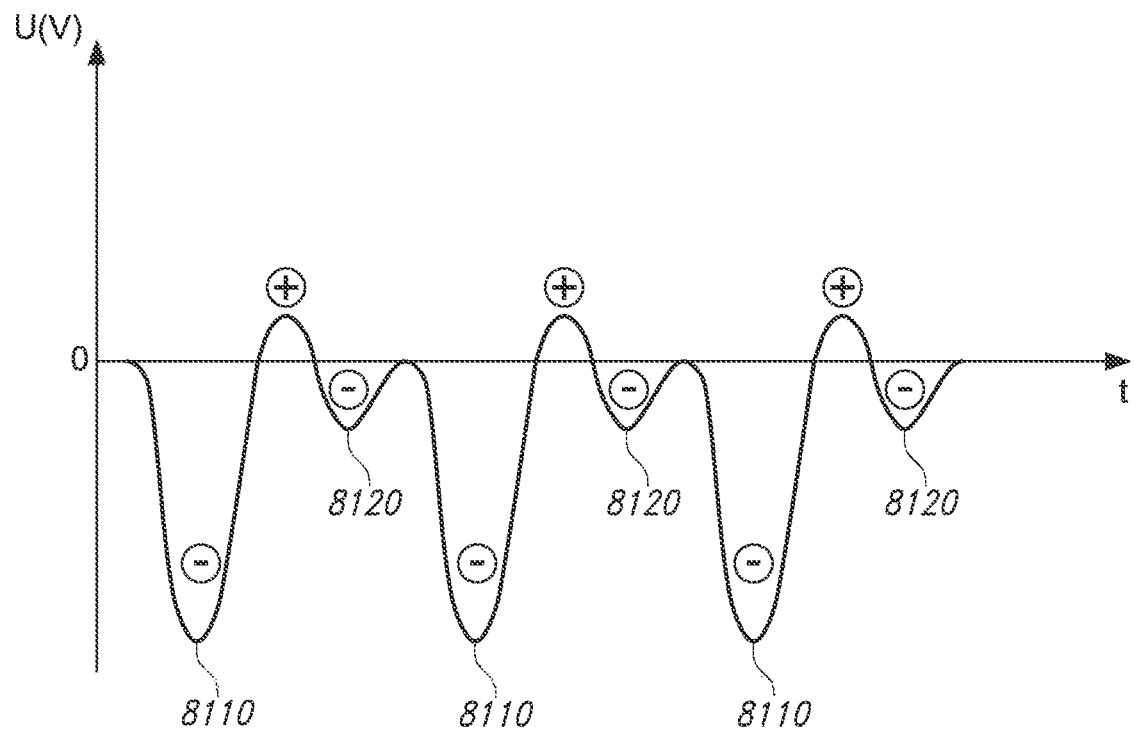
FIGS. 22 (a, b) show output voltage waveforms from the high-power resonance pulse forming network (PFN) when connected to the HEDP magnetron and generating HEDP discharge.
Figure 22B:
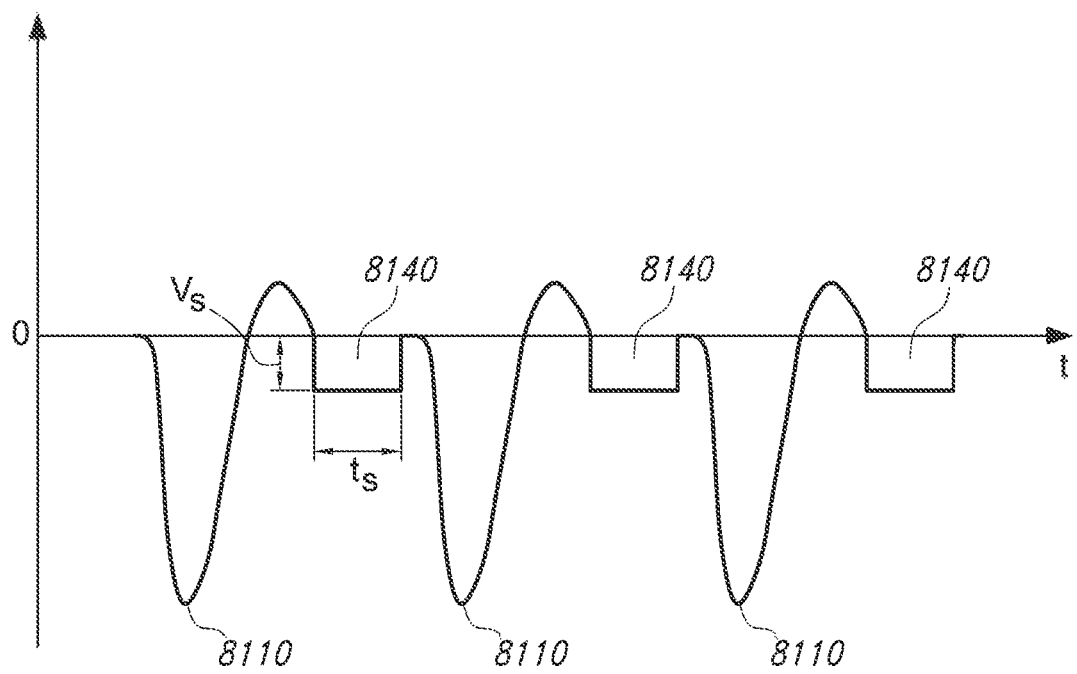

The output voltage waveforms from the high power pulse resonance AC power supply are shown in FIG. 22 (*a*, *b*). The second negative peak 8120 can be generated by controlling parameters of the PFN, such as inductors, capacitors and the transformer (if applicable) as shown in FIG. 22 (*a*). The peak 8120 has a significant influence on the probability of generating arcs during reactive sputtering. The plasma that is generated during this peak helps to ignite high density plasma during the first negative peak 8110. The second peak 8120 may be triangular, sinusoidal or rectangular in shape. The rectangular shape of the second negative peak 8140 is shown in FIG. 22 (*b*). The value and duration of the peak 8120 helps to control the energy of ions coming to the substrate. The duration $t_s$ can be in the range of 2 µs to 50 µs. The amplitude $V_s$ can be in the range of 200 V to 1000 V. The greater the amplitude and/or duration of the second peak is, the less the ion energy will be. This arrangement is of particular importance for sputtering ta-C films when high ion energy can affect film structure.

Figure 23:
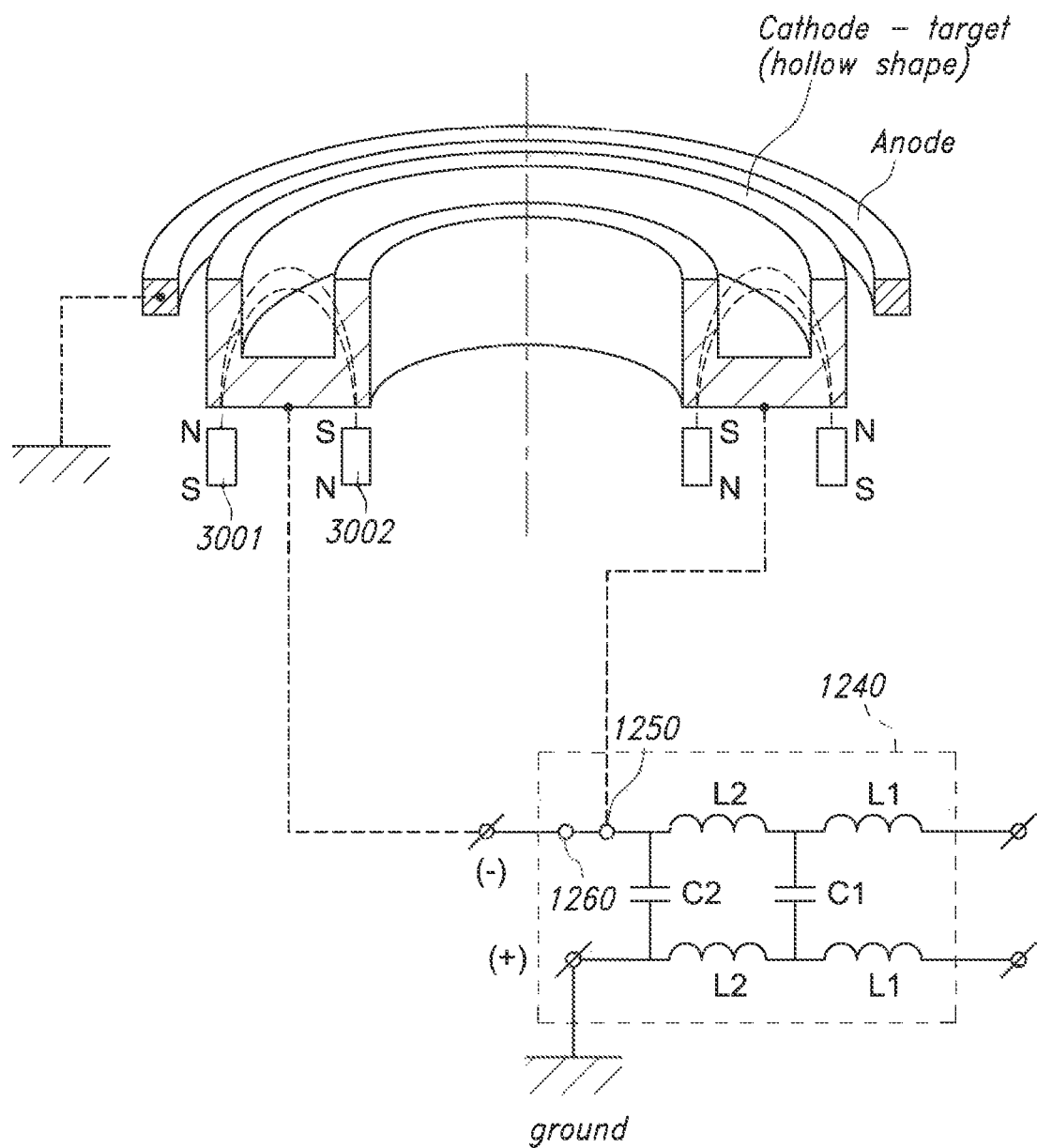
FIG. 23 shows an illustrative view of a hollow cathode HEDP ring magnetron.

In an embodiment, the HEDP sputtering source has a ring-shaped hollow cathode target as shown in FIG. 23. The HEDP sputtering source includes an anode, ring-shaped hollow cathode target, and PFN 1240. The magnets 3001, 3002 generate a magnetic field 3003 inside the ring-shaped hollow cathode target.

Figure 24:
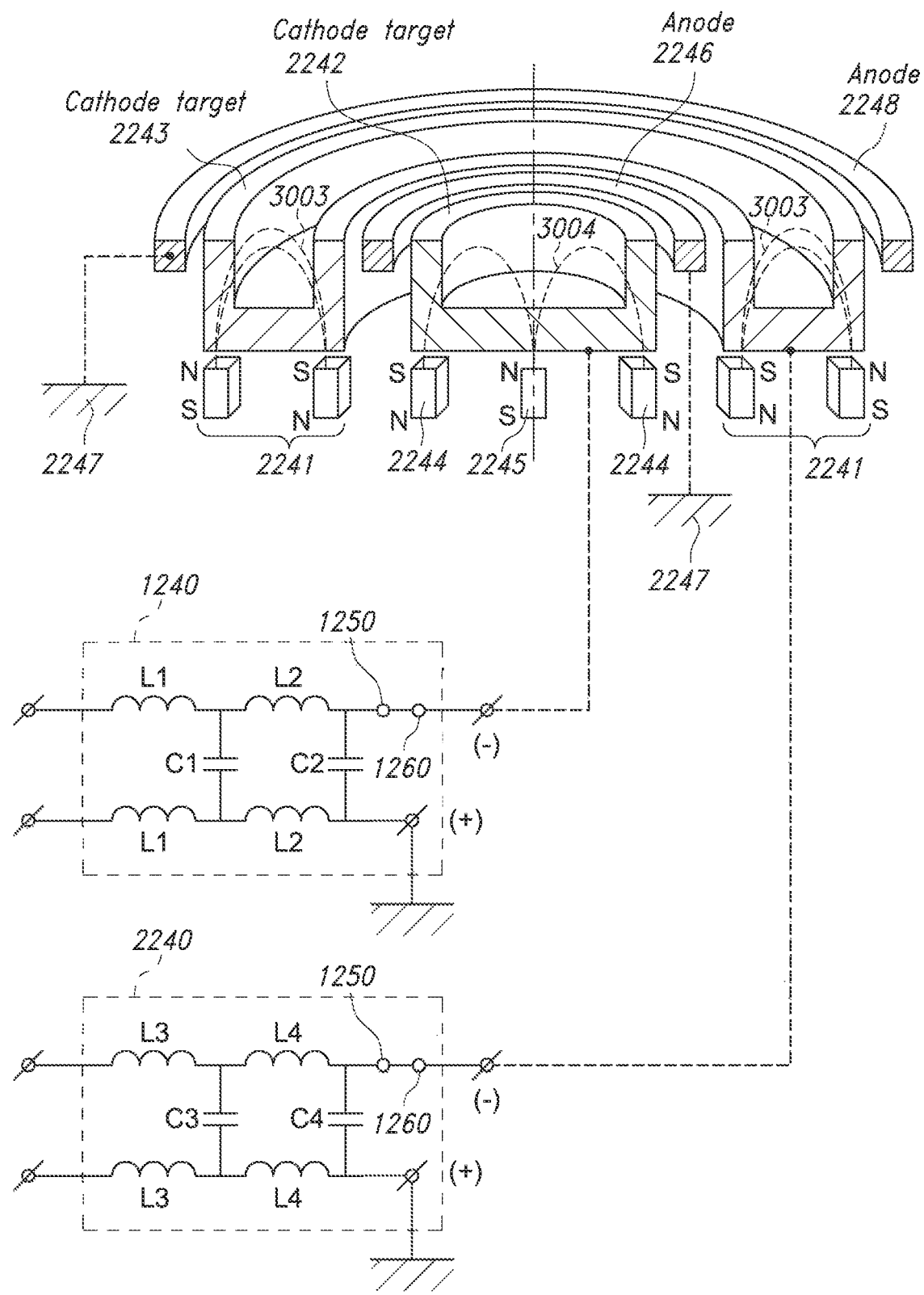
FIG. 24 shows an illustrative view of a segmented hollow cathode HEDP ring magnetron.

FIG. 24 shows a segmented HEDP sputtering source. The segmented HEDP sputtering source includes a ring-shaped hollow cathode target 2243 and a hollow cathode target 2242. A plurality of magnets 2241 generates a magnetic field 3003 inside the ring-shaped hollow cathode target 2243. The ring-shaped hollow cathode target 2243 is connected to the PFN 1240. A plurality of magnets 2244, 2245 generates a magnetic field 3004. A hollow cathode target 2242 is connected to the PFN 2240.

Figure 25A:
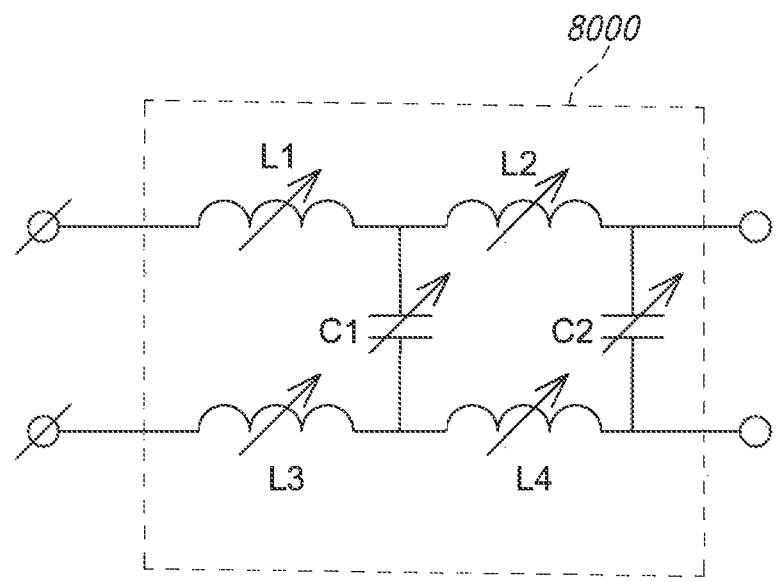
FIG. 25 (a) shows an illustrative view of tunable PFN.
Figure 25B:
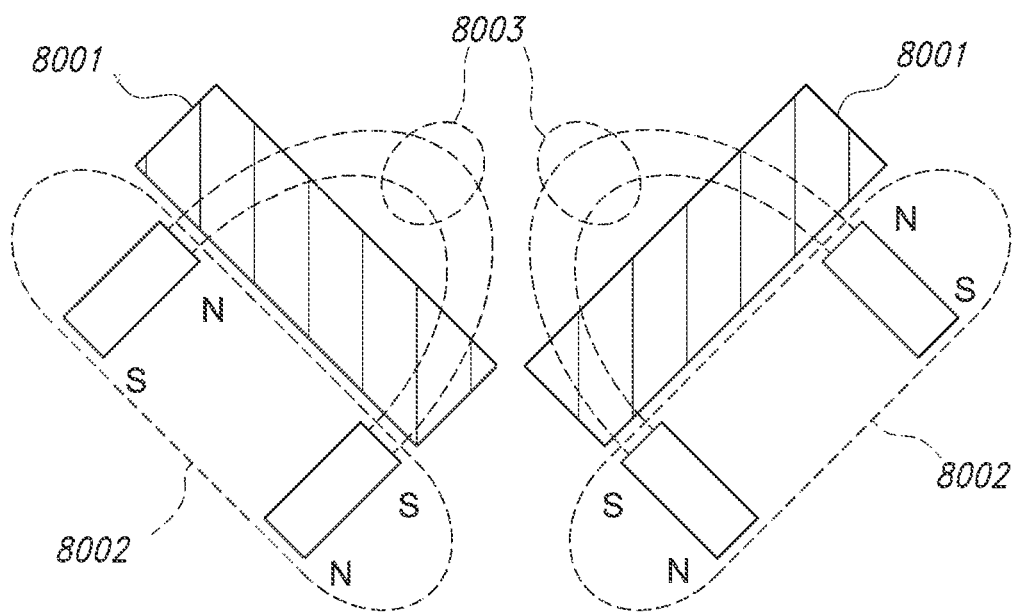

FIG. 25 (*a*) shows a tunable PFN 8000 that can be connected to the V-shaped HEDP magnetron shown in FIG. 25 (*b*). The magnets 8002 generate a magnetic field 8003 near the cathode target 8001.

Figure 26A:
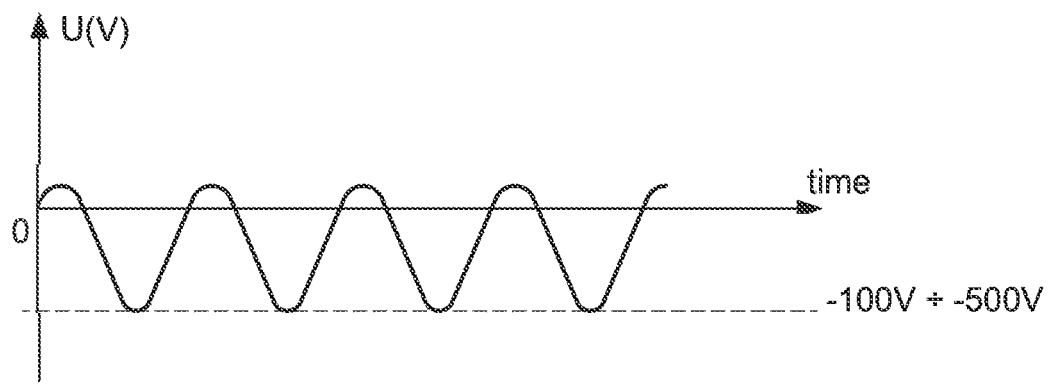
FIGS. 26 (a, b) show an illustrative view of voltage and current waveforms.
Figure 26B:
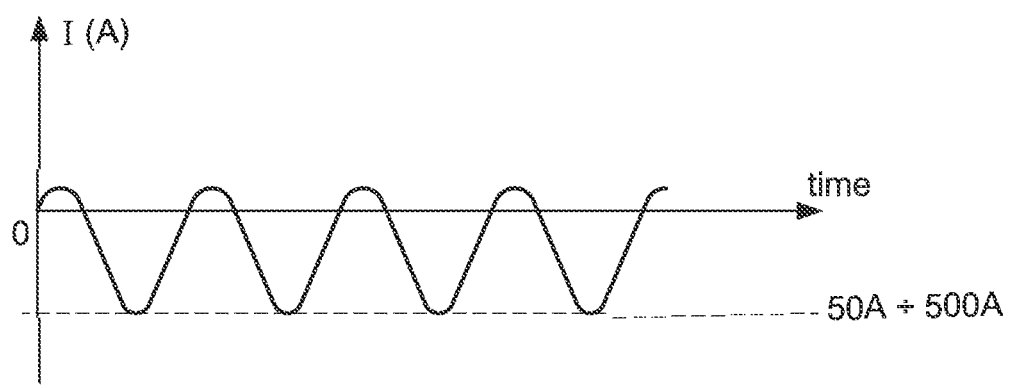

The tunable PFN shown in FIG. 25 (*a*) is turned such that the HEDP magnetron sputtering source operates in ARC mode. The typical output voltage and current waveforms are shown in FIGS. 26 (*a*, *b*).

Figure 27:
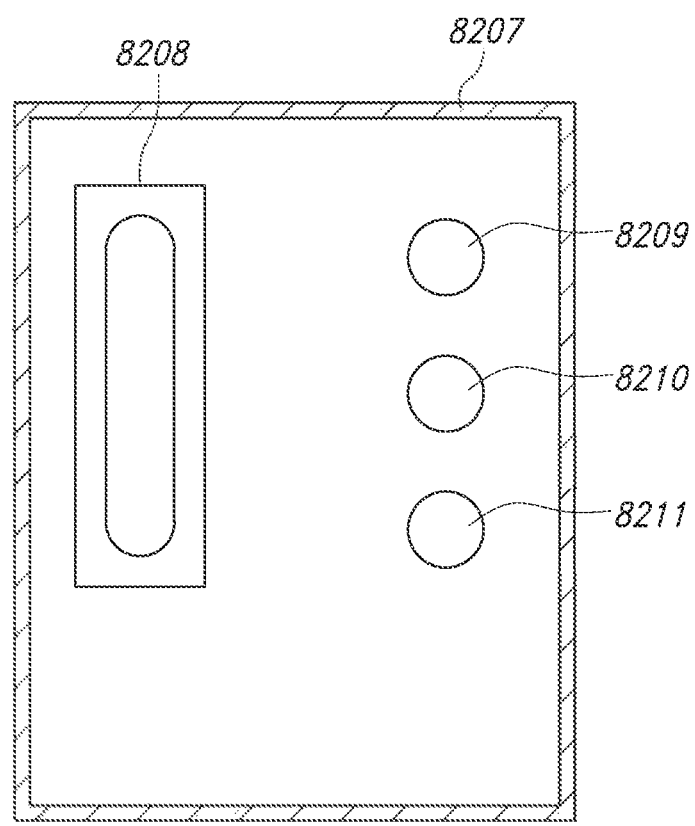
FIG. 27 shows an illustrative view of the vacuum process chamber with a cathodic arc deposition source, a magnetron sputtering source, and a hollow cathode HEDP magnetron source.

In an embodiment, the vacuum process chamber 8207, as shown in FIG. 27, includes a magnetron sputtering source 8208, 8209, cathodic arc deposition source 8210, and HEDP magnetron sputtering source 8211. The HEDP magnetron sputtering source 8211 can operate in sputtering mode or ARC mode.

Figure 28:
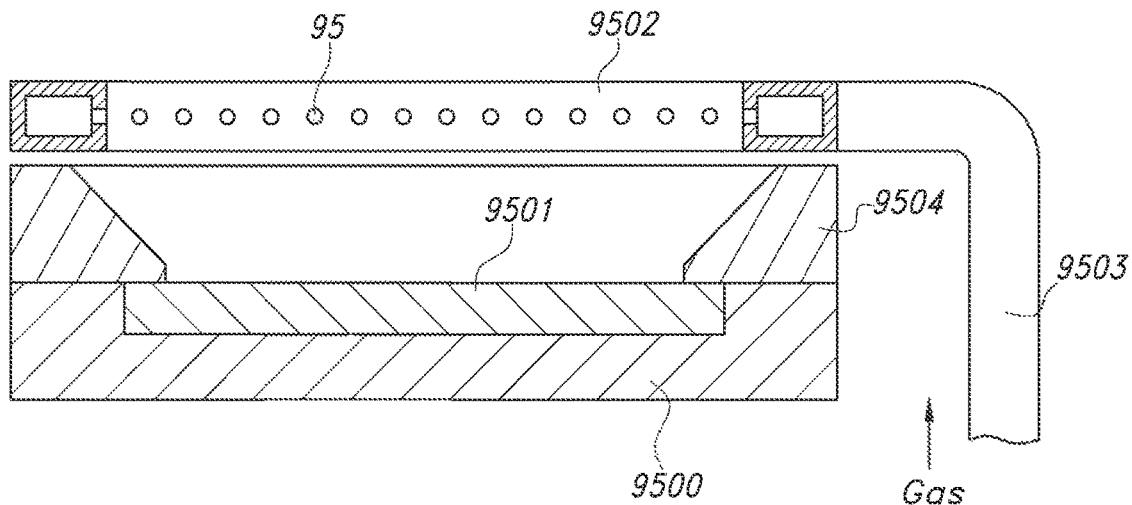
FIG. 28 shows a hollow cathode target combined from two pieces with gas distribution system.

FIG. 28 shows an illustrative view of the hollow cathode target from HEDP magnetron sputtering source. The hollow cathode target includes a ring shaped target 9504 and flat disc 9501. The flat disc is positioned inside a copper water cooled jacket 9500. The gas distribution system 9502 is positioned on top of the ring shape target 9504. The gas distribution system 9502 has a plurality of openings 9510. These openings provide uniform gas distribution. The gas distribution system 9502 is connected to a gas source through tube 9503.

Figure 29:
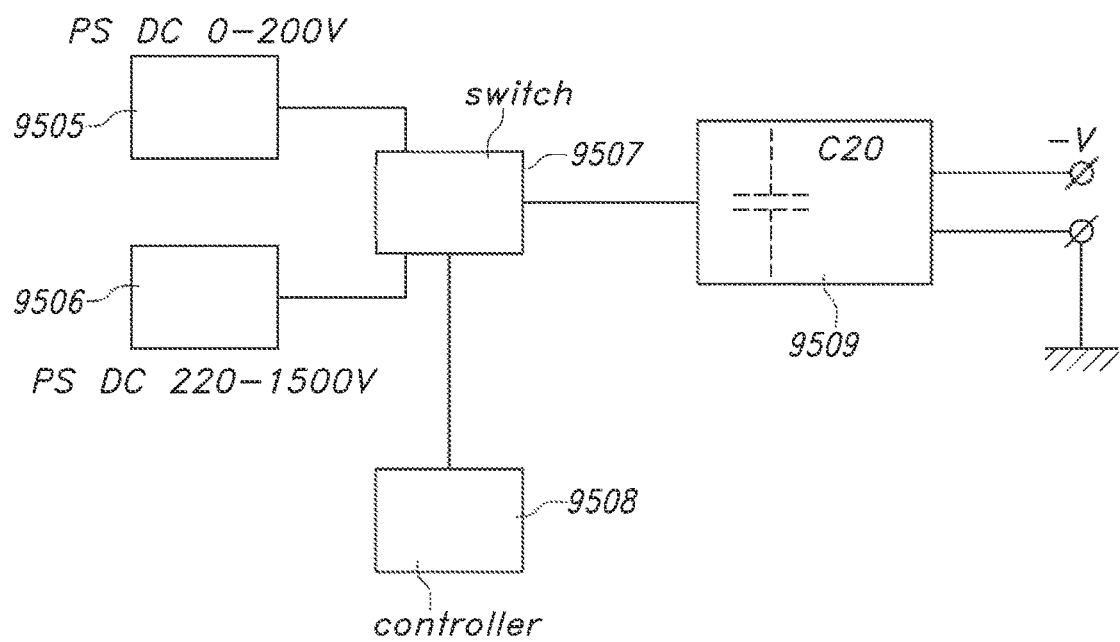
FIG. 29 shows an illustrative circuit diagram of the bias power supply.

FIG. 29 shows an illustrative diagram of a substrate bias power supply. The substrate bias power supply includes two charging units. The low voltage unit 9505 can provide voltage in a range of 0-200 V. The low voltage unit 9505 can provide voltage in a range of 200-1500 V. Depending on process conditions, controller 9508 can send a signal to the switch 9507 that determines the charging units that will charge capacitor bank C20 from the power supply 9509.

In an embodiment, the HEDP magnetron sputtering source 1010 with carbon target 1040 can be used for sputtering hydrogen free DLC (diamond like coatings) films as shown in FIG. 14 (*a*). The programmable duration of the AC pulse bursts can be in the range of 0.5-20 ms. The frequency of the programmable AC pulse bursts can be in the range of 1 Hz-100 Hz. The frequency of the pulsed AC waveform inside the programmable pulse bursts can be programmed in the range of 10 kHz-60 kHz with a single frequency or mixed frequency. The average power during the deposition process can be in the range of 1-5 kW. The target area can be in the range of 50-500 cm$^2$. The Argon gas pressure can be in the range of 1-20 mTorr. The film hardness of the hydrogen free DLC film can be in the range of 20-35 GPa.

In an embodiment, the HEDP magnetron sputtering source 1010 with carbon target 1040 can be used for sputtering hydrogenated DLC (diamond like coatings) films as shown in FIG. 14 (*a*). The programmable duration of the AC pulse bursts can be in the range of 0.5-10 ms. The frequency of the programmable AC pulse bursts can be in the range of 10 Hz-600 Hz. The frequency of the pulsed AC waveform inside the programmable pulse bursts can be programmed in the range of 10 kHz-60 kHz with a single frequency or mixed frequency. The average power during the deposition can be in the range of 1-5 kW. The target area can be in the range of 50-500 cm$^2$. The Argon gas pressure can be in the range of 1-20 mTorr. The carbon containing gas flow can be in the range of 10 SCCM and 200 SCCM. In embodiment the gas was acetylene. The film hardness of the hydrogenated DLC film can be in the range of 15-30 GPa.

In an embodiment, the HEDP magnetron sputtering source 1010 with metal target 1040 can be used for sputtering hydrogenated metal DLC (diamond like coatings) films as shown in FIG. 14 (*a*). The target material can be W, Ti, Cr, Si, Ta, or any other metal. The programmable duration of the AC pulse bursts can be in the range of 0.5-10 ms. The frequency of the programmable AC pulse bursts can be in the range of 100 Hz-800 Hz. The frequency of the pulsed AC waveform inside the programmable pulse bursts can be programmed in the range of 10 kHz-60 kHz with a single frequency or mixed frequency. The Argon gas pressure can be in the range of 1-20 mTorr. The average power during the deposition can be in the range of 1-5 kW. The target area can be in the range of 50-500 cm$^2$. The carbon containing gas flow can be in the range of 10 SCCM and 200 SCCM. In an embodiment, the gas can be acetylene. The film hardness of the hydrogenated DLC film can be in the range of 15-30 GPa.

In an embodiment, the HEDP magnetron sputtering source 1010 with metal target 1040 can be used for sputtering metal nitride films as shown in FIG. 14 (*a*). The target material can be W, Ti, Cr, Si, Al, TiAl, Ta, or any other metal. The programmable duration of the AC pulse bursts can be in the range of 0.5-2 ms. The frequency of the programmable AC pulse bursts can be in the range of 100 Hz-800 Hz. The frequency of the pulsed AC waveform inside the programmable pulse bursts can be programmed in the range of 10 kHz-60 kHz with a single frequency or mixed frequency. The average power during the deposition can be in the range of 1-5 kW. The Argon gas pressure can be in the range of 1-20 mTorr. The target area can be in the range of 50-500 cm$^2$. The Nitrogen gas flow can be in the range of 10 SCCM and 200 SCCM. The film hardness of the hydrogenated DLC film can be in the range of 15-35 GPa.

In an embodiment, the HEDP magnetron sputtering source 1010 with metal target 1040 can be used for sputtering metal films as shown in FIG. 14 (*a*). The target material can be W, Ti, Cr, Si, Al, TiAl, Ta, or any other metals. The programmable duration of the AC pulse bursts can be in the range of 0.5-2 ms. The frequency of the programmable AC pulse bursts can be in the range of 100 Hz-800 Hz. The frequency of the pulsed AC waveform inside the programmable pulse bursts can be programmed in the range of 10 kHz-60 kHz with a single frequency or mixed frequency. The average power during the deposition can be in the range of 1-5 kW. The Argon gas pressure can be in the range of 1-20 mTorr. The target area can be in the range of 50-500 cm$^2$. The deposition rate can be in the range of 5-60 microns per hour depends on the distance between the target and the substrate.

In an embodiment, the HEDP magnetron sputtering source 1010 with metal target 1040 can be used for sputtering metal oxide films as shown in FIG. 14 (*a*). The target material can be W, Ti, Cr, Si, Al, TiAl, Ta, or any other metal. The programmable duration of the AC pulse bursts can be in the range of 0.5-2 ms. The frequency of the programmable AC pulse bursts can be in the range of 100 Hz-800 Hz. The frequency of the pulsed AC waveform inside the programmable pulse bursts can be programmed in the range of 10 kHz-60 kHz with a single frequency or mixed frequency. The average power during the deposition can be in the range of 1-5 kW. The target area can be in the range of 50-500 cm$^2$. The Argon gas pressure can be in the range of 1-20 mTorr. The Oxygen gas flow can be in the range of 10 SCCM and 200 SCCM.

In an embodiment, the HEDP magnetron sputtering source 1010 with target 1040 can be used for sputter etch process of the substrate as shown in FIG. 14 (a). The target material can be W, Ti, Cr, Si, Ta, or any other metal. The programmable duration of the AC pulse bursts can be in the range of 0.5-2 ms. The frequency of the programmable AC pulse bursts can be in the range of 100 Hz-800 Hz. The frequency of the pulsed AC waveform inside the programmable pulse bursts can be programmed in the range of 10 kHz-60 kHz with a single frequency or mixed frequency. The Argon gas pressure can be in the range of 1-20 mTorr. The average power during the deposition can be in the range of 1-5 kW. The target area can be in the range of 50-500 cm$^2$. The substrate bias can be in the range of –(500-1500) V.

In an embodiment, prior to sputtering hydrogenated DLC film on top of the steel substrate, the substrate surface can be cleaned with a sputter etch process described above.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments are utilized and derived therefrom, such that structural and logical substitutions and changes are made without departing from the scope of this disclosure. Figures are also merely representational and are not drawn to scale. Certain proportions thereof are exaggerated, while others are decreased. Accordingly, the specification and drawings are to be regarded in an illustrative rather than a restrictive sense.

Such embodiments are referred to herein, individually and/or collectively, by the term "embodiment" merely for convenience and without intending to voluntarily limit the scope of this application to any single embodiment or inventive concept if more than one is in fact shown. Thus, although specific embodiments have been illustrated and described herein, it should be appreciated that any arrangement calculated to achieve the same purpose are substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus, the following claims are hereby incorporated into the detailed description, with each claim standing on its own as a separate example embodiment.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single embodiment. Thus, the following claims are hereby incorporated into the Detailed Description, with each claim standing on its own as separately claimed subject matter.

Although specific example embodiments have been described, it will be evident that various modifications and changes are made to these embodiments without departing from the broader scope of the inventive subject matter described herein. Accordingly, the specification and drawings are to be regarded in an illustrative rather than a restrictive sense. The accompanying drawings that form a part hereof, show by way of illustration, and without limitation, specific embodiments in which the subject matter are practiced. The embodiments illustrated are described in sufficient detail to enable those skilled in the art to practice the teachings herein. Other embodiments are utilized and derived therefrom, such that structural and logical substitutions and changes are made without departing from the scope of this disclosure. This Detailed Description, therefore, is not to be taken in a limiting sense, and the scope of various embodiments is defined only by the appended claims, along with the full range of equivalents to which such claims are entitled.

Given the teachings provided herein, one of ordinary skill in the art will be able to contemplate other implementations and applications of the techniques of the disclosed embodiments. Although illustrative embodiments have been described herein with reference to the accompanying drawings, it is to be understood that these embodiments are not limited to the disclosed embodiments, and that various other changes and modifications are made therein by one skilled in the art without departing from the scope of the appended claims.

What is claimed is:

1. An electrically and magnetically enhanced ionized physical vapor deposition (I-PVD) method of sputtering a layer on a substrate using a magnetron, the method comprising:

positioning the magnetron in a vacuum with an anode, a first cathode target, a cylindrical cathode target, a magnet assembly, the substrate, and a feed gas;

applying a plurality of unipolar negative direct current (DC) voltage pulses from a pulse power supply to a first pulse forming network (PFN), the first PFN comprising at least one inductor and at least one capacitor;

adjusting at least one of an amplitude, pulse duration, and frequency associated with the plurality of unipolar negative DC voltage pulses and adjusting a value of at least one of the at least one inductor and the at least one capacitor, thereby causing a resonance mode associated with the first PFN, the first PFN converting the unipolar negative DC voltage pulses to a first asymmetric alternating current (AC) signal that generates a first asymmetric AC discharge on the magnetron with pulse current densities in a range of about 0.1 to 20 A/cm$^2$, the first asymmetric AC signal operatively coupled to the first cathode target, the first asymmetric AC signal comprising a first negative voltage and a first positive voltage followed by a second negative voltage, the second negative voltage generating plasma for use during a subsequent negative voltage associated with the first asymmetric AC signal;

coupling a second PFN operatively to the cylindrical cathode target, the cylindrical cathode target associated with a second magnetron comprising a second unbalanced magnetic field, the second PFN generating a second asymmetric AC signal and a second asymmetric AC discharge on the cylindrical cathode target, the second asymmetric AC signal comprising a first negative voltage and a first positive voltage followed by a second negative voltage, the second negative voltage generating plasma for use during a subsequent negative voltage associated with the second asymmetric AC signal; and disposing a time shift between negative voltage peaks associated with at least one of the first asymmetric AC discharge and the second asymmetric AC discharge, the time shift being selected to increase ionization of sputtered target material on the substrate during sputtering.

2. The method, as defined by claim 1, further comprising coupling a substrate bias voltage to a substrate holder, the substrate bias voltage comprising a range of −10 V to −2000 V.

3. The method, as defined by claim 1, wherein the feed gas comprises a noble gas, the noble gas comprising at least one of argon, xenon, neon, or krypton.

4. The method, as defined by claim 1, wherein the feed gas comprises a mixture of a noble gas and a reactive gas.

5. The method, as defined by claim 1, wherein the feed gas comprises a mixture of a noble gas and a gas that comprises atoms associated with at least one of the flat cathode target, or the cylindrical cathode target.

6. The method, as defined by claim 1, further comprising rotating at least one of the first cathode target, or the cylindrical cathode target with a speed in a range of 10 to 100 revolutions per minute.

7. The method, as defined by claim 1, wherein at least one of the first PFN, or the second PFN comprises at least one of selectable voltage, power, or frequency.

8. The method, as defined by claim 1, wherein negative voltage peaks associated with the first asymmetric AC discharge and the second asymmetric AC discharge are substantially simultaneous.

9. The method, as defined by claim 1, further comprising providing a pulse by the first PFN to the second PFN that initiates a start of the second PFN.

10. The method, as defined by claim 1, further comprising providing a pulse by the second PFN to the first PFN that initiates a start of the first PFN.

11. An electrically and magnetically enhanced ionized physical vapor deposition (I-PVD) sputtering apparatus that deposits a layer on a substrate using a magnetron, the apparatus comprising:

a magnetron, the magnetron positioned in a vacuum with an anode, a first cathode target, a cylindrical cathode target, a magnetic assembly, the substrate, and a feed gas;

a first pulse forming network (PFN) receiving a plurality of unipolar negative direct current (DC) voltage pulses from a pulse power supply, the first PFN comprising at least one inductor and at least one capacitor, at least one of an amplitude, pulse duration, and frequency associated with the plurality of unipolar negative DC voltage pulses being adjusted and a value of at least one of the at least one inductor and the at least one capacitor being adjusted, thereby causing a resonance mode associated with the first PFN, the first PFN converting the unipolar negative DC voltage pulses to a first asymmetric alternating current (AC) signal that generates a first asymmetric AC discharge on the magnetron with pulse current densities in a range of about 0.1 to 20 A/cm$^2$, the first asymmetric AC signal operatively coupled to the first cathode target, the first asymmetric AC signal comprising a first negative voltage and a first positive voltage followed by a second negative voltage, the second negative voltage generating plasma for use during a subsequent negative voltage associated with the first asymmetric AC signal; and a second PFN operatively coupled to the cylindrical cathode target, the second PFN generating a second asymmetric AC signal and a second asymmetric AC discharge on the cylindrical cathode target, the second asymmetric AC signal comprising a first negative voltage and a first positive voltage followed by a second negative voltage, the second negative voltage generating plasma for use during a subsequent negative voltage associated with the second asymmetric AC signal, wherein a time shift is disposed between negative voltage peaks associated with the first asymmetric AC discharge and the second asymmetric AC discharge, the time shift being selected to increase ionization of sputtered target material on the substrate during sputtering.

12. The apparatus, as defined by claim 11, further comprising a substrate bias power supply coupled to a substrate holder, the substrate bias power supply providing a bias voltage on the substrate in a range of −10 to −2000 V.

13. The apparatus, as defined by claim 11, wherein the feed gas comprises a noble gas, the noble gas comprising at least one of argon, xenon, neon, or krypton.

14. The apparatus, as defined by claim 11, wherein the feed gas comprises a mixture of a noble gas and a reactive gas.

15. The apparatus, as defined by claim 11, wherein the feed gas comprises a mixture of a noble gas and a gas that comprises atoms associated with at least one of the first cathode target, or the cylindrical cathode target.

16. The apparatus, as defined by claim 11, wherein at least one of the first cathode target, or the cylindrical cathode target rotates with a speed in a range of 10 to 100 revolutions per minute.

17. The apparatus, as defined by claim 11, wherein at least one of the first PFN, or the second PFN comprises at least one of selectable voltage, power, or frequency.

18. The apparatus, as defined by claim 11, wherein negative voltage peaks associated with the first asymmetric AC discharge and the second asymmetric AC discharge are substantially simultaneous.

19. The apparatus, as defined by claim 11, wherein the first PFN provides a pulse to the second PFN that initiates a start of the second PFN.

20. The apparatus, as defined by claim 11, wherein the second PFN provides a pulse to the first PFN that initiates a start of the first PFN.

21. The method, as defined by claim 1, wherein the at least one of the cathode targets comprises at least one of the following elements: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, or Ba.

22. The method, as defined by claim 1, wherein the substrate comprises at least a portion of at least one of a bearing, a camshaft, a gear, a fuel injector, a cutting tool, a carbide insert, a drill bit, a broach, a reamer, a razor blade for surgical applications and hair removal, a hard drive, a solar panel, an optical filter, a flat panel display, a thin film battery, a battery for storage, a hydrogen fuel cell, a turbine blade, a jet engine part, jewelry, a plumbing part, a pipe, a tube, a medical implant, a medical stent, an artificial joint, a semiconductor wafer, a film used to manufacture an electronic memory device, or a diamond like coating hard mask.

23. The apparatus, as defined by claim 11, wherein at least one of the cathode targets comprises at least one of the following elements: B, C, Al, Si, P, S, Ga, Ge, As, Se, In, Sn, Sb, Te, I, Tl, Pb, Bi, Sc, Ti, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, La, Ce, Pr, Nd, Pm, Sm, Eu, Gd, Tb, Dy, Ho, Er, Tm, Yb, Be, Mg, Ca, Sr, or Ba.

24. The apparatus, as defined by claim 11, wherein the substrate comprises at least a portion of at least one of a bearing, a camshaft, a gear, a fuel injector, a cutting tool, a carbide insert, a drill bit, a broach, a reamer, a razor blade for surgical applications and hair removal, a hard drive, a solar panel, an optical filter, a flat panel display, a thin film battery, a battery for storage, a hydrogen fuel cell, a turbine blade, a jet engine part, jewelry, a plumbing part, a pipe, a tube, a medical implant, a medical stent, an artificial joint, a semiconductor wafer, a film used to manufacture an electronic memory device, or a diamond like coating hard mask.

\* \* \* \* \*